(12) United States Patent
Tone et al.

(10) Patent No.: US 7,301,169 B2
(45) Date of Patent: Nov. 27, 2007

(54) SEMICONDUCTOR SUBSTRATE AND SEMICONDUCTOR DEVICE FABRICATION METHOD

(75) Inventors: Sachie Tone, Kawasaki (JP); Hiroshi Ohta, Kawasaki (JP); Masahiro Ninomiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 363 days.

(21) Appl. No.: 10/995,539

(22) Filed: Nov. 24, 2004

(65) Prior Publication Data

US 2006/0022196 A1 Feb. 2, 2006

(30) Foreign Application Priority Data

Jul. 27, 2004 (JP) .............................. 2004-218254

(51) Int. Cl.
*H01L 23/58* (2006.01)
(52) U.S. Cl. .......................................... 257/48; 438/18
(58) Field of Classification Search .................. 257/48; 438/18
See application file for complete search history.

(56) References Cited

FOREIGN PATENT DOCUMENTS

| JP | 6-140489 | 5/1994 |
|---|---|---|
| JP | 7-242860 | 9/1995 |
| JP | 11-224869 | 8/1999 |
| JP | 2002-18377 | 1/2002 |
| JP | 2002-212523 | 7/2002 |

*Primary Examiner*—Douglas M. Menz
(74) *Attorney, Agent, or Firm*—Westerman, Hattori, Daniels & Adrian, LLP.

(57) ABSTRACT

The semiconductor substrate comprises a first monitor part 14a formed in a first region near a center of a semiconductor wafer 10, which includes a first element having a first electrode 24 formed over the semiconductor wafer 10 with a first insulation film 22 formed therebetween, and a first electrode pad 32 electrically connected to the first electrode 24; and a second monitor part 14b formed in a second region different from the first region, which includes a second element having a second electrode 24 formed on the semiconductor wafer 10 with a second insulation film 22 formed therebetween, and a second electrode pad 32 electrically connected to the second electrode 24. When electric breakdown has taken place in both the first monitor part 14a and the second monitor part 14b, it can be judged that too large static electricity was generated upon the release of the surface protection film 39. When electric breakdown has taken place in either of the first monitor part 14a and the second monitor part 14b, the electric breakdown has taken place due to factors other than the static electricity generated upon the release of the surface protection film. When electric breakdown has taken place in neither of the first monitor part 14a and the second monitor part 14b, it can be judged that too large static electricity was generated upon the release of the surface protection film 39. Thus, factors for defects of semiconductor devices can be identified, which leads to improved quality of the semiconductor devices.

13 Claims, 39 Drawing Sheets

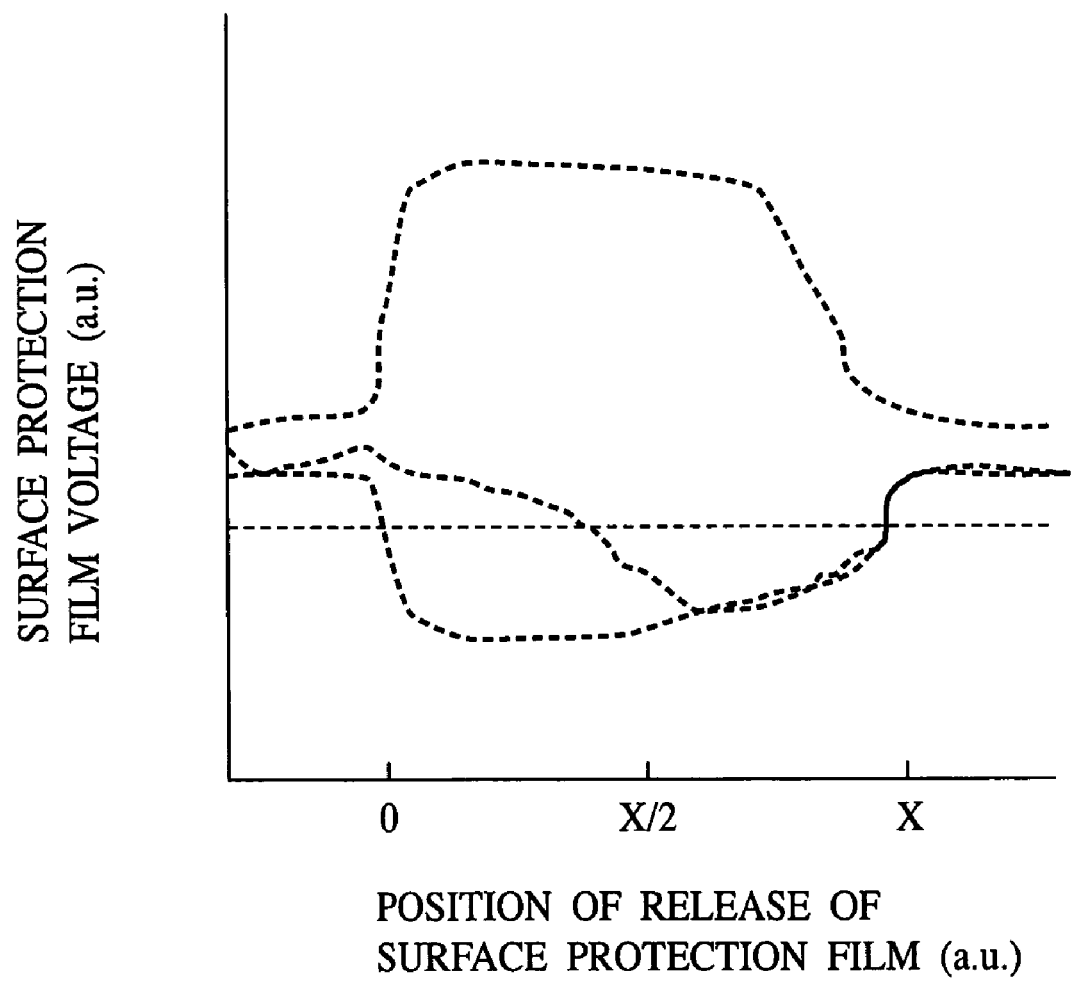

SEMICONDUCTOR SUBSTRATE AND SEMICONDUCTOR DEVICE FABRICATION METHOD

CROSS-REFERENCE TO RELATED APPLICATION

This application is based upon and claims priority of Japanese Patent Application No. 2004-218254, filed on Jul. 27, 2004, the contents being incorporated herein by reference.

BACKGROUND OF THE INVENTION

The present invention relates to a semiconductor substrate and a semiconductor device fabrication method using the semiconductor substrate, more specifically a semiconductor substrate which can realize higher quality of semiconductor devices and a semiconductor device fabrication method using the semiconductor substrate.

Recently, the polish of the second surface (back side) of semiconductor wafers (backside polish) is noted.

By polishing the base side of a semiconductor wafer, the semiconductor chips can be thinned, which makes it possible to realize down-sizing of semiconductor devices.

When the back side of a semiconductor wafer is polished, a surface protection film is applied to the first surface of the semiconductor wafer for the purpose of protecting the semiconductor devices formed on the first surface of the semiconductor wafer. Various surface protection films have been proposed (see Patent References 1-3).

After the polish of the second surface of the semiconductor wafer is finished, the surface protection film is to be released from the first surface of the semiconductor wafer. Methods of the release of the surface protection films have been also proposed (see Patent Reference 4).

Following references disclose the background art of the present invention.

[Patent Reference 1]

Specification of Japanese Patent Application Unexamined Publication No. 2002-212523

[Patent Reference 2]

Specification of Japanese Patent Application Unexamined Publication No. 2002-18377

[Patent Reference 3]

Specification of Japanese Patent Application Unexamined Publication No. Hei 7-242860/1995

[Patent Reference 4]

Specification of Japanese Patent Application Unexamined Publication No. Hei 11-224869/1999

[Patent Reference 5]

Specification of Japanese Patent Application Unexamined Publication No. Hei 6-140489/1994

However, when the surface protection film is released from the first surface of a semiconductor wafer, often large static electricity is generated, which often causes problems, such as electric breakdowns, etc., in the semiconductor elements, etc. formed on the first surface of the semiconductor wafer. The factor for causing the problems in the semiconductor elements, etc. is not limited to the static electricity, and various factors causes the problems in the semiconductor elements, etc. It is very difficult to judge whether or not the problems caused in the semiconductor elements are due to the static electricity or other factors.

SUMMARY OF THE INVENTION

An object of the present invention is to provide a semiconductor substrate which can be judged as to whether or not static electricity has been generated upon the release of the surface protection film, and a semiconductor device fabrication method using the semiconductor substrate.

According to one aspect of the present invention, there is provided a semiconductor substrate comprising: a first monitor part formed in a first region near a center of a semiconductor wafer, which includes a first element having a first electrode formed over the semiconductor wafer with a first insulation film formed therebetween, and a first electrode pad electrically connected to the first electrode; and a second monitor part formed in a second region different from the first region, which includes a second element having a second electrode formed over the semiconductor wafer with a second insulation film formed therebetween, and a second electrode pad electrically connected to the second electrode.

According to another aspect of the present invention, there is provided a semiconductor device fabrication method comprising: a first step of forming, in a first region near a center of a first surface of a semiconductor wafer, a first monitor part which includes a first element having a first electrode formed over the semiconductor wafer with a first insulation film formed therebetween, and a first electrode pad electrically connected to the first electrode, and forming, in a second region different from the first region, a second monitor part which includes a second element having a second electrode formed over the semiconductor wafer with a second insulation film formed therebetween, and a second electrode pad electrically connected to the second electrode; a second step of applying a surface protection film for protecting the first surface of the semiconductor wafer to the first surface of the semiconductor wafer; a third step of adhering a release film for releasing the surface protection film to a region of the surface protection film which contains the region where the first monitor part is formed and the region where the second monitor part is formed, and releasing the surface protection film from the first surface of the semiconductor wafer by use of the release film; and a fourth step of making a measurement as to whether or not electric breakdown has taken place in the first element and the second element.

According to the present invention, a first monitor part is formed in a first region near the center of the semiconductor wafer, a second monitor part is formed in a second region different from the first region, a surface protection film is adhered to the semiconductor substrate, and a release film is adhered to the surface protection film in the region containing the region where the first monitor part is formed and the region where the second monitor part is formed, whereby the surface protection film is released with the release film, and then a measurement is made as to whether or not electric breakdown has taken place in the first monitor part and the second monitor part. In the region where the release film is adhered, there is the risk that relatively large static electricity will be generated, but so large static electricity is not generated in the region where the release film is not adhered. When electric breakdown has taken place in both the first monitor part and the second monitor part, it can be judged that too large static electricity was generated upon the release of the surface protection film. When electric breakdown has taken place in either of the first monitor part and the second monitor part, the electric breakdown has taken place due to factors other than the static electricity generated upon the release of the surface protection film. When electric breakdown has taken place in neither of the first monitor part and the second monitor part, it can be judged that too large static electricity was generated upon the release of the surface protection film. Thus, according to the present invention, factors for defects of semiconductor devices can be identified, which leads to improved quality of the semiconductor devices.

BRIEF DESCRIPTION OF THE DRAWINGS

FIG. 5 is a graph exemplifying potential changes of the surface protection film upon the release of the surface protection film with the release film.

DETAILED DESCRIPTION OF THE INVENTION

A First Embodiment

The semiconductor substrate according to a first embodiment of the present invention and the semiconductor device fabrication method using the semiconductor substrate will be explained with reference to FIGS. 1A to 3B. FIGS. 1A to 2C are plan views illustrating the semiconductor substrate according to the present embodiment and the semiconductor device fabrication method using the semiconductor substrate. FIGS. 3A and 3B are a plan view and a sectional view of the semiconductor substrate according to the present embodiment. FIG. 3A is a plan view of the semiconductor substrate according to the present embodiment, which illustrates monitor parts. FIG. 3B is a sectional view of the semiconductor substrate according to the present embodiment, which illustrates the monitor parts. FIG. 3B is the sectional view along the line A-A' in FIG. 3A.

First, the semiconductor substrate according to the present embodiment will be explained with reference to FIGS. 1A, 3A and 3B.

Figure 1A:
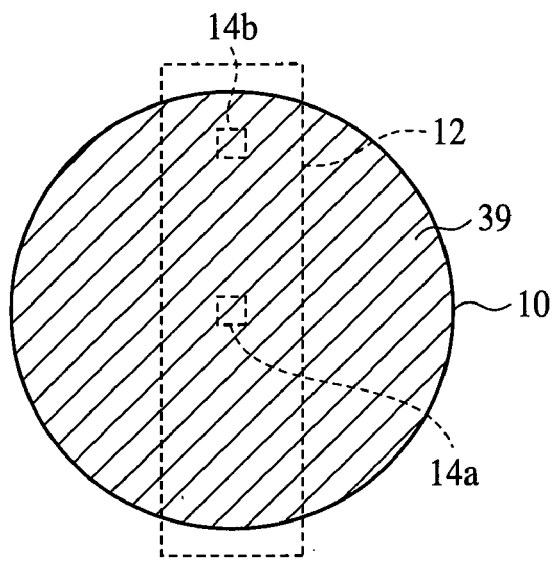
FIGS. 1A to 1C are plan views of the semiconductor substrate according to the first embodiment of the present invention in the steps of the semiconductor device fabrication method using the semiconductor substrate, which illustrate the steps of the method (Part 1).

As illustrated in FIG. 1A, on the first surface of a semiconductor wafer (semiconductor substrate) 10 of, e.g., P type, a plurality of semiconductor devices (semiconductor chips) not shown, and the monitor parts 14a, 14b are formed. The monitor part 14a is formed in a region of a region 12 for a release film to be applied to, which is near the center of the semiconductor wafer 10. The release film is for releasing a surface protection film which will be described later. The monitor part 14b is formed in a region of the region 12 for a release film to be applied to, which is near the peripheral edge of the semiconductor wafer 10. The monitor parts 14a, 14b have the same structure.

The structure of the monitor parts 14a, 14b will be explained with reference to FIGS. 3A and 3B.

As illustrated in FIGS. 3A and 3B, an N type well 16 is formed in the semiconductor substrate 10.

On the first surface of the semiconductor wafer 10 with the N type well 16 formed in, a device isolation region 20 for defining device regions 18, 19 is formed.

A gate insulation film 22 of, e.g., a 20 nm-thickness is formed on the surface of the device region 18.

A gate electrode 24 of, e.g., polysilicon is formed on the gate insulation film 22 and the device isolation regions 20. The gate electrode 24 is formed, crossing the device region 18. The gate length L is set at, e.g., 0.5 μm, and the gate width D is set at, e.g., 0.8 μm. The gate area, which is the product of a gate length L and a gate width D, is e.g., 0.4 μm². Preferably, the gate area of the MOS diode 26 is set as small as possible. Thus, the gate electrode 24, the gate insulation film 22 and the well 16 constitute the MOS diode 26.

In the device region 18 on both side of the gate electrode 24, impurity diffused regions (not illustrated) may be present or may not be present.

In the device region 19, an $N^+$ type contact layer 28 is formed. The contact layer 28 is for decreasing the contact resistance between the electrode pad 34 and the well 16.

On the semiconductor wafer 10 with the MOS diode 26, etc. formed on, an inter-layer insulation film 29 of, e.g., silicon oxide film is formed.

In the inter-layer insulation film 29, a contact hole 30a and a contact hole 30b are formed respectively down to the gate electrode 24 and down to the contact layer 28.

On the inter-layer insulation film 29, an electrode pad 32 is formed, connected to the gate electrode 24 through the contact hole 30a. On the inter-layer insulation film 29, an electrode pad 34 is formed, connected to the contact layer 28 through the contact hole 30b. The plane shape of the electrode pads 32, 34 is set at, e.g., 64 μm×64 μm. The area of the electrode pad 32 is set very larger in comparison with the gate area of the MOS diode 26. Preferably, the area of the electrode pad 32 is, e.g., 500 or more times the gate area of the MOS diode 26.

On the inter-layer insulation film 29 with the electrode pads 32, 34 formed on, a cover film (insulation film) 36 is formed.

In the cover film 36, an opening 38a and an opening 38b are formed respectively down to the electrode pad 32 and down to the electrode pad 34. The plane shape of the openings 38a, 38b is, e.g., 60 μm×60 μm.

The semiconductor monitor is constituted by a plurality of monitor parts 14a, 14b.

Thus, the semiconductor substrate (semiconductor wafer) according to the present embodiment is constituted.

Next, the semiconductor device fabrication method using the semiconductor substrate according to the present embodiment will be explained with reference to FIGS. 2A to 6C. FIGS. 1A to 2C are views illustrating the steps of the method for fabrication the semiconductor device.

First, as illustrated in FIG. 1A, the semiconductor substrate (semiconductor wafer) 10 according to the present embodiment described above is prepared.

Next, a surface protection film 39 is applied to the entire surface of the first surface of the semiconductor wafer 10. The front surface protection film 39 is applied to the surface of the semiconductor wafer 10 and then is cut out into the shape of the semiconductor wafer 10. The surface protection film 39 is for protecting the surface of the semiconductor wafer 10 in polishing the second surface (back side) of the semiconductor wafer 10.

Next, the second surface of the semiconductor wafer 10 is polished with a grinding wheel. In polishing the second surface of the semiconductor wafer 10, the first surface of the semiconductor wafer 10 is protected by the surface protection film 39. Thus, the polish of the second surface of the semiconductor wafer 10 is completed.

Figure 1B:
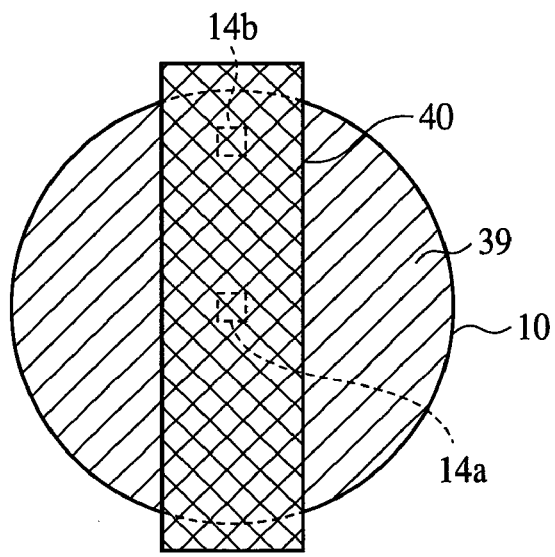

Then, as illustrated in FIG. 1B, the release film (release tape) for releasing the surface protection film 39 from the first surface of the semiconductor substrate 10 is adhered onto the surface protection film 39. A adhesive for securing the release film 40 to the surface protection film 39 has been applied to one side of the release film 40. When the release film 40 is adhered to the surface of the surface protection film 39, the release film 40 is applied, covering the monitor part 14a formed near the center of the semiconductor wafer 10 and the monitor part 14b formed near the peripheral edge of the semiconductor wafer 10.

Figure 1C:
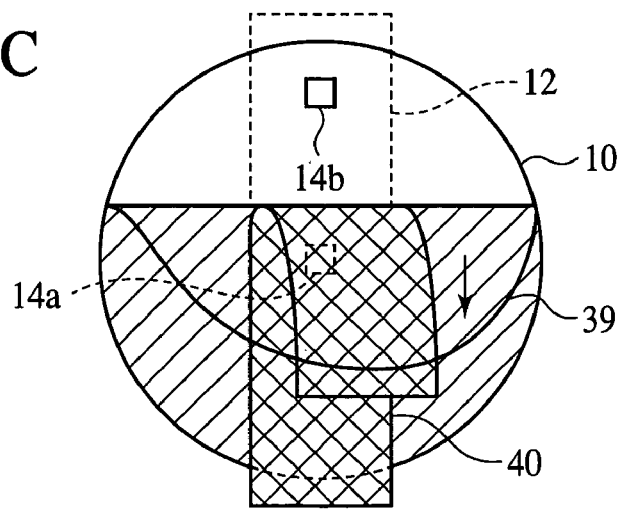
Figure 4:
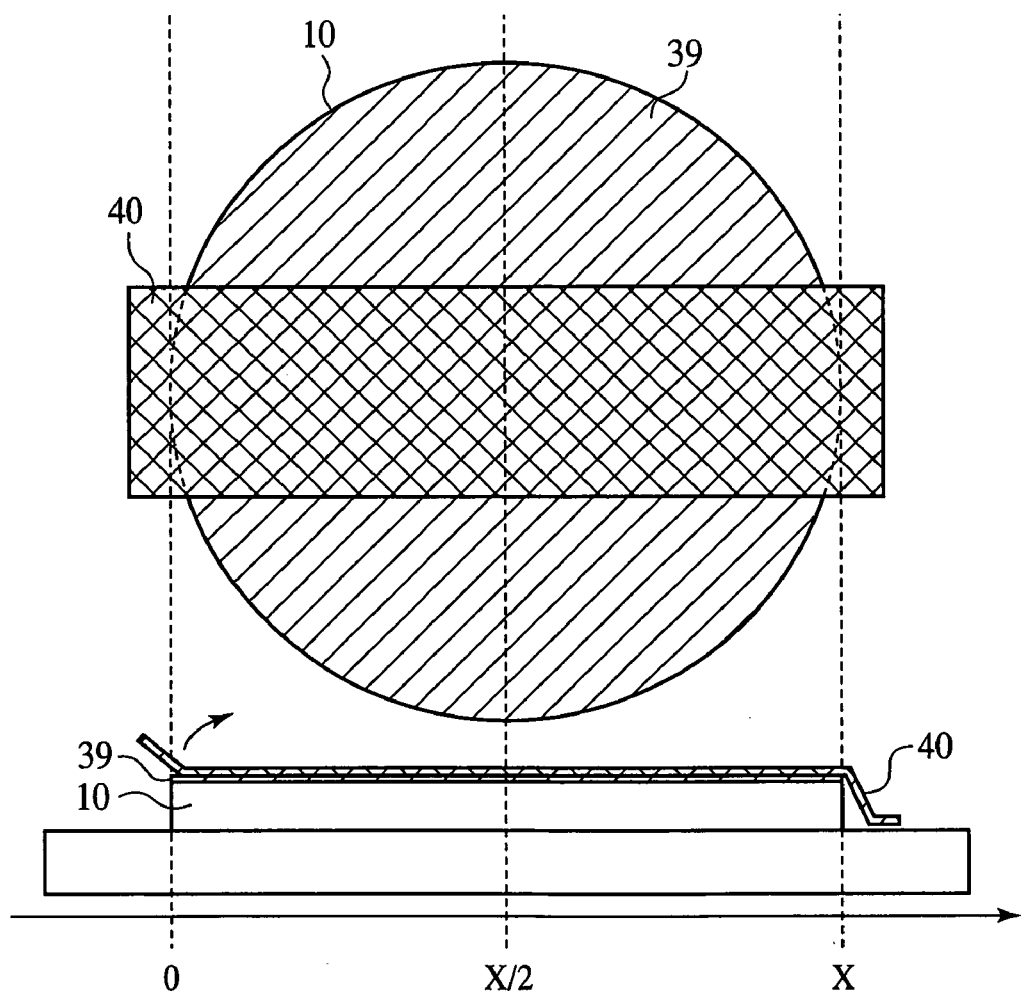
FIG. 4 is a plan view and a sectional view of the starting state that the surface protection film is released from the first surface of the semiconductor wafer with the release film.

Then, as illustrated in FIG. 1C and FIG. 4, the release film 40 is pulled to release the surface protection 39 from the surface of the semiconductor wafer 10. The release film 40 is secured to the surface protection film 39 with the adhesive or the like, while the surface protection film 39 is applied to the semiconductor wafer 10 without using the adhesive or the like, whereby the surface protection film 39 can be easily released from the surface of the semiconductor wafer 10 by pulling the release film 40. FIG. 4 is a plan view and a side view illustrating the state that the surface protection film is going to be released from the first surface of the semiconductor wafer with the release film.

FIG. 5 is a graph exemplifying potential changes of the surface protection film upon releasing the surface protection film with the release film. When static electricity is generated upon the release of the surface protection film 39 from the first surface of the semiconductor wafer 10, the potential of the surface protection film 39 changes as exemplified in FIG. 5. The broken line indicates the critical voltage for the electric breakdown of the MOS diode. In FIG. 5, the critical voltage only on the negative (minus) side is shown, but the critical voltage is present on the positive (plus) side.

When static electricity is generated upon the release of the surface protection film 39, charges are stored in the electrode pad 32 and the gate electrode 24 while charges are trapped in the gate insulation film 22. When too large static electricity is charged in the electrode pad 32, etc. upon the release of the surface protection film 39, the charge trapped in the gate insulation film 22 exceeds the allowable quantity of the gate insulation film 22, and electric breakdown takes place in the gate insulation film 22. In the present embodiment, the gate area of the MOS diode 26 is much smaller than the area of the electrode pad 32 so that the electric breakdown can take place easily in the gate insulation film 22 of the MOS diode 26.

Then, a measurement is made on the MOS diodes 26 of the monitor parts 14a, 14b as to whether or not the electric breakdown has taken place. To make the measurement as to whether the electric breakdown has taken place in the MOS diodes 26, the minus side (GND) of a measuring apparatus is connected to, e.g., the electrode pad 32, and the plus side of the measuring apparatus is connected to, e.g., the electrode pad 34.

Figure 2A:
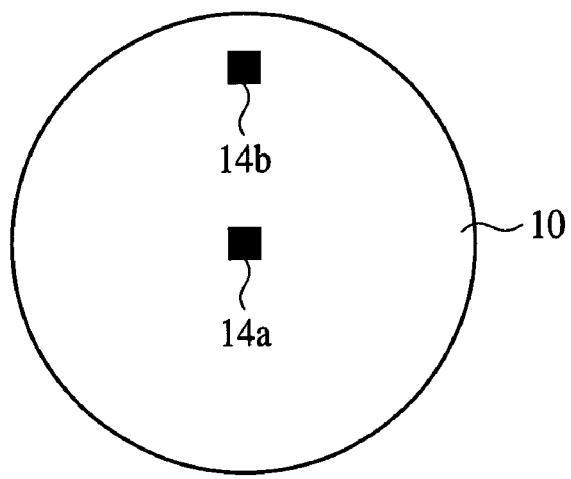
FIGS. 2A to 2C are plan views of the semiconductor substrate according to the first embodiment of the present invention in the steps of the semiconductor device fabrication method using the semiconductor substrate, which illustrate the steps of the method (Part 2).
Figure 3A:
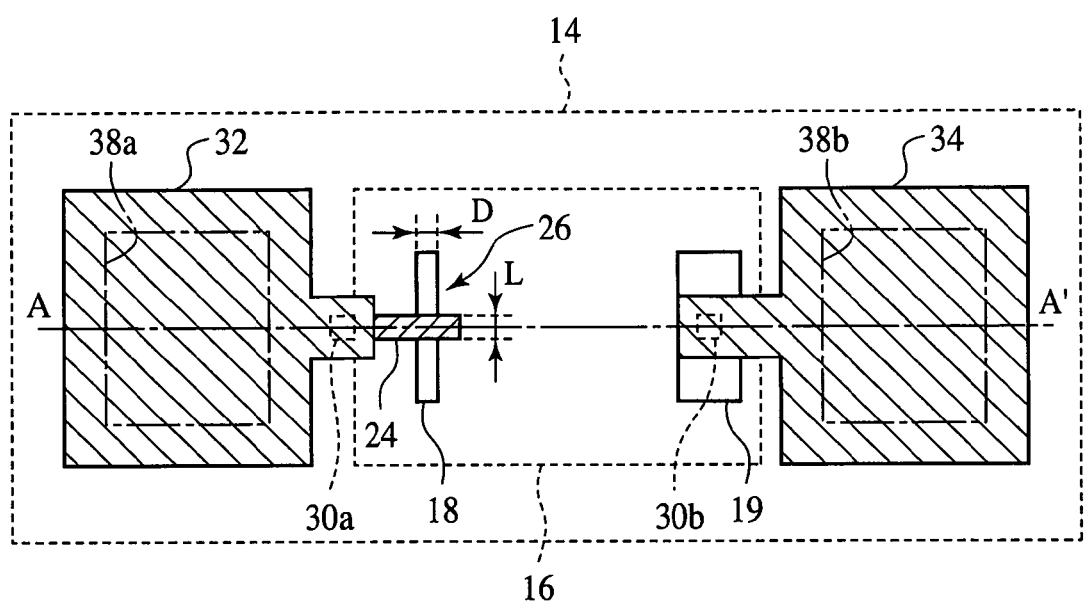
FIGS. 3A and 3B are a plan view and a sectional view of the semiconductor substrate according to the first embodiment of the present invention.
Figure 3B:
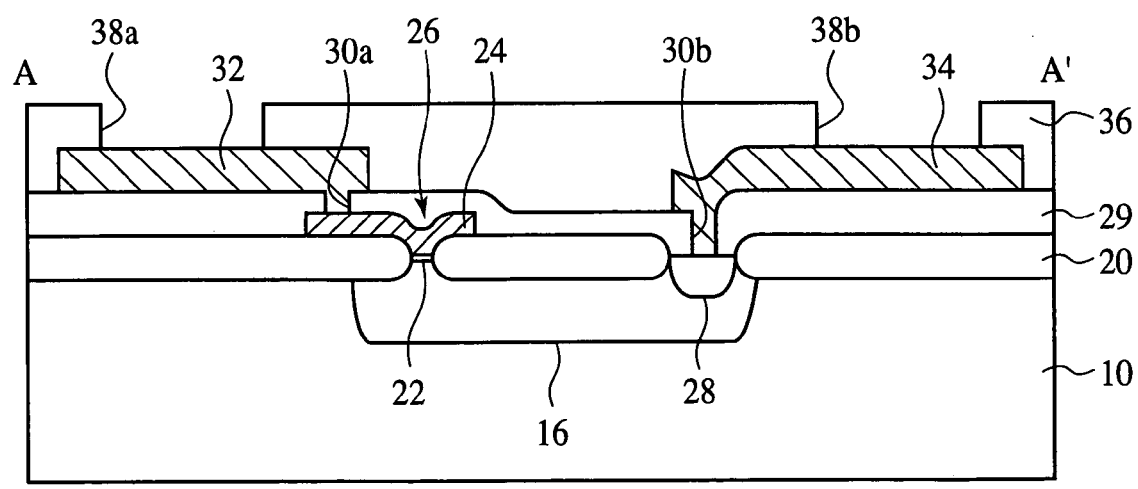

FIG. 2A illustrates the case that the electric breakdown has taken place in both the monitor part 14a and the monitor part 14b. In the drawing, when the monitor parts 14a, 14b have the electric breakdown, they are blacked out.

Figure 6A:
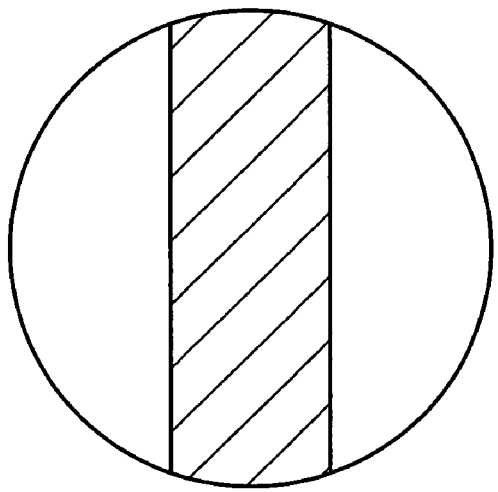
FIGS. 6A to 6C are conceptual views of the regions where relatively large static electricity may be generated upon the release of the surface protection film and the region which may be damaged by plasma.

FIG. 6A is a conceptual view of the region where relatively large static electricity may take place upon the release of the surface protection film with the release film. In FIG. 6A, the region where relatively large static electricity may take place is hatched. The surface protection film 39 is applied to the entire surface of the semiconductor wafer 10, but the intra-plane distribution of the quantity of the static electricity generated upon the release of the surface protection film 39 is not uniform. In the region where the release film 40 is adhered, there is a risk that relatively large static electricity may be generated, as illustrated in FIG. 6A. On the other hand, in the region where the release film 40 is not adhered, a smaller quantity of static electricity is generated than that in the region where the release film 40 is adhered. Thus, the static electricity generated upon the release of the surface protection film 39 is largest in the region where the release film 40 is adhered.

The static electricity generated upon the release of the surface protection film 38 with the release film 40 will be charged similarly both in the electrode pad 32 of the monitor part 14a and in the electrode pad 32 of the monitor part 14b. When the electric breakdown has taken place in the MOS diodes 26 in both the monitor part 14a and the monitor part 14b as illustrated in FIG. 2A, it is judged that the electric breakdown has taken place due to too large static electricity generated upon the release of the surface protection film 39 with the release film 40.

Figure 2B:
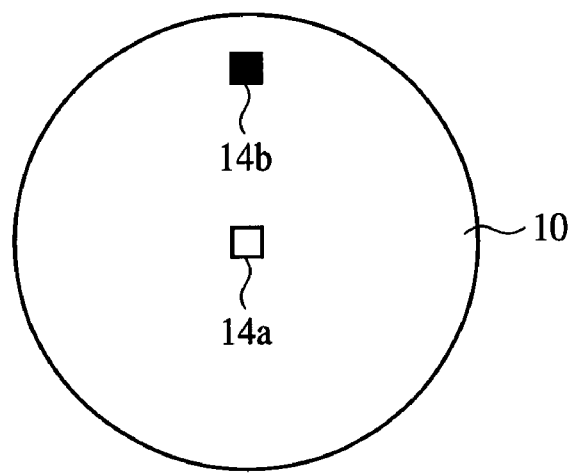
Figure 6B:
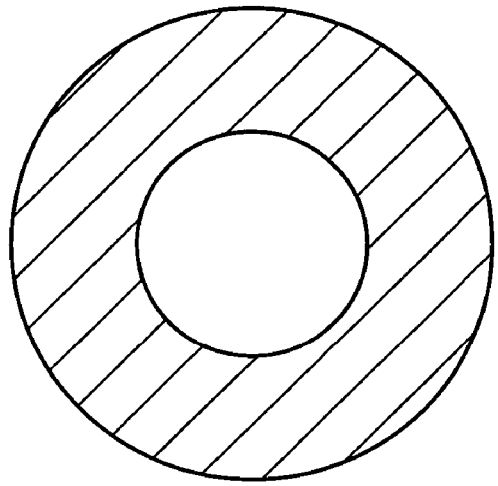

FIG. 2B illustrates the case that the electric breakdown has not taken place in the monitor part 14a, and the electric breakdown has taken place in the monitor part 14b. FIG. 6B is a conceptual view of the semiconductor wafer 10 having the peripheral part damaged by the exposure to a plasma atmosphere. In FIG. 6B, the region damaged by the plasma is hatched. In the case that, as illustrated in FIG. 2B, the electric breakdown has not taken place in the monitor part 14a, and the electric breakdown has taken place in the monitor part 14b, it can be considered that the peripheral part of the semiconductor wafer 10 has been damaged due to the exposure of the semiconductor wafer 10 to the plasma atmosphere, and resultantly the electric breakdown has taken place in the monitor part 14a.

Figure 2C:
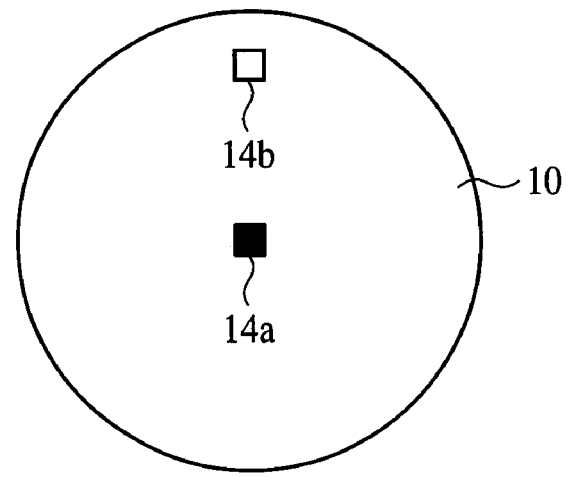
Figure 6C:
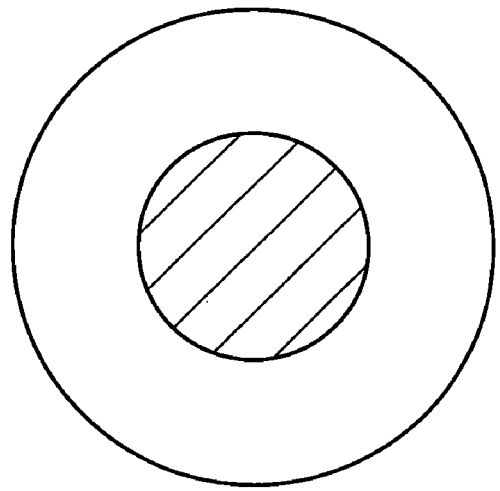

FIG. 2C illustrates the case that the electric breakdown has taken place in the monitor part 14a, and the electric breakdown has not taken place in the monitor part 14b. FIG. 6C is a conceptual view of the semiconductor wafer 10 having the central part damaged by the exposure to a plasma atmosphere. In FIG. 6C, the region damaged by the plasma is hatched. In the case that, as illustrated in FIG. 2C, the electric breakdown has taken place in the monitor part 14a, and the electric breakdown has not taken place in the monitor part 14b, it can be considered that the central part of the semiconductor wafer 10 has been damaged due to the exposure of the semiconductor wafer 10 to the plasma atmosphere, and resultantly the electric breakdown has taken place in the monitor part 14a.

As described above, in the case that the electric breakdown has taken place in either of the monitor part 14a and the monitor part 14b, it can be considered that the electric breakdown has taken place due to a factor other than the static electricity generated upon the release of the surface protection film 39.

In the case that the electric breakdown has taken place neither in the monitor part 14a nor in the monitor 14b, it can be considered that too large static electricity has not be generated upon the release of the surface protection film 39.

As described above, a monitor part 14a is formed in a first region near the center of the semiconductor wafer 10, a monitor part 14b is formed in a second region different from the first region, a surface protection film 39 is adhered to the semiconductor substrate 10, and a release film 40 is adhered to the surface protection film 39 in the region containing the region where the monitor part 14a is formed and the region where the monitor part 14b is formed, whereby the surface protection film 39 is released with the release film 40, and then a measurement is made as to whether or not electric breakdown has taken place in the monitor part 14a and the monitor part 14b. In the region where the release film 40 is adhered, relatively large static electricity may be generated while large static electricity is not generated in the region where the release film 40 is not adhered. Accordingly, when the electric breakdown has taken place both in the monitor part 14a and the monitor 14b, it can judged that too large static electricity has been generated upon the release of the surface protection film 39 with the release film 40. When the electric breakdown has taken place in either of the monitor part 14a and the monitor part 14b, it is judged that the electric breakdown has taken place due to factors other than the static electricity generated upon the release of the surface protection film 39. When the electric breakdown has taken place neither in the monitor part 14a nor in the monitor part 14b, it can be judged that too large static electricity has not been generated upon the release of the surface protection film 39. Thus, according to the present embodiment, factors for defects of a semiconductor device can be determined, which leads to the quality improvement of the semiconductor device.

(Modification 1)

Next, the semiconductor substrate according to Modification 1 of the present embodiment and the semiconductor device fabrication method using the semiconductor substrate will be explained with reference to FIGS. 7A to 8C. FIGS. 7A to 8C are views of the semiconductor substrate according to the present modification and illustrating the steps of the semiconductor device fabrication method using the semiconductor substrate.

The semiconductor device according to the present modification is characterized mainly in that a monitor part 14c is further formed on a part opposite to the monitor 14b across the monitor 14a formed near the center.

Figure 7A:
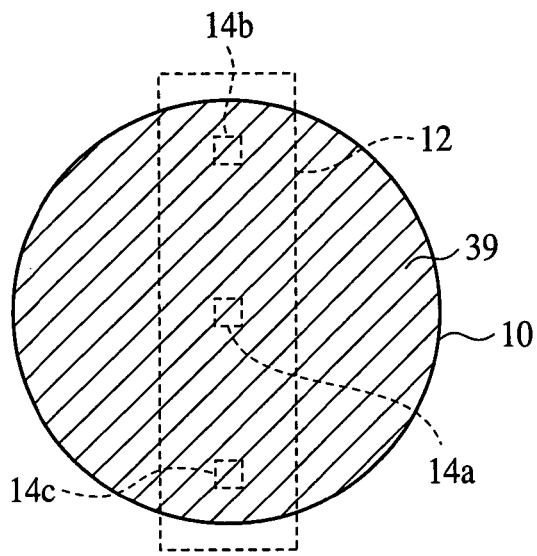
FIGS. 7A to 7C are views of the semiconductor substrate according to Modification 1 of the first embodiment of the present invention in the steps of the semiconductor device fabrication method using the semiconductor substrate, which illustrate the steps of the method (Part 1).

As illustrated in FIG. 7A, on the first surface of a semiconductor wafer 10, the monitor parts 14a-14c are formed, together with a plurality of semiconductor devices (semiconductor chips) not illustrated. The monitor parts 14a-14c are formed in the region 12 where the release film 40 to be adhered. The parts where the monitor parts 14a and the monitor part 14b are formed are the same as those of the semiconductor substrate described above with reference to FIG. 1. The monitor part 14c is formed on the part which is opposite to the part where the monitor part 14b is formed, across the monitor part 14a formed near the center. The monitor part 14c has the same structure as the monitor parts 14a, 14b described above. The semiconductor monitor of the present modification is constituted by the monitor parts 14a-14c. The semiconductor substrate according to the present modification is thus constituted.

Next, the semiconductor device fabrication method according to the present modification will be explained with reference to FIGS. 7A to 8C.

First, as illustrated in FIG. 7A, the semiconductor substrate (semiconductor wafer) 10 according to the present embodiment described above is prepared.

Next, the surface protection film 39 is applied to the entire surface of the first surface of the semiconductor wafer 10.

Next, the second surface of the semiconductor wafer 10 is polished with a grinding wheel. In polishing the second surface of the semiconductor wafer 10, the surface of the semiconductor wafer 10 is protected by the surface protection film 39 because the surface protection film 39 is applied to the first surface of the semiconductor wafer 10. Thus, the polish of the second surface of the semiconductor wafer 10 is completed.

Figure 7B:
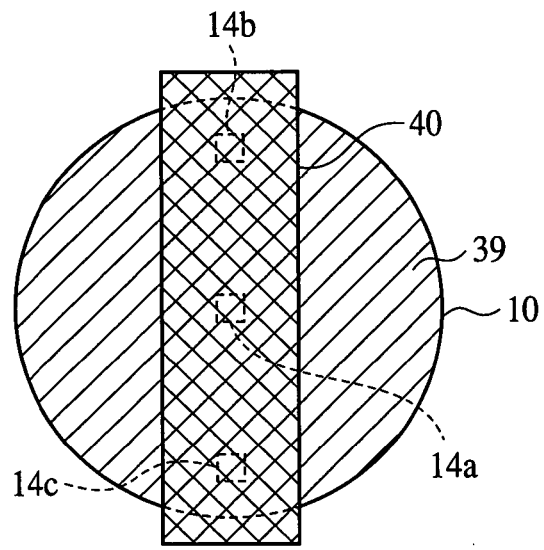

Then, as illustrated in FIG. 7B, the release film 40 is adhered to the surface protection film 39. The release film 40 is adhered to the surface protection film 39, covering the monitor part 14a, the monitor part 14b and the monitor part 14c.

Figure 7C:
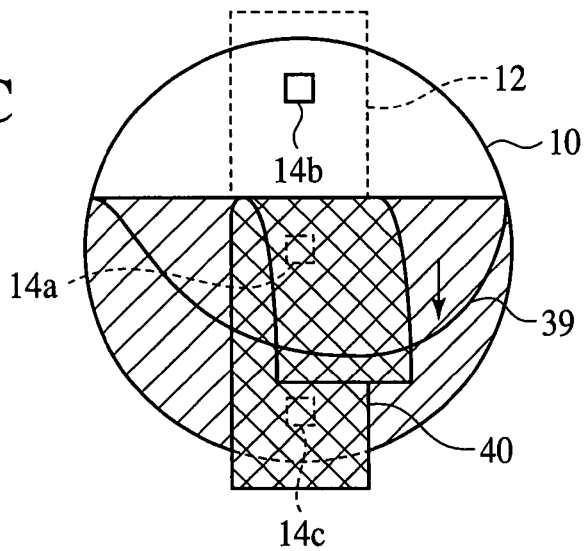

Then, as illustrated in FIG. 7C, the release film 40 is pulled to release the surface protection film 39 from the surface of the semiconductor wafer 10. When static electricity is generated upon the release of the surface protection film 39 from the surface of the semiconductor wafer 10, the electric charges are stored in the electrode pad 32 and the gate electrode 24 while the electric charges are trapped in the gate insulation film 22. When large static electricity is charged in the electrode pads 32, etc, upon the release of the surface protection film 39, the charges trapped in the gate insulation film 22 exceed the allowable quantity, electric breakdown takes place in the gate insulation film 22.

Then, a measurement is performed as to whether or not electric breakdown has taken place in the MOS diodes 26 of the monitor parts 14a, 14b, 14c.

Figure 8A:
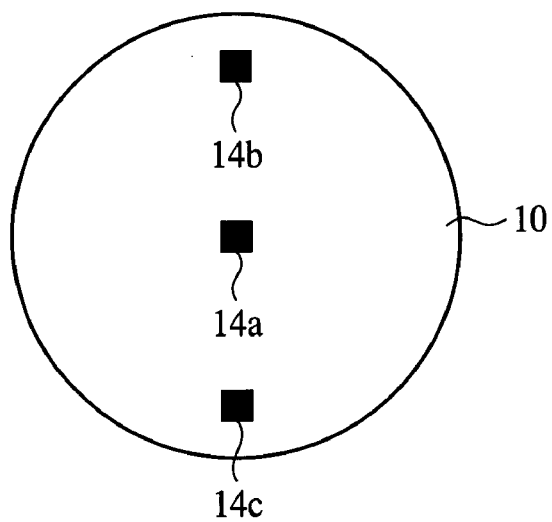
FIGS. 8A to 8C are views of the semiconductor substrate according to Modification 1 of the first embodiment of the present invention in the steps of the semiconductor device fabrication method using the semiconductor substrate, which illustrate the steps of the method (Part 2).
Figure 8B:
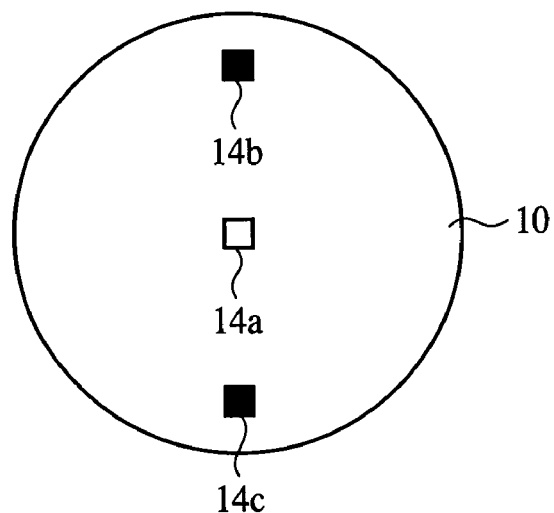
Figure 8C:
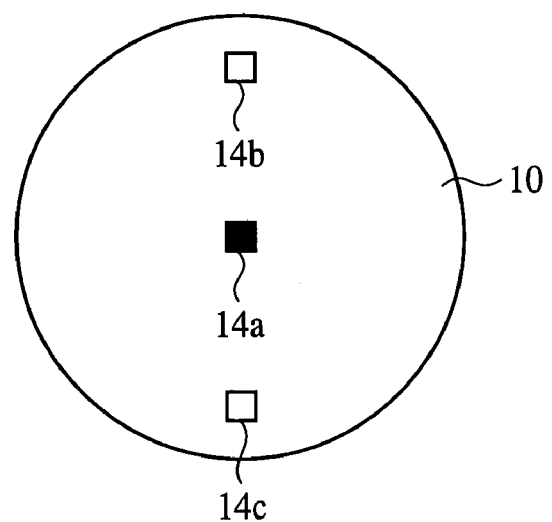

The static electricity generated upon the release of the surface protection film 39 with the release film 40 will be charged similarly in the electrode pad 32 of the monitor part 14a, the electrode pad 32 of the monitor part 14b and the electrode pad 32 of the monitor part 14c. Accordingly, in the case that, as illustrated in FIG. 8A, electric breakdown has taken place in the MOS diodes 26 of all the monitors 14a-14c, it is judged that electric break down has taken place due to too large static electricity generated upon the release of the surface protection film 39 with the release film 40. FIG. 8A illustrates the case that the electric breakdown has taken place in all the monitor parts 14a-14c. In FIG. 8A to 8C, the electric breakdown has taken place in the monitor parts 14a-14c, the monitor parts 14a-14c are blacked out.

In contrast to this, when the monitor part 14 that the electric breakdown has taken place and the monitor part 14 that the electric breakdown has not taken place are mixed, it is considered that the electric breakdown has taken place due to factors other than the static electricity generated upon the release of the surface protection film 39. For example, when the peripheral part of the semiconductor wafer 10 is damaged by the exposure to a plasma atmosphere as illustrated in FIG. 6B, it is considered that, as illustrated in FIG. 8B, the electric breakdown does not take place in the monitor part 14a but takes place in the monitor part 14b and the monitor part 14c. FIG. 8B illustrates the case that the electric breakdown has not taken place in the monitor 14a but taken place in the monitors 14b, 14c. When the central part of the semiconductor wafer 10 is damaged by the exposure to a plasma atmosphere, it is considered that, as illustrated in FIG. 8C, the electric breakdown takes place in the monitor part 14a but does not take place in the monitor part 14b and the monitor part 14c. FIG. 8C illustrates the case that the electric breakdown has taken place in the monitor part 14a but has not taken place in the monitor part 14b and the monitor part 14c. Thus, when the monitor part 14 that the electric breakdown has taken place and the monitor part 14 that the electric breakdown has not taken place are mixed, it can be judged that the electric breakdown has taken place due to factors other than the static electricity generated upon the release of the surface protection film 39.

When the electric breakdown has not taken place in any of the monitor parts 14a-14c, it can be judged that too large static electricity has not been generated upon the release of the surface protection film 39.

As in the present modification, the monitor part 14c may be formed at the part opposite to the monitor part 14b across the monitor part 14a formed near the center. According to the present modification, factors causing the electric breakdown can be judged more correctly.

(Modification 2)

Next, the semiconductor substrate according to Modification 2 of the present embodiment and the semiconductor device fabrication method using the semiconductor substrate will be explained with reference to FIGS. 9A to 10C. FIGS. 9A to 10C are views of the semiconductor substrate according to the present modification and illustrating the steps of the semiconductor device fabrication method using the semiconductor substrate.

The semiconductor substrate according to the present modification is characterized mainly in that monitor parts 14d, 14e are additionally formed in the region other than the region for the release film 40 to be adhered to.

Figure 9A:
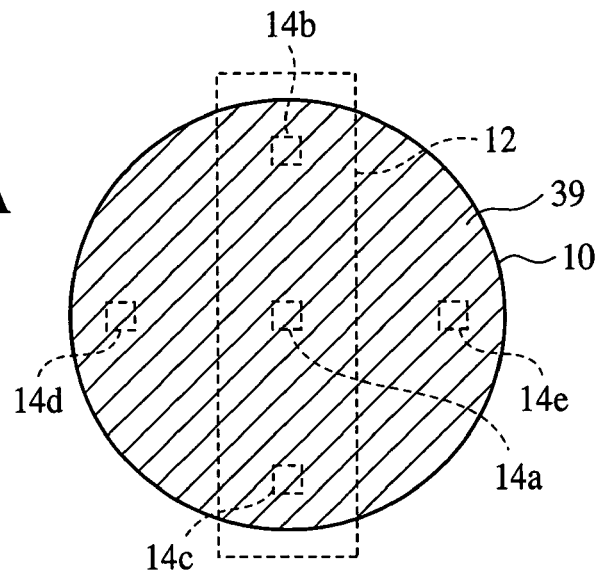
FIGS. 9A to 9C are views of the semiconductor substrate according to Modification 2 of the first embodiment of the present invention in the steps of the semiconductor device fabrication method using the semiconductor substrate, which illustrate the steps of the method (Part 1 ).

As illustrated in FIG. 9A, on the surface of the semiconductor wafer 10, the monitor parts 14a-14e are formed together with a plurality of semiconductor devices (semiconductor chips). The monitor part 14a-14c are formed in the region 12 for the release film 40 to be adhered. The parts where the monitor parts 14a-14c are formed are the same as those of the semiconductor substrate described above with reference to FIG. 7A. The parts where the monitor parts 14d, 14e are formed are in the region of the peripheral part of the semiconductor wafer 10, which is other than the region 12 for the release film to be adhered. The part where the monitor part 14e is formed is opposite to the monitor part 14d across the monitor part 14a formed near the center. The monitors 14d, 14e have the same structure as the monitor parts 14a-14c described above. The semiconductor monitor of the present modification is constituted by the monitor parts 14a-14e. Thus, the semiconductor substrate according to the present modification is constituted.

Next, the semiconductor device fabrication method according to the present modification will be explained with reference to FIGS. 9A to 10C.

First, as illustrated in FIG. 9A, the semiconductor substrate (semiconductor wafer) 10 according to the present modification is prepared.

Next, the surface protection film 39 is applied to the entire surface of the semiconductor wafer 10.

Then, the second surface of the semiconductor wafer 10 is polished with a grinding wheel. Because of the surface protection film 39 applied to the surface of the semiconductor wafer 10, the first surface of the semiconductor wafer 10 is protected by the surface protection film 39 when the second surface of the semiconductor wafer 10 is polished. Thus, the polish of the second surface of the semiconductor wafer 10 is completed.

Figure 9B:
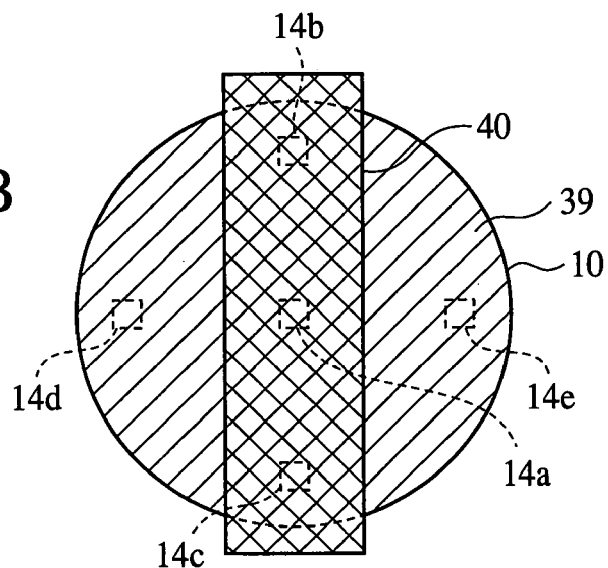

Then, as illustrated in FIG. 9B, the release film 40 is adhered to the surface protection film 39. The release film 40 is adhered to the surface protection film 39, covering the monitor part 14a formed near the center of the semiconductor wafer 10, the monitor part 14b formed near the peripheral part of the semiconductor wafer 10 and the monitor part 14c formed opposite to the monitor part 14b.

Figure 9C:
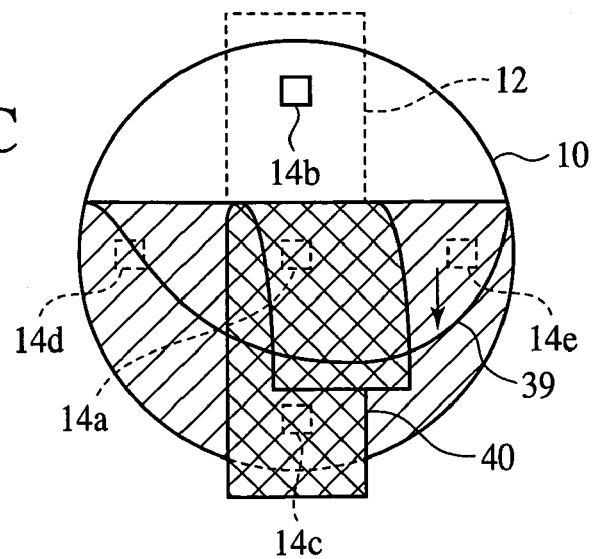

Then, as illustrated in FIG. 9C, the release film 40 is pulled to remove the surface protection film 39 from the surface of the semiconductor wafer 10. When static electricity is generated upon the release of the surface protection film 39 from the surface of the semiconductor wafer 10, electric charges are stored in the electrode pads 32 and the gate electrodes 24 while electric charges are trapped in the gate insulation film 22. When too large static electricity is charged in the electrode pads 32, etc. upon the release of the surface protection film 39, the electric charge trapped in the gate insulation film 22 exceeds the allowable quantity of the gate insulation film 22, and electric breakdown takes place in the gate insulation film 22.

Next, a measurement is made as to whether or not electric breakdown has taken place in the MOS diodes 26 of the monitor parts 14a-14e.

Figure 10A:
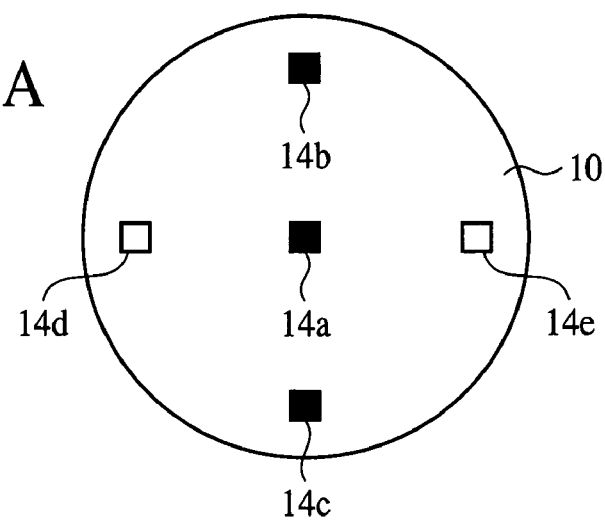
FIGS. 10A to 10C are views of the semiconductor substrate according to Modification 2 of the first embodiment of the present invention in the steps of the semiconductor device fabrication method using the semiconductor substrate, which illustrate the steps of the method (Part 2).
Figure 10B:
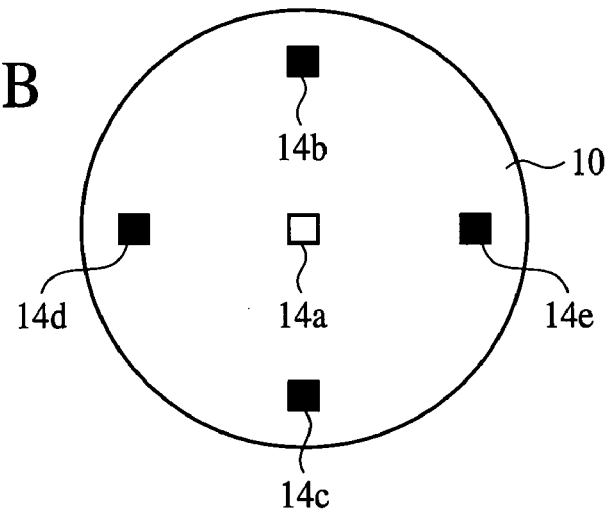
Figure 10C:
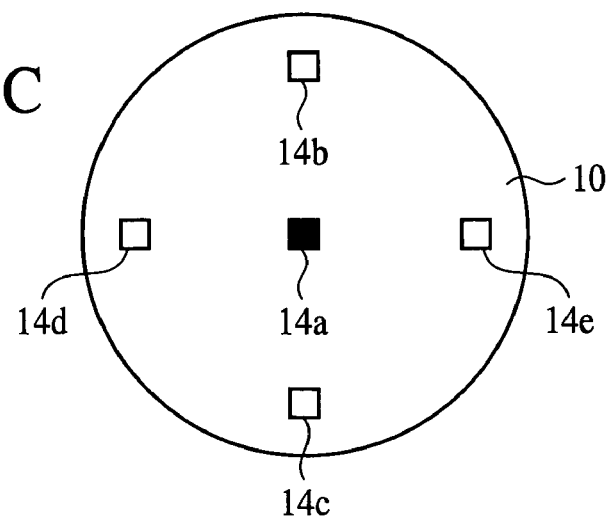

FIG. 10A illustrates the case that electric breakdown has taken place in the monitor parts 14a-14c but has not taken place in the monitor parts 14d, 14e. In FIGS. 10A to 10C, when the monitor parts 14 have the electric breakdown, they are blacked out. As described above, relatively large static electricity is often generated in the region with the release film 40 adhered. When relatively large static electricity is generated upon the release of the surface protection film 39, relatively large static electricity will be charged in the electrode pad 32 of the monitor part 14a, the electrode pad 32 of the monitor part 14b and the electrode pad 32 of the monitor 14c (see FIG. 6A). On the other hand, in the parts where the monitor parts 14d, 14e are formed, to which the release film 40 is not adhered, even when relatively large static electricity is generated upon the release of the surface protection film 39, relatively small static electricity is charged in the monitor parts 14d. 14e. Accordingly, in the case that, as illustrated in FIG. 10A, the electric breakdown has taken place in the monitor parts 14a-14c but has not taken place in the monitor parts 14d, 14e, it is judged that the electric breakdown has taken place due to too large static electricity generated upon the release of the surface protection film 39.

FIG. 10B illustrates the case that the electric breakdown has not taken place in the monitor part 14a but has taken place in the monitor parts 14b-14e. When the peripheral parts of the semiconductor wafer 10 is damaged by the exposure of the semiconductor wafer 10 to a plasma atmosphere, it is considered that, as illustrated in FIG. 7B, the electric breakdown does not taken place in the monitor part 14a but takes place in the monitor parts 14b-14e. Accordingly, when the electric breakdown has taken place in the monitor part 14a but has taken place in the monitor parts 14b-14e, it is considered that the peripheral part of the semiconductor wafer 10 is damaged by the exposure of the semiconductor wafer 10 in the plasma atmosphere, and resultantly the electric breakdown has taken place in the monitor parts 14b-14e.

FIG. 10C illustrates the case that the electric breakdown has taken place in the monitor part 14a but has not taken place in the monitor parts 14b-14e. When the central part of the semiconductor wafer 10 is damaged by the exposure of the semiconductor wafer 10 to a plasma atmosphere, it is considered that, a illustrated in FIG. 10C, the electric breakdown takes place in the monitor part 14a but does not take place in the monitor parts 14b-14e. Accordingly, when the electric breakdown has taken place in the monitor part 14a but has not taken place in the monitor parts 14b-14e, it is considered that the central part of the semiconductor wafer 10 is damaged by the exposure of the semiconductor wafer 10 to the plasma atmosphere, and resultantly the electric breakdown has taken place in the monitor part 14a.

As described above, when the monitor part 14 that the electric breakdown has taken place and the monitor part 14 that the electric breakdown has not taken place are mixed in the region where the release film 40 is adhered, it can be considered that the electric breakdown has taken place due to factors other than the static electricity generated upon the release of the surface protection film 39.

When the electric breakdown has not taken place in any of the monitor parts 14a-14e, it can be judged that too large static electricity has not be generated upon the release of the surface protection film 39.

As described above, the monitor parts 14d, 14e may be additionally formed in the region other than the region for the release film 40 to be adhered. According to the present modification, factors for the electric breakdown can be judged more correctly.

(Modification 3)

Next, the semiconductor substrate according to Modification 3 of the present embodiment and the semiconductor device fabrication method using the semiconductor substrate will be explained with reference to FIGS. 11A to 12C. FIGS. 11A to 12C are views illustrating the semiconductor substrate according to the present modification and the steps of the semiconductor device fabrication method using the semiconductor substrate.

The semiconductor substrate according to the present modification is characterized in that the monitor part is formed in all the chips.

Figure 11A:
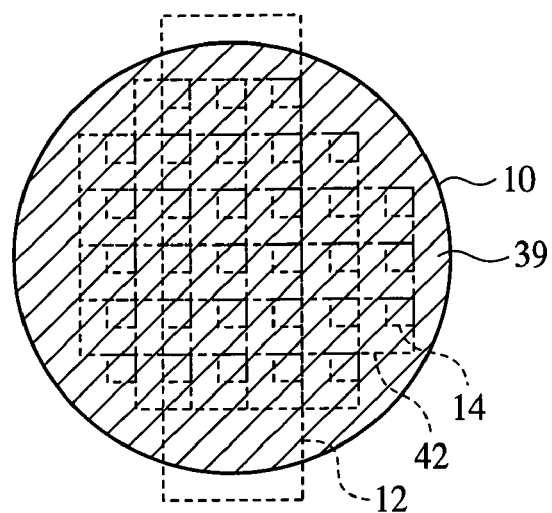
FIGS. 11A to 11C are views of the semiconductor substrate according to Modification 3 of the first embodiment of the present invention in the steps of the semiconductor device fabrication method using the semiconductor substrate, which illustrate the steps of the method (Part 1).

As illustrated in FIG. 11A, on the surface of the semiconductor wafer 10, monitor parts 14 are formed together with a plurality of semiconductor devices (semiconductor chips) 42. Each monitor part 14 is formed in each semiconductor chip 42. Thus, the semiconductor substrate according to the present modification is constituted.

Next, the semiconductor device fabrication method according to the present modification will be explained with reference to FIGS. 11A to 12C.

First, as illustrated in FIG. 11A, the semiconductor substrate (semiconductor wafer) 10 according to the present modification is formed.

Then, the surface protection film 39 is applied to the surface of the semiconductor wafer 10.

Next, the second surface of the semiconductor wafer 10 is polished with a grinding wheel. Because of the surface protection film 39 formed on the surface of the semiconductor wafer 10, the first surface of the semiconductor wafer 19 is protected by the surface protection film 39 when the second surface of the semiconductor wafer 10 is polished. Thus, the polish of the second surface of the semiconductor wafer 10 is completed.

Figure 11B:
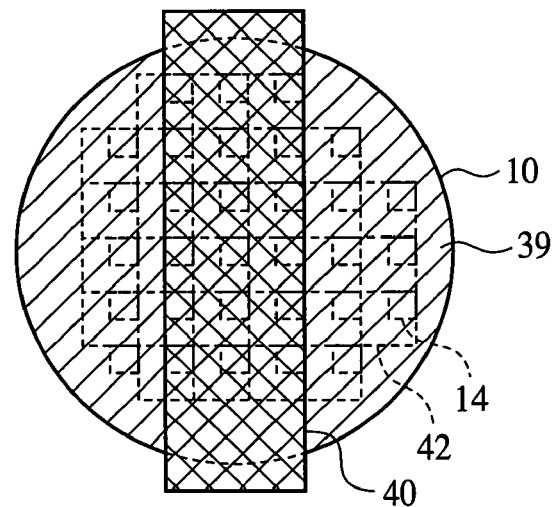

Then, as illustrated in FIG. 11B, the release film 40 is adhered to the surface protection film 39.

Figure 11C:
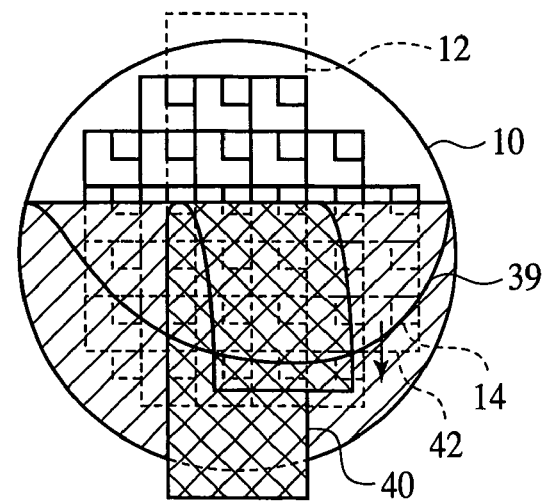

Next, as illustrated in FIG. 11C, the release film 40 is pulled to release the surface protection film 30 from the first surface of the semiconductor wafer 10. When static electricity is generated upon the release of the surface protection film 39, electric charges stored in the electrode pads 32 and the gate electrodes 24 while electric charges are trapped in the gate insulation film 22. When too large static electricity is charged in the electrode pads 32, etc. upon the release of the surface protection film 39, the charges trapped in the gate insulation film 22 exceeds the allowable quantity of the gate insulation film 22, and the electric breakdown takes place in the gate insulation film 22.

Next, a measurement is made as to whether or not electric breakdown has taken place in the MOS diodes 26 of the monitor parts 14.

Figure 12A:
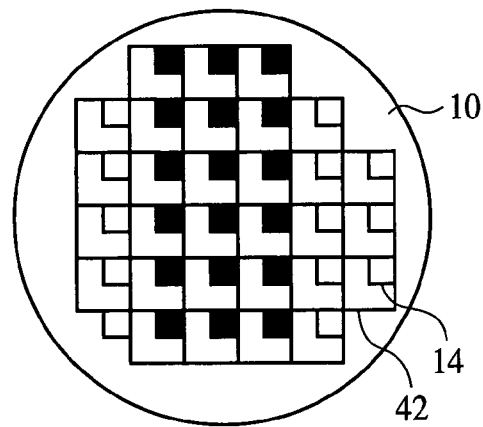
FIGS. 12A to 12C are views of the semiconductor substrate according to Modification 3 of the first embodiment of the present invention in the steps of the semiconductor device fabrication method using the semiconductor substrate, which illustrate the steps of the method (Part 2).

FIG. 12A illustrates the case that electric breakdown has taken place in the monitor parts 14 in the region where the release film 40 is adhered and has not taken place in the monitor parts 14 in the region where the release film 40 has not been adhered. When the surface protection film 39 is released from the surface of the semiconductor wafer 10, there is a risk that relatively large static electricity may be generated in the region where the release film 40 has been adhered (see FIG. 6A). On the other hand, in the region where the release film 40 has not been adhered, too large static electricity is not generated. Accordingly, in the case that, as illustrated in FIG. 12A, the electric break down has taken place in the monitor parts 14 in the region where the release film 40 has been adhered but has not taken place in the monitor parts 14 in the region where the release film 40 has not been adhered, it can be judged that the electric breakdown has taken place due to too large static electricity generated upon the release of the surface protection film 39.

FIG. 12A exemplified the case that the electric breakdown has taken place in all the monitor parts 14 in the region where the release film 40 is adhered. However, even when too large static electricity is generated upon the release of the surface protection film 39, the electric breakdown doe not take place always in all the monitor parts 14 in the region where the release film 40 is adhere. When the occurrence percentage of the electric breakdown is high in the region where the release film 40 is adhered and low in the region where the release film is not adhered, it can be considered that too large static electricity has been generated upon the release of the surface protection film 39.

Figure 12B:
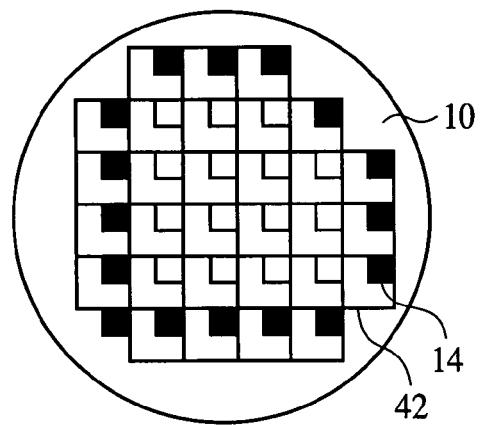

FIG. 12B illustrates the case that the electric breakdown has not taken place in the monitor parts 14 near the center of the semiconductor wafer 10 but has taken place in the monitor parts 14 near the peripheral edge of the semiconductor wafer 10. When the peripheral part of the semiconductor wafer 10 is damaged by the exposure of the semiconductor wafer 10 to a plasma atmosphere as illustrated in FIG. 6B, it is considered that, as illustrated in FIG. 12B, the electric breakdown does not take place in the monitor part 14 near the center of the semiconductor wafer 10 but takes place in the monitor parts 14 near the peripheral edge of the semiconductor wafer 10. Accordingly, when the electric breakdown has not take place in the monitor parts 14 near the center of the semiconductor wafer 10 but has taken place in the monitor parts 14 near the peripheral edge of the semiconductor wafer 10, it can be considered that the peripheral part of the semiconductor wafer 10 has been damaged due to the exposure of the semiconductor wafer 10 in the plasma atmosphere, which has caused the electric breakdown in the monitor parts 14 near the peripheral part of the semiconductor wafer 10.

Figure 12C:
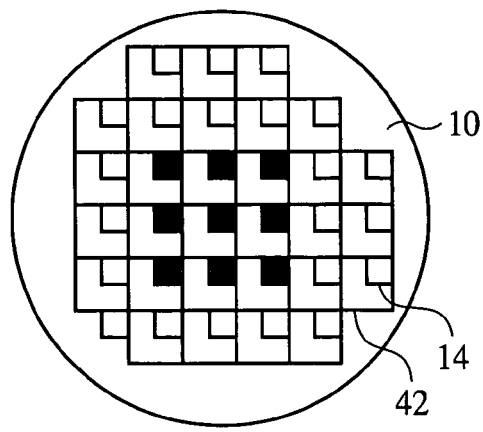

FIG. 12C illustrates the case that the electric breakdown has taken place in the monitor parts 14 near the center of the semiconductor wafer 10 but has not taken place in the monitor parts 14 near the peripheral edge of the semiconductor wafer 10. When the center part of the semiconductor wafer 10 is damaged by the exposure of the semiconductor wafer 10 to a plasma atmosphere as illustrated in FIG. 6C, it is considered that, as illustrated in FIG. 12C, the electric breakdown takes place in the monitor part 14 near the center of the semiconductor wafer 10 but does not take place in the monitor parts 14 near the peripheral edge of the semiconductor wafer 10. Accordingly, when the electric breakdown has taken place in the monitor parts 14 near the center of the semiconductor wafer 10 but has not taken place in the monitor parts 14 near the peripheral edge of the semiconductor wafer 10, it can be considered that the center part of the semiconductor wafer 10 has been damaged due to the exposure of the semiconductor wafer 10 in the plasma atmosphere, which has caused the electric breakdown in the monitor parts 14 near the center part of the semiconductor wafer 10.

As described above, when the monitor part 14 that the electric breakdown has taken place and the monitor part 14 that the electric breakdown has not taken place are mixed in the region where the release film 40 is adhered, it can be considered that the electric breakdown has taken place to factors other than the static electricity generated upon the release of the surface protection film 39.

FIG. 12B exemplifies the case that the electric breakdown has taken place in all the monitor parts 14 near the peripheral edge of the semiconductor wafer 10. However, even when the peripheral part of the semiconductor wafer 10 is much damaged, the electric breakdown does not always take place in all the monitor parts 14 near the peripheral edge of the semiconductor wafer 10. When the occurrence percentage of the electric breakdown is high near the peripheral edge of the semiconductor wafer 10 and low near the center of the semiconductor wafer 10, it can be considered that the peripheral edge of the semiconductor wafer 10 has been much damaged.

FIG. 12C exemplifies the case that the electric breakdown has taken place in all the monitor parts 14 near the center of the semiconductor wafer 10. However, even when the central part of the semiconductor wafer 10 is much damaged, the electric breakdown does not always take place in all the monitor parts 14 near the center of the semiconductor wafer 10. When the occurrence percentage of the electric breakdown is high near the center of the semiconductor wafer 10 and low near the peripheral edge of the semiconductor wafer 10, it can be considered that the central part of the semiconductor wafer 10 has been much damaged.

When the electric breakdown has not taken place in any of the monitor parts 14, it can be considered that too large static electricity has not been generated upon the release of the surface protection film 39.

As described above, the monitor parts 14 may be formed in all the semiconductor chips 42. According to the present modification, factors causing the electric breakdown can be judged more correctly.

A Second Embodiment

Figure 13:
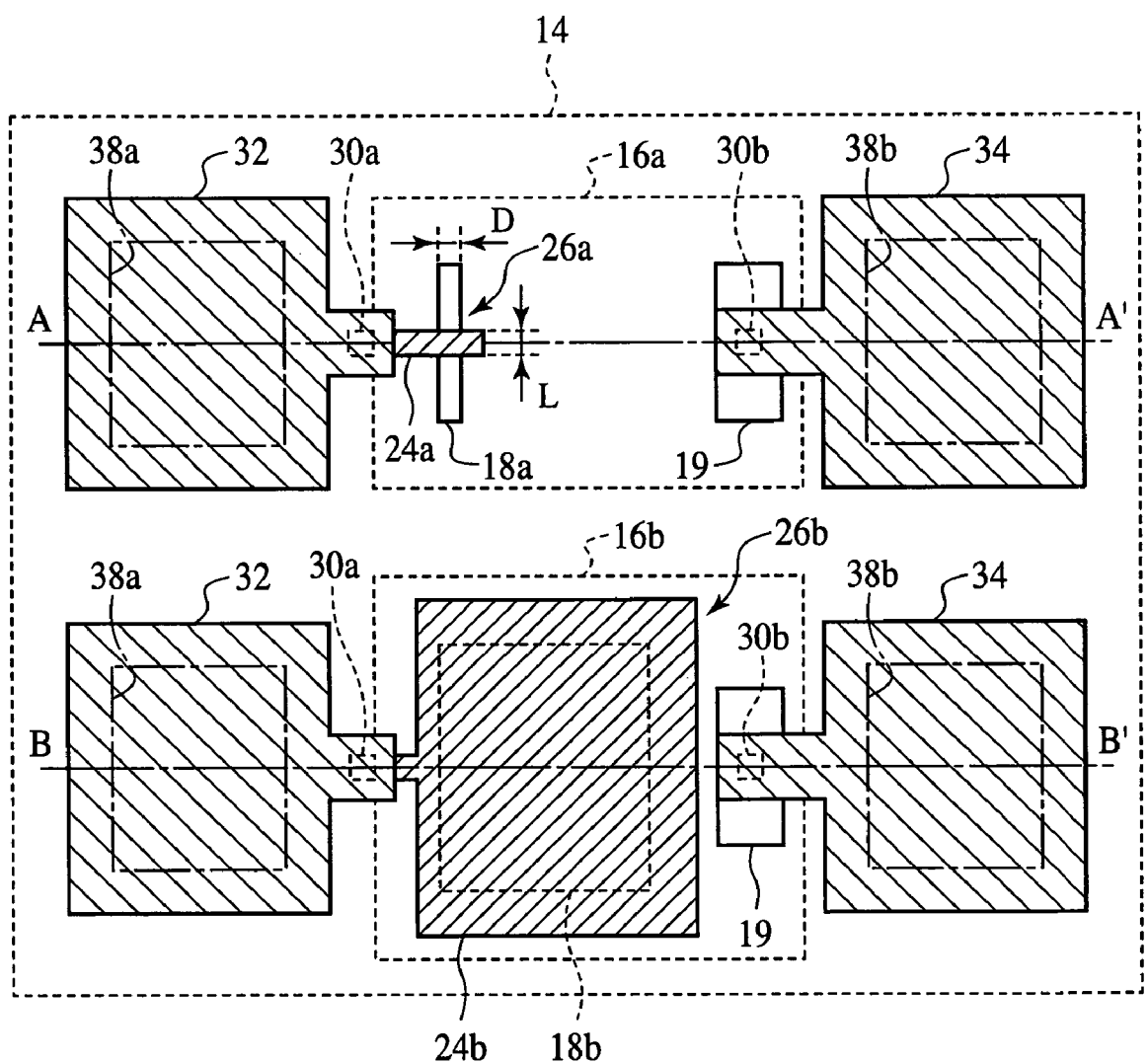
FIG. 13 is a plan view of the semiconductor substrate according to a second embodiment of the present invention.
Figure 14A:
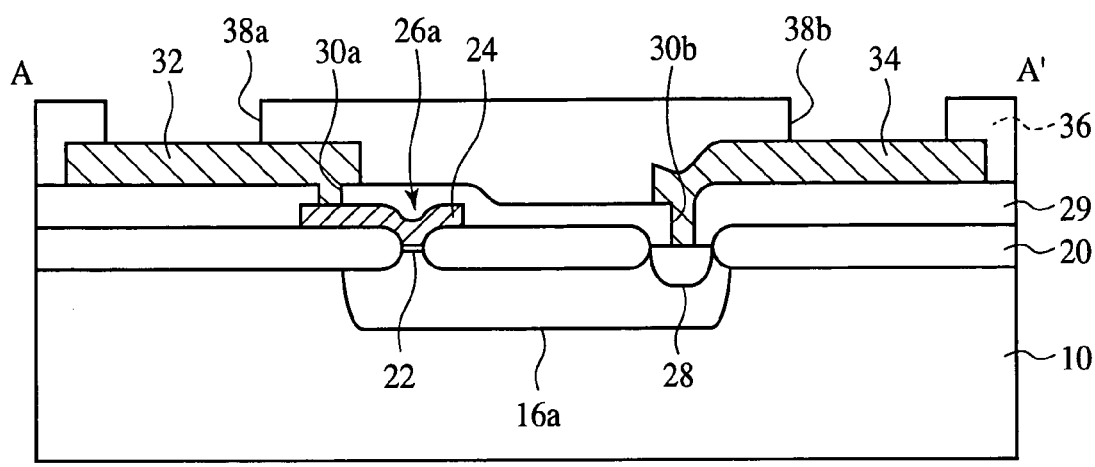
FIGS. 14A and 14B are sectional views of the semiconductor substrate according to the second embodiment of the present invention.
Figure 14B:
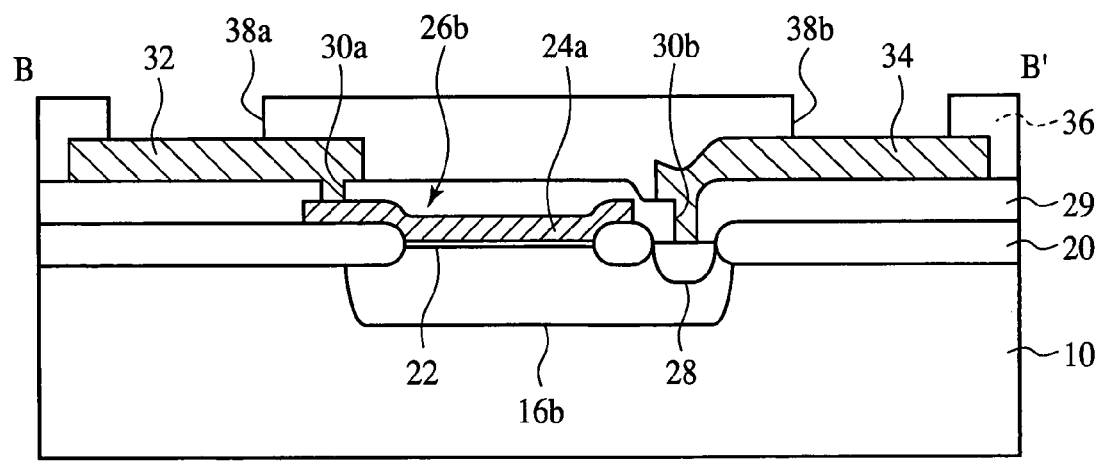

The semiconductor substrate according to a second embodiment of the present invention and the semiconductor device fabrication method using the semiconductor substrate will be explained with reference to FIGS. 13, 14A and 14B. FIG. 13 is a plan view of the semiconductor substrate according to the present embodiment. FIGS. 14A and 14B are sectional views of the semiconductor substrate according to the present embodiment. FIG. 14A is the sectional view along the line A-A in FIG. 13, and FIG. 14B is the sectional view along the line B-B' in FIG. 13. The same members of the present embodiment as those of the semiconductor substrate and the semiconductor device fabrication method according to the first embodiment illustrated in FIGS. 1A to 12C are represented by the same reference numbers no to repeat or to simplify their explanation.

The semiconductor device and the semiconductor device fabrication method according to the present embodiment is characterized mainly in that each monitor part 14 includes a plurality of MOS diodes 26a, 26b which are very different from each other in the gate area.

As illustrated in FIGS. 13 to 14B, an N type well 16a and an N type well 16b are formed in a semiconductor wafer 10. The well 16a and the well 16b are formed adjacent to each other.

In the well 16a, device regions 18a, 19 are formed, defined by device isolation regions 20. The size of the device region 18a is, e.g., 0.8 μm×2 μm.

In the well 16b, device regions 18b, 19 are formed, defined by device isolation regions 20. The size of the device region 18b is, e.g., 60 μm×60 μm, which is relatively large.

A gate insulation film 22 of, e.g., a 20 nm-thickness is formed on the surface of the device regions 18a, 18b.

On the gate insulation film 22 and the device isolation regions 20, a gate electrode 24a of, e.g., polysilicon is formed. The gate electrode 24a, the gate insulation film 22 and the well 16a constitute a MOS diode 26a.

On the gate insulation film 22 and the device isolation regions 20, a gate electrode 24b of, e.g., polysilicon is formed. The area of the gate electrode 24b is set larger than the area an electrode pad 32. The gate electrode 24b, the gate insulation film 22 and the well 16b constitute a MOS diode 26b.

An inter-layer insulation film 29 of, e.g., silicon oxide film is formed on the semiconductor wafer 10 with the MOS diodes 26a, 26b, etc. formed on.

In the inter-layer insulation film 29, contact holes 30a and contact holes 30b are formed respectively down to the gate electrodes 24a, 24b and down to a contact layer 28.

On the inter-layer insulation film 29, electrode pads 32 are formed, connected to the gate electrodes 24a, 24b through the contact holes 30a. On the inter-layer insulation film 29, electrode pads 34 are formed, connected to the contact layer through the contact holes 30b.

A cover film (insulation film) 36 is formed on the inter-layer insulation film 29 with the electrode pads 32, 34 formed on.

In the cover film 36, an opening 38a and an opening 38b are formed respectively down to the electrode pad 32 and down to the electrode pad 34.

Thus, the monitor part 14 is constituted. A plurality of the monitor parts 14 are arranged on the semiconductor wafer 10, as described above in the semiconductor device fabrication method according to the first embodiment. A plurality of the monitor parts 14 arranged on the semiconductor wafer 10 constitute a semiconductor monitor according to the present embodiment.

When static electricity is generated upon the release of the surface protection film 39, the static electricity is charged in the electrode pads 24 and the gate electrodes 24 while charges are trapped in the gate insulation film 22. In the MOS diode 26a, in which the gate area is set very small, the charge quantity which can be trapped in the gate insulation film 22 is small, and the gate insulation film 22 is vulnerable to electric breakdown. On the other hand, in the MOS diode 26b, in which the gate area is relatively large, the charge quantity which can be trapped by the gate insulation film 22 is large, and the gate insulation film 22 is invulnerable to electric breakdown.

When electric breakdown has taken place in the MOS diode 26a but has not taken place in the MOS diode 26b, it can be judged that relatively large static electricity is generated involved with the release of the surface protection film 39.

On the other hand, when electrostatic breakdown has taken place in both the MOS diode 26a and the MOS diode 26b, it can be considered that the poor film quality of, e.g., the gate insulation film 22 will be the factor for the electric breakdown.

As described above, according to the present embodiment, it can be judged whether the factor for the electric breakdown is due to too large static electricity generated, involved in the release of the surface protection film 39 or due to the film quality of the gate insulation film 22.

A Third Embodiment

Figure 15:
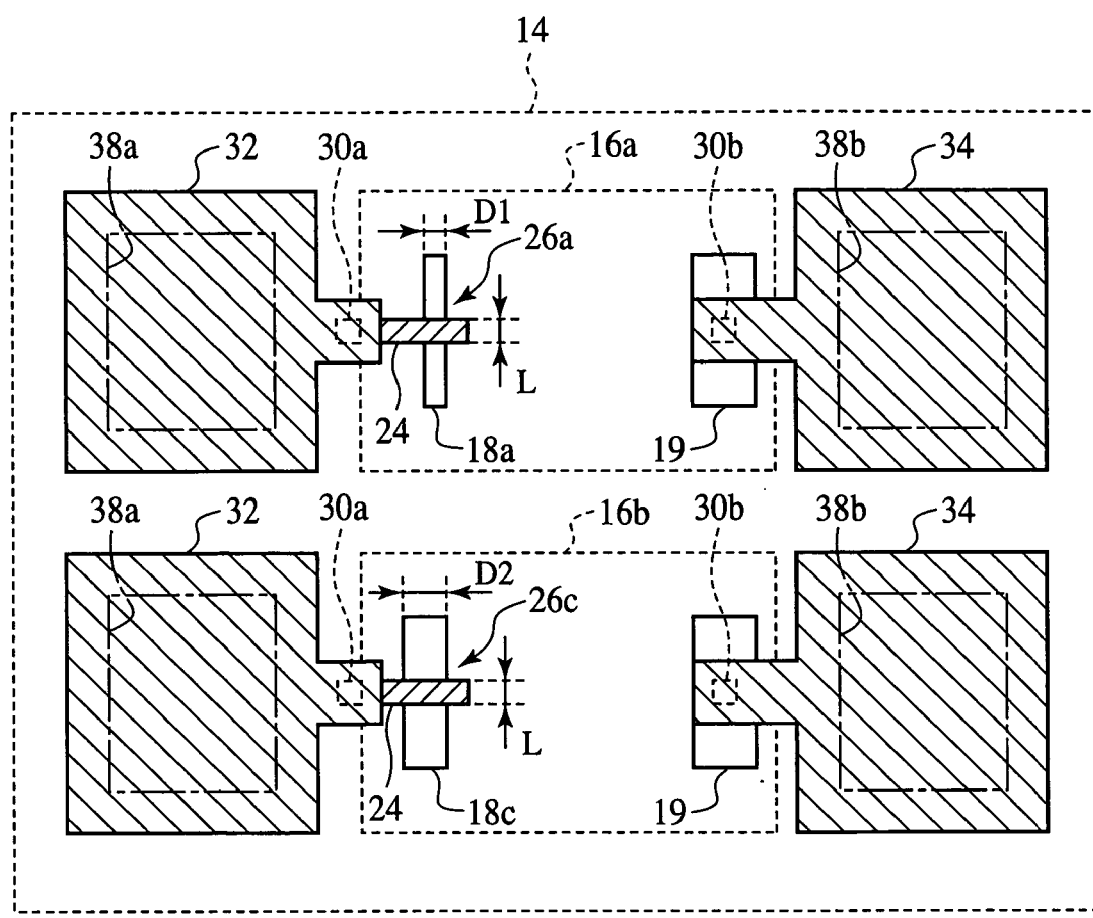
FIG. 15 is a plan view of the semiconductor substrate according to a third embodiment of the present invention.

The semiconductor substrate according to a third embodiment of the present invention and the semiconductor device fabrication method using the semiconductor substrate will be explained with reference to FIG. 15. FIG. 15 is a plan view of the semiconductor substrate according to the present embodiment. The same members of the present embodiment as those of the semiconductor substrate and the semiconductor device fabrication method according to the first or the second embodiment illustrated in FIGS. 1A to 14B are represented by the same reference numbers not to repeat or t simplify their explanation.

The semiconductor substrate and the semiconductor device fabrication method according to the present embodiment is characterized mainly in that each monitor part 14 includes MOS diodes 26a, 26c whose gate widths D1, D2 are different from each other.

As illustrated in FIG. 15, in well 16a, device regions 18a, 19 are formed, defined by device isolation regions 20 (see FIGS. 3A and 3B). In a well 16b, device regions 18c, 19 are formed, defined by device regions 20.

The width D1 of the device region 18a and the width D2 of the device region 18c are different form each other. The width D1 of the device region 18a is set at, e.g., 0.8 μm. The width D2 of the device region 18c is set at, e.g., 1.6 μm.

On the gate insulation film 22 and the device isolation regions 20, gate electrodes 24 are formed, respectively intersecting the device regions 18a, 18c.

The gate electrode 24, the gate insulation film 22 and the well 16a constitute the MOS diode 26a. The gate electrode 24, the gate insulation film 22 and the well 16a constitute the MOS diode 26c.

The width D1 of the device region 18a is 0.8 μm, and accordingly the gate width D1 of the MOS diode 26a is 0.8 μm. The width D2 of the device region 18c is 1.6 μm, and accordingly the gate width D2 of the MOS diode 26c is 1.6 μm.

The gate width is a longitudinal length of the gate electrode in the region where the gate electrode overlaps the device regions. In other words, the gate width is the width of the device region in the region where the gate electrode and device regions overlap each other.

The gate length L of the MOS diode 26a and the gate length L of the MOS diode 26c are both set at 0.5 μm.

In the present embodiment, the gate width D1 of the MOS diode 26a and the gate width D2 of the MOS diode 26c are different from each other, and the gate electrode of the MOS diode 26a and the gate area of the MOS diode 26c are accordingly different from each other. The MOS diode 26c, whose gate area is larger in comparison with the gate area of the MOS diode 26a, can trap a larger charge quantity. Accordingly, the MOS diode 26c is invulnerable to electric breakdown in comparison with the MOS diode 26a.

When electrostatic breakdown has taken place in the MOS diode 26a but has not taken place in the MOS diode 26c, it can be judged that static electricity of a quantity which causes electrostatic breakdown in the MOS diode 26a but does not cause electrostatic breakdown in the MOS diode 26c has been generated. Thus, according to the present embodiment, a quantity of the static electricity generated upon the release of the font side protection film 39 can be judged.

(A Modification)

Figure 16:
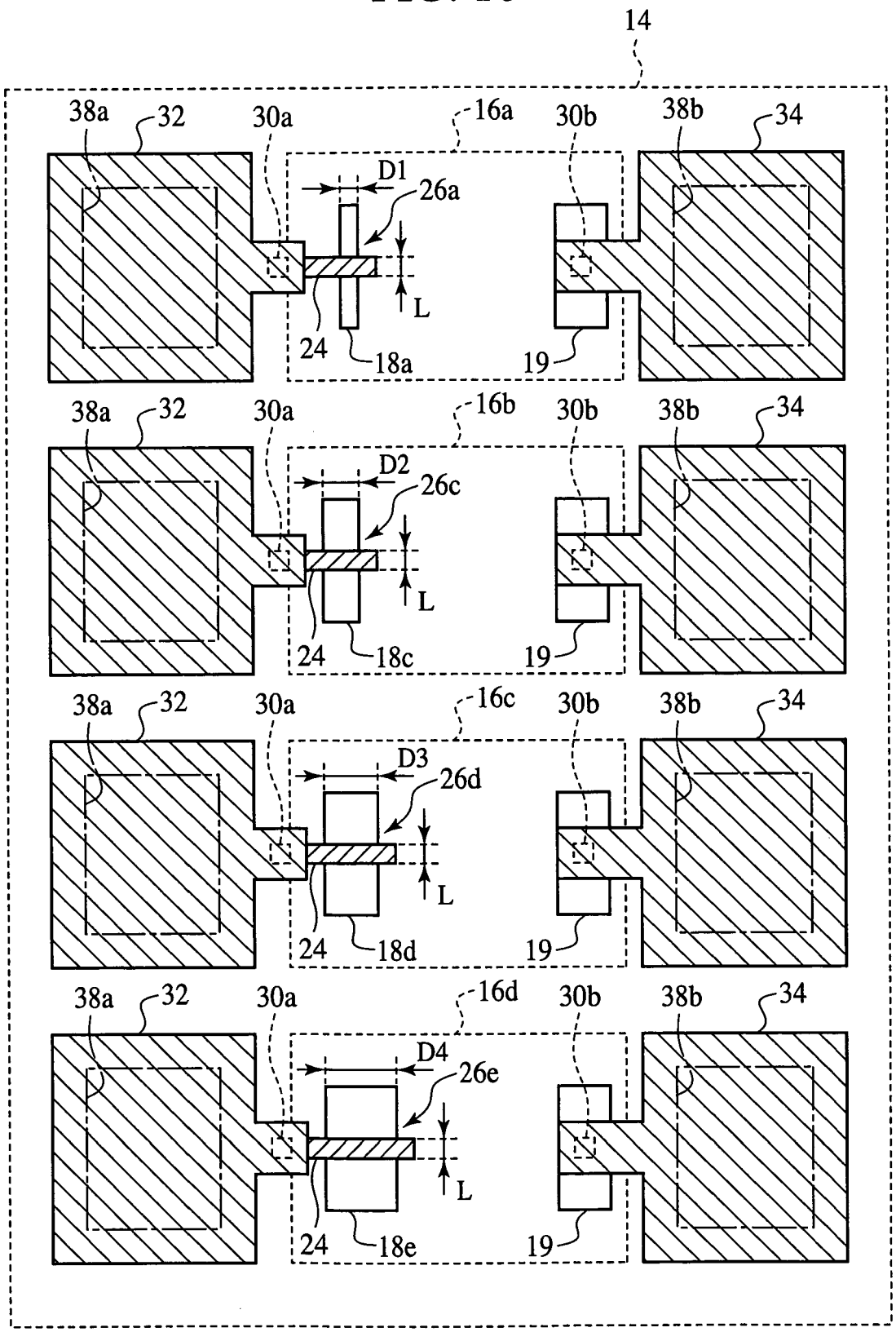
FIG. 16 is a plan view of he semiconductor substrate according to a modification of the third embodiment of the present invention.

Next, the semiconductor substrate according to the present embodiment and the semiconductor device fabrication method using the semiconductor substrate will be explained with reference to FIG. 16. FIG. 16 is plan views of the semiconductor substrate according to the present modification.

The semiconductor device and the semiconductor device fabrication method according to the present modification is characterized mainly in that each monitor part 14 includes a number of MOS diodes 26 which are different from each other in the gate width D.

As illustrated in FIG. 16, in the semiconductor wafer 10, N type wells 16a-16d are formed adjacent to each other.

In the well 16c, device regions 18d, 19 are formed, defined by the device isolation regions 20 (see FIGS. 3A and 3B).

In the well 18d, device regions 18e, 19 are formed, defined by the device isolation regions 20.

The gate insulation film 22 is formed on the device regions 18a, 18c, 18d, 18e.

The width D1 of the device region 18a is set at, e.g., 0.8 μm, and the width D2 of the device region 18c is set at, e.g., 1.6 μm. The width D3 of the device region 18d is set at, e.g., 2.4 μm. The width D4 of the device region 18e is set at, e.g., 3.2 μm.

On the gate insulation film 22 and the device isolation regions 20, the gate electrodes 24 are formed, respectively intersecting the device regions 18a, 18c, 18d, 18e.

The gate electrode 24, the gate insulation film 22 and the well 16 constitute the MOS diode 26a. The gate electrode 24, the gate insulation film 22 and the well 16a constitute the MOS diode 26c. The gate electrode 24, the gate insulation film 22 and the well 16b constitute the MOS diode 26d. The gate electrode 24, the gate insulation film 22 and the well 16c constitute the MOS diode 26e.

The width D1 of the device region 18a is 0.8 μm, and accordingly the gate width D1 of the MOS diode 26a is 0.8 μm. The width D2 of the device region 18c is 1.6 μm, and accordingly the gate width D2 of the MOS diode 26c is 1.6 μm. The width D3 of the device region 18d is 2.4 μm, and accordingly the gate width D3 of the MOS diode 26d is 2.4 μm. The width D4 of the device region 18e is 3.2 μm, and accordingly the gate width D4 of the MOS diode 26e is 3.2 μm.

According to the present modification, in each monitor part 14, a number of MOS diodes 26 having different gate widths Dare formed, whereby quantities of static electricity generated upon the release of the surface protection film 39 can be judged more correctly.

A Fourth Embodiment

Figure 17:
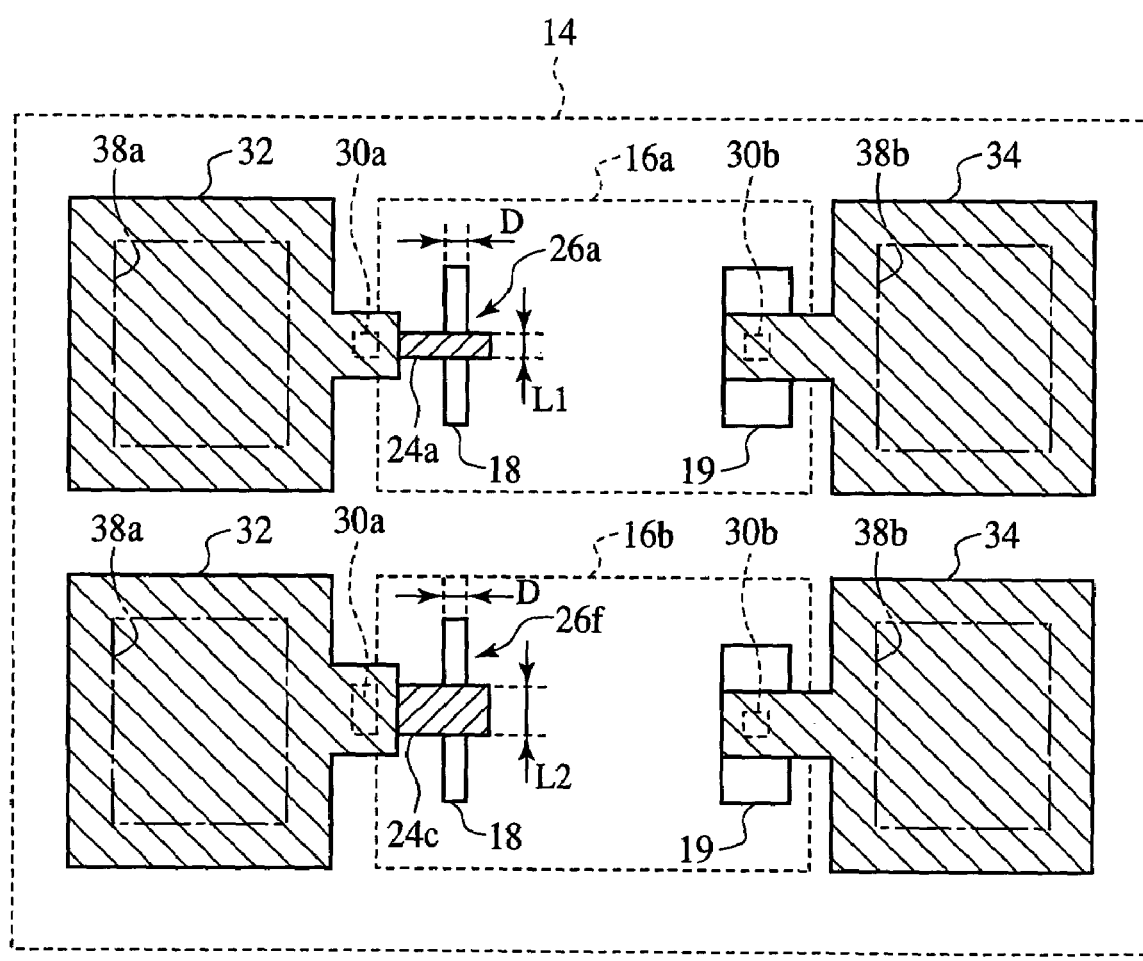
FIG. 17 is a plan view of the semiconductor substrate according to a fourth embodiment of the present invention.

The semiconductor substrate according to a fourth embodiment of the present invention and the semiconductor device fabrication method using the semiconductor substrate will be explained with reference to FIG. 17. FIG. 17 is a plan view of the semiconductor substrate according to the present embodiment. The same members of the present embodiment as those of the semiconductor substrate and the semiconductor device fabrication method according to the first to the third embodiments illustrated in FIGS. 1A to 16 are represented by the same reference numbers not to repeat or to simplify their explanation.

The semiconductor substrate and the semiconductor device fabrication method according to the present embodiment is characterized mainly in that each monitor part 14 includes MOS diodes 26 whose gate lengths L are different from each other.

As illustrated in FIG. 17, in each of N type wells 16a, 16b, device regions 18, 19 are formed, defined by device isolation regions 20 (see FIGS. 3A and 3B).

A gate insulation film 22 is formed on the device regions 18.

A gate electrode 24a is formed on the gate insulation film 22 and the device isolation regions 20, intersecting the device region 18. The width L1 of the gate electrode 24 is set at, e.g., 0.5 μm.

A gate electrode 24c is formed on the gate insulation film 22 and the device isolation region 20, intersecting the device region 18. The width L2 of the gate electrode 24c is set at, e.g., 1.0 µm.

The gate electrode 24a, the gate insulation film 22 and the well 16 constitute a MOS diode 26a. The gate electrode 24c, the gate insulation film 22 and the well 16a constitute a MOS diode 26f.

The width L1 of the gate electrode 24a is set at 0.5 µm, and accordingly, the length L1 of the MOS diode 26a is 0.5 µm. The width L2 of the gate electrode 24c is set at 1.0 µm, and accordingly, the gate length L2 of the MOS diode 26f is 1.0 µm.

The gate length is a longitudinal length of the device region in the region where the gate electrode and the device regions overlap each other. In other words, the gate length is a width of the gate electrode in the region where the gate electrode and the device regions overlap each other.

The gate width D of the MOS diode 26a and the gate width D of the MOS diode 26f are set both at 0.8 µm.

In the present embodiment, the gate length L1 of the MOS diode 26a and the gate length L2 of the MOS diode 26f are different from each other, and accordingly the gate area of the MOS diode 26a and the gate area of the MOS diode 26f are different from each other. The MOS diode 26f, which has a larger gate area than the MOS diode 26a, can trap larger charge quantities in the gate insulation film 22. Accordingly, the MOS diode 26f is less vulnerable to electric breakdown than the MOS diode 26a.

When electrostatic breakdown has taken place in the MOS diode 26a but has not taken place in the MOS diode 26f, it can be judged that static electricity of a quantity which causes the electrostatic breakdown in the MOS diode 26a but does not cause the electrostatic breakdown in the MOS diode 26f has been generated. Thus, according to the present embodiment, a quantity level of the static electricity generated upon the release of the surface protection film 39 can be judged.

(A Modification)

Figure 18:
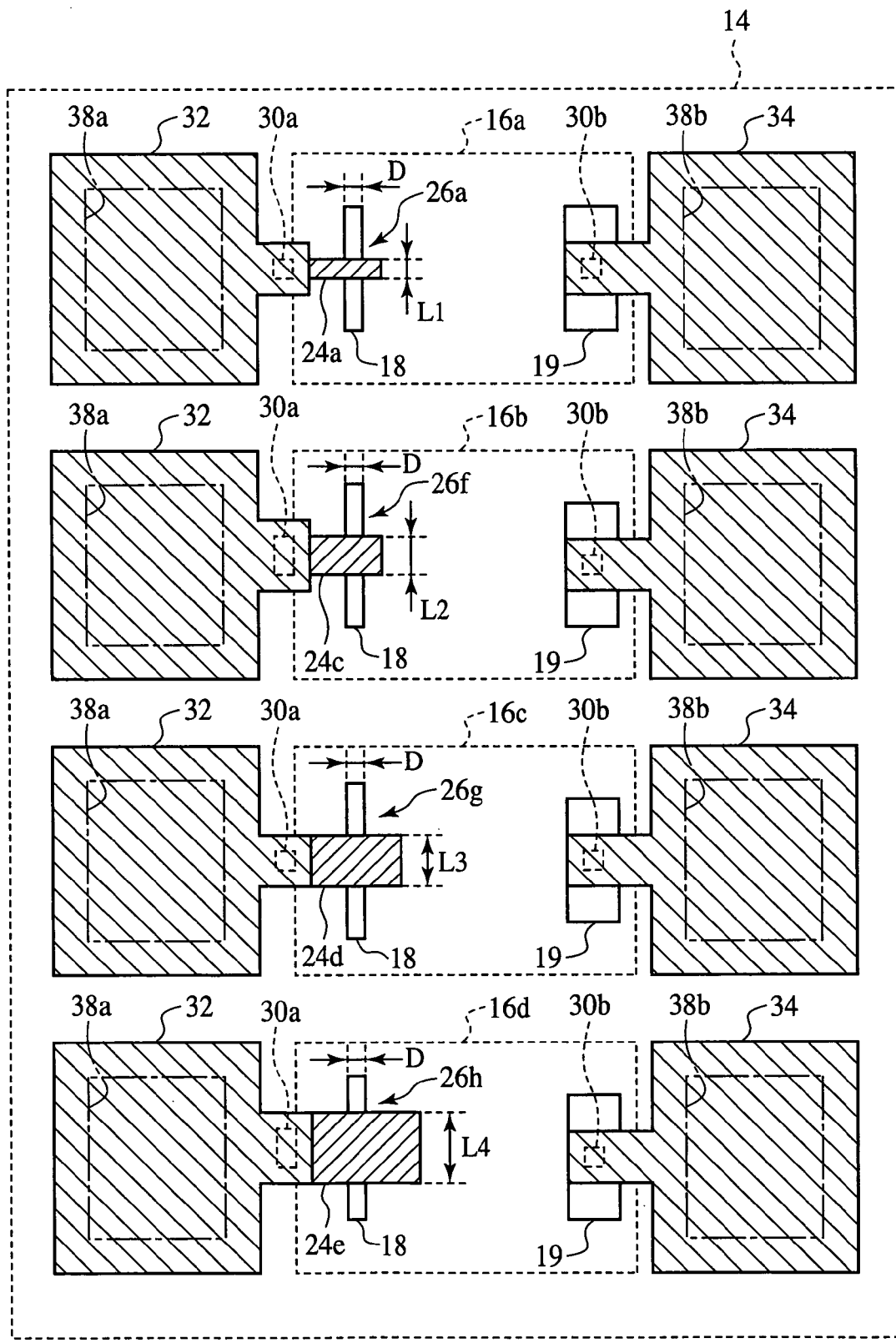
FIG. 18 is a plan view of the semiconductor substrate according to a modification of the fourth embodiment of the present invention.

Then, the semiconductor substrate according to a modification of the present embodiment and the semiconductor device fabrication method using the semiconductor substrate will be explained with reference to FIG. 18. FIG. 18 is a plan view of the semiconductor substrate according to the present modification.

The semiconductor substrate and the semiconductor device fabrication method according to the present modification is characterized mainly in that each monitor part 14 includes a number of MOS diodes 26 having gate lengths L different from one another.

As illustrated in FIG. 18, in each of N type wells 16a-16d, device regions 18, 19 are formed, defined by device isolation regions 20 (see FIGS. 3A and 3B).

The gate insulation film 22 is formed on the surface of the device regions 18.

On the gate insulation film 22 and the device isolation regions 20, a gate electrode 24a is formed, intersecting the device region 18. The width L1 of the gate electrode 24 is set at, e.g., 0.5 µm. The gate electrode 24a, the gate insulation film 22 and the well 16 constitute a MOS diode 26a.

On the gate insulation film 22 and the device isolation region 20, a gate electrode 24c is formed, intersecting the device region 18. The width L2 of the gate electrode 24b is set at, e.g., 1.0 µm. The gate electrode 24c, the gate insulation film 22 and the well 16a constitute a MOS diode 26f.

On the gate insulation film 22 and the device isolation region 20, a gate electrode 24d is formed, intersecting the device region 18. The width L3 of the gate electrode 24c is set at, e.g., 1.5 µm. The gate electrode 24d, the gate insulation film 22 and the well 16b constitute a MOS diode 26g.

On the gate insulation film 22 and the device isolation region 20, a gate electrode 24e is formed, intersecting the device region 18. The width L4 of the gate electrode 24d is set at, e.g., 2.0 µm. The gate electrode 24e, the gate insulation film 22 and the well 16c constitute a MOS diode 26h.

In the present embodiment, the gate lengths L of the MOS diodes 26 are different from one another, and accordingly the gate areas of the MOS diodes 26 are different from each other. The MOS diode 26f having a larger gate area than the MOS diode 26a is less vulnerable to electric breakdown than the MOS diode 26a. The MOS diode 26g having a larger gate area than the MOS diode 26f is less vulnerable to electric breakdown than the MOS diode 26f. The MOS diode 26h having a larger gate area than the MOS diode 26g is less vulnerable to electric breakdown than the MOS diode 26g.

When electrostatic breakdown has taken place in the MOS diode 26a but has not taken place in the MOS diodes 26f-26h, it can be judged that static electricity of a quantity which causes the electrostatic breakdown in the MOS diode 26a but does not cause the electrostatic breakdown in the MOS diode 26f has been generated. When electrostatic breakdown has taken place in the MOS diodes 26a, 26f but has not taken place in the MOS diodes 26g, 26h, it can be judged that static electricity of a quantity which causes the electrostatic breakdown in the MOS diode 26f but does not cause the electrostatic breakdown in the MOS diode 26g has been generated. When electrostatic breakdown has taken place in the MOS diodes 26a, 26f, 26g but has not taken place in the MOS diode 26h, it can be judged that static electricity of a quantity which causes the electrostatic breakdown in the MOS diode 26g but does not cause the electrostatic breakdown in the MOS diode 26h has been generated.

According to the present modification, in each monitor part 14 a number of MOS diodes 26 having different gate areas are formed, whereby quantity levels of static electricity generate upon the release of the surface protection film 39 can be judged more correctly.

A Fifth Embodiment

Figure 19:
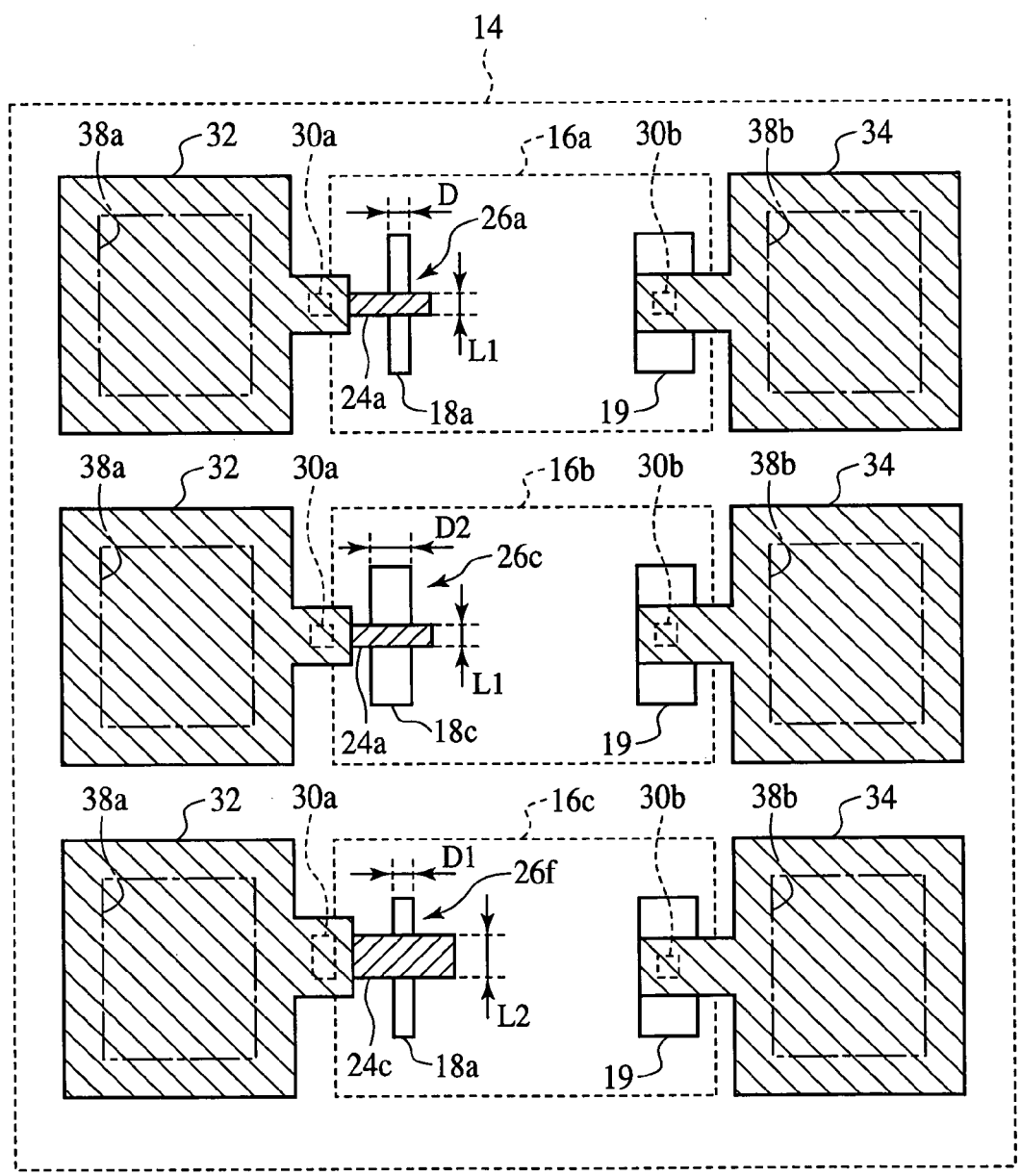
FIG. 19 is a plan view of the semiconductor device according to a fifth embodiment of the present invention.

The semiconductor substrate according to a fifth embodiment of the present embodiment and the semiconductor device fabrication method using the semiconductor substrate will be explained with reference to FIG. 19. FIG. 19 is a plan view of the semiconductor substrate according to the present embodiment. The same members of the present embodiment as those of the semiconductor substrate and the semiconductor device fabrication method according to the first to the fourth embodiments illustrated in FIGS. 1A to 18 are represented by the same reference numbers not to repeat or to simplify their explanation.

The semiconductor substrate and the semiconductor device fabrication method according to the present embodiment is characterized mainly in that each monitor part 14 includes a MOS diode 26a, a MOS diode 26c having a larger gate width D than the MOS diode 26a, and a MOS diode 26f having a larger gate length L than the MOS diode 26a.

As illustrated in FIG. 19, in a well 16a, device regions 18a, 19 are formed, defined by device isolation regions 20 (see FIGS. 3A and 3B). In a well 16b, device regions 18c, 19 are formed, defined by device isolation regions 20. In a well 16c, device regions 18a, 19 are formed, defined by device isolation regions 20. The width D1 of the device region 18a is set at 0.8 µm. The width D2 of the device region 18c is set at 1.2 µm.

A gate insulation film 22 is formed on the device regions 18a, 18c.

On the gate insulation film 22 and the device isolation regions 20, a gate electrode 24a is formed, intersecting the device region 18a. The width L1 of the gate electrode 24a is set at, e.g., 0.5 µm. The gate electrode 24a, the gate insulation film 22 and a well 16a constitute a MOS diode 26a.

On the gate insulation film 22 and the device isolation regions 20, a gate electrode 24a is formed, intersecting the device region 18b. The gate electrode 24a, the gate insulation film 22 and a well 16b constitute a MOS diode 26c.

On the gate insulation film 22 and the device isolation regions 20, a gate electrode 24c is formed, intersecting the device region 18a. The width L2 of the gate electrode 24c is set at, e.g., 1.2 µm. The gate electrode 24c, the gate insulation film 22 and a well 16c constitute a MOS diode 26f.

The width D1 of the device region 18a is set at 0.8 µm, and accordingly, the gate width D1 is of the MOS diode 26a is 0.8 µm. The width L1 of the gate electrode 24a is set at 0.5 µm, and accordingly the gate length L1 of the MOS diode 26a is 0.5 µm.

The width D2 of the device region 18c is set at 1.6 µm, and accordingly the gate width D2 of the MOS diode 26c is 1.6 µm. The width L1 of the gate electrode 24a is set at 0.5 µm, and accordingly the gate length L1 of the MOS diode 26c is 0.5 µm.

The width D1 of the device region 18a is set at 0.8 µm, and the gate width D1 of the MOS diode 26f is 0.8 µm. The width L2 of the gate electrode 24c is set at 1.0 µm, and accordingly the gate length L2 of the MOS diode 24f is 1.0 µm.

The gate area of the MOS diode 26c and the gate area of the MOS diode 26f are set equal to each other.

When electric breakdown has taken place in the MOS diode 26f, whose gate length L2 is relatively large and has not taken place in the MOS diodes 26a, 26c, whose gate length L1 is relatively small, it is considered that the voltage resistance is weakened near the edges of the device regions 18a, 18c.

On the other hand, when electric breakdown has taken place in the MOS diode 26c, whose gate width D2 is relatively large and has not taken place in the MOS diodes 26a, 26f, whose gate width D1 is relatively small, it is considered that the voltage resistance is weakened near the edge of the gate electrode 24a. For example, it is considered that the gate insulation film 22 has been damaged when the gate electrodes 24a were patterned.

According to the present embodiment, in each monitor part 14, the MOS diode 26a, the MOS diode 26c whose gate width D is larger than the MOS diode 26a, and the MOS diode 26f whose gate length L is larger than the MOS diode 26a are formed, whereby portions where the voltage resistance has been weakened can be identified.

(A Modification)

Figure 20:
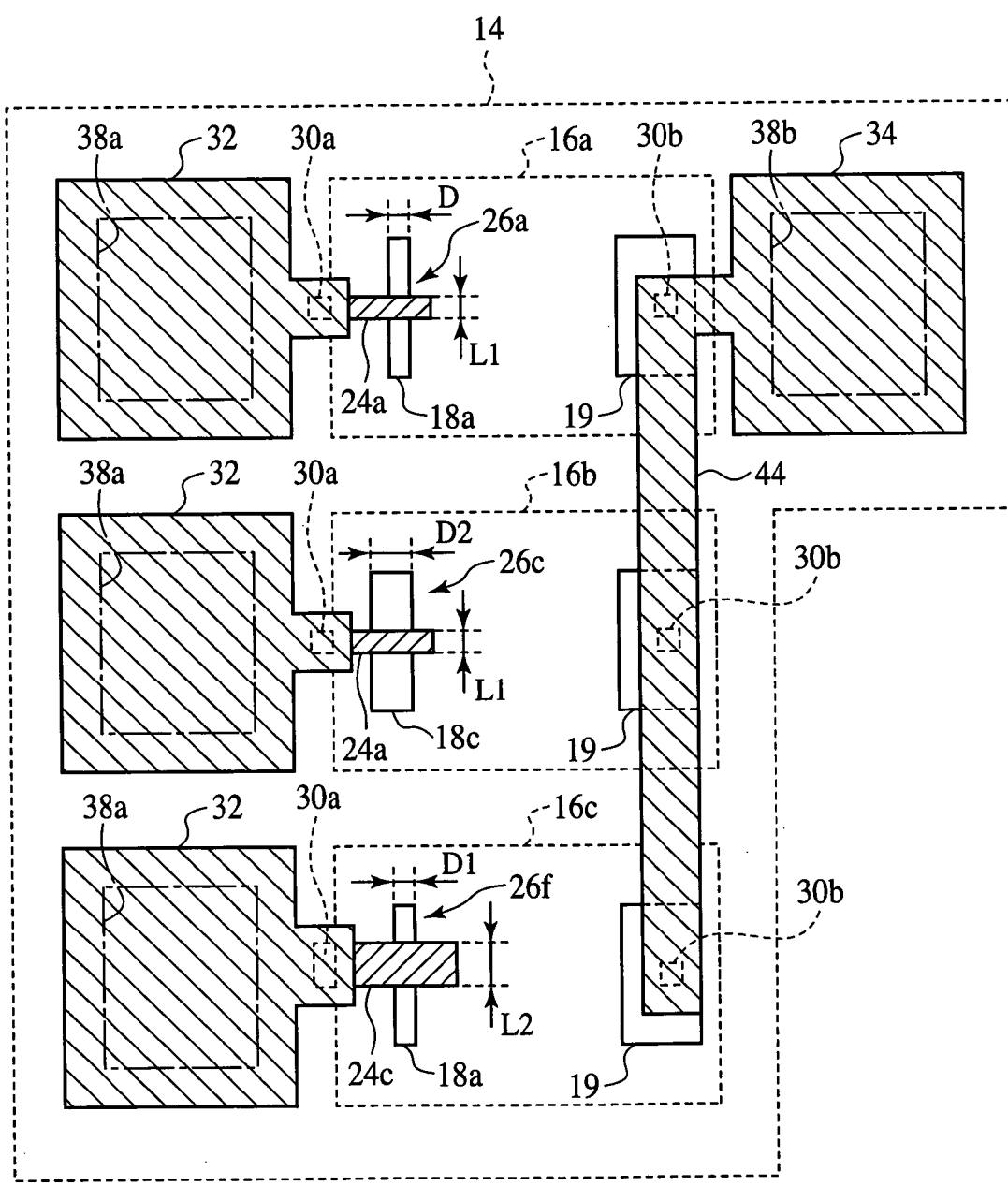
FIG. 20 is a plan view of the semiconductor substrate according to a modification of the fifth embodiment of the present invention.

Next, the semiconductor substrate according to a modification of the present embodiment and the semiconductor device fabrication method using the semiconductor substrate will be explained with reference to FIG. 20. FIG. 20 is a plan view of the semiconductor substrate according to the present modification.

The semiconductor substrate and the semiconductor device fabrication method according to the present modification is characterized mainly in that a plurality of wells 16a-16c are electrically interconnected with each other by an interconnection 44, and the wells 16a-16c are electrically interconnected with one electrode pad 34.

As illustrated in FIG. 20, the wells 16a-16c are electrically interconnected with each other by the interconnection 44. The interconnection 44 is formed integral with the electrode pad 34.

According to the present modification, a plurality of wells 16a-16c are electrically interconnected with each other by the interconnection 44, and the interconnection 44 is connected to the electrode pad 34, whereby a plurality of the electrode pads 34 are not necessary. Thus, according to the present modification, the area required for the monitor parts 14 can be made small.

A SIXTH EMBODIMENT

Figure 21:
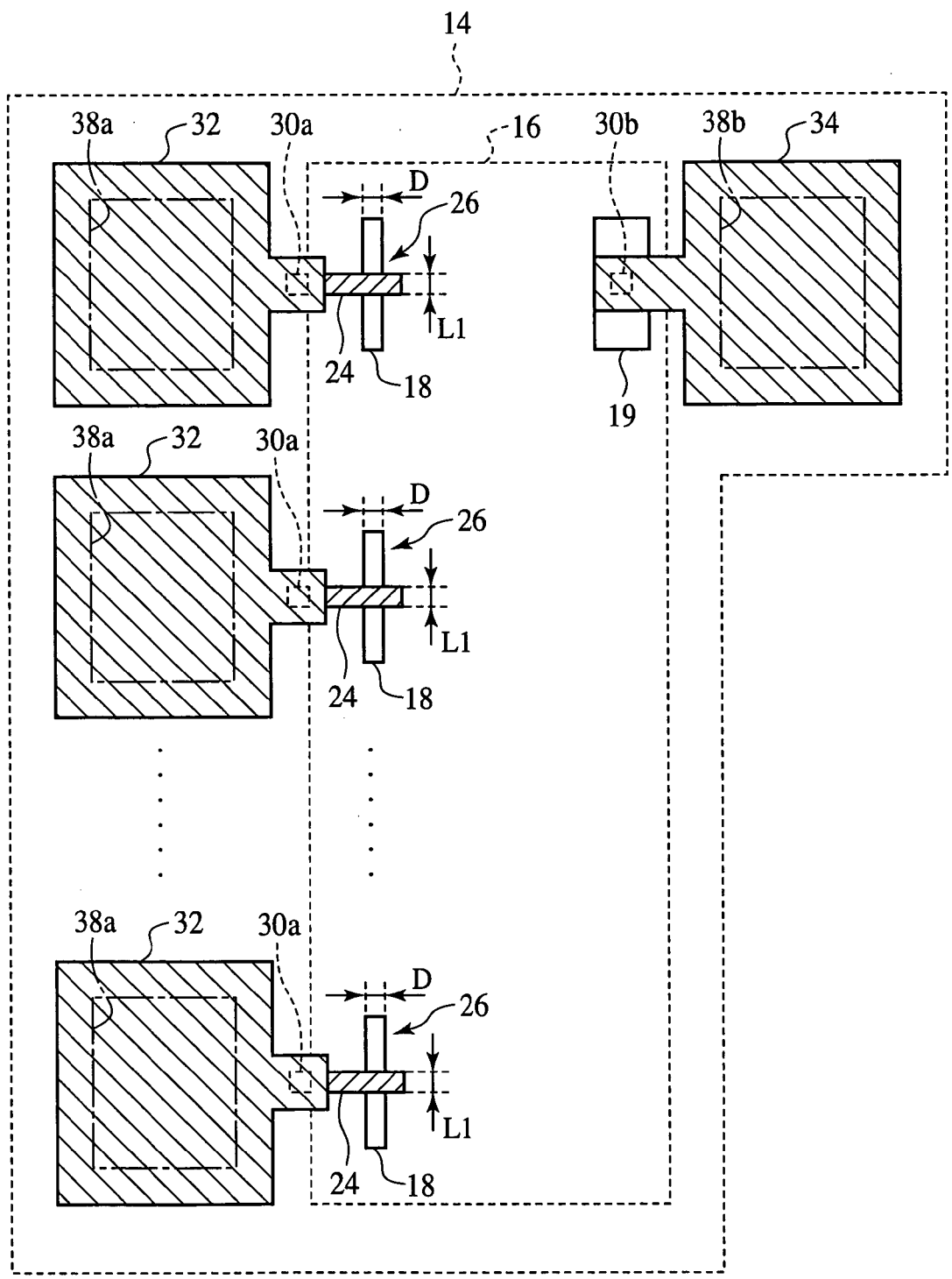
FIG. 21 is a plan view of the semiconductor substrate according to a sixth embodiment of the present invention.

The semiconductor device according to a sixth embodiment of the present invention and the semiconductor device fabrication method using the semiconductor substrate will be explained with reference to FIG. 21. FIG. 21 is a plan view of the semiconductor substrate according to the present embodiment. The same members of the present embodiment as those of the semiconductor substrate and the semiconductor device fabrication method according to the first to the fifth embodiments illustrated in FIGS. 1A to 20 are represented by the same reference numbers not to repeat or to simplify their explanation.

The semiconductor substrate and the semiconductor device fabrication method according to the present embodiment is characterized mainly in that a plurality of MOS diodes 26 are formed in a common well 16.

As illustrated in FIG. 21, a plurality of MOS diodes 26 are formed in the common well 16.

The well 16 is connected to one electrode pad 34.

According to the present embodiment, a plurality of MOS diodes 26 are formed in the common well 16, whereby the area required for the monitor parts 14 can be made small.

(Modification 1)

Figure 22:
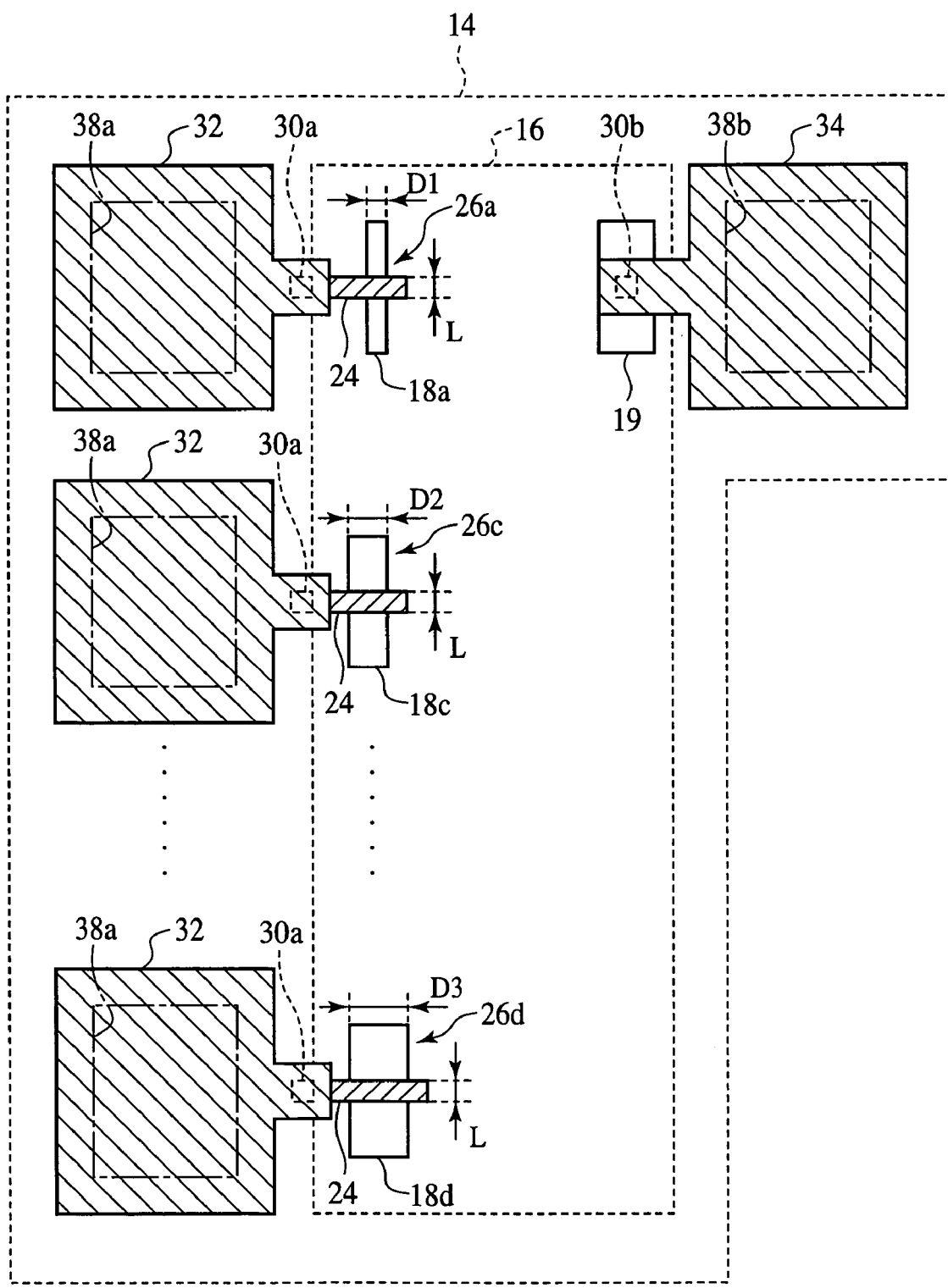
FIG. 22 is a plan view of the semiconductor substrate according to Modification 1 of the sixth embodiment of the present invention.

Next, the semiconductor substrate according to Modification 1 of the present embodiment and the semiconductor device fabrication method using the semiconductor substrate will be explained with reference to FIG. 22. FIG. 22 is a plan view of the semiconductor substrate according to the present modification.

The semiconductor substrate and the semiconductor device fabrication method according to the present modification is characterized mainly in that a plurality of MOS diodes 26, whose gate widths D are different from each other, are formed in a common well 16.

As illustrated in FIG. 22, a plurality of MOS diodes 26 are formed in the common well 16.

The wells 16 are connected to one electrode pad 34.

The gate width D1 of the MOS diode 26a is set at, e.g., 0.8 µm. The gate width D2 of the MOS diode 26c is set at, e.g., 1.6 µm. The gate width D3 of the MOS diode 26d is set at, e.g., 2.4 µm.

The gate lengths L of the MOS diodes 26a, 26c, 26d are all set at, e.g., 0.5 µm.

According to the present modification, the gate areas of the MOS diodes 26a, 26c, 26d are different from one another, a quantity level of static electricity generated upon the release of the surface protection film 39 can be judged.

(Modification 2)

Figure 23:
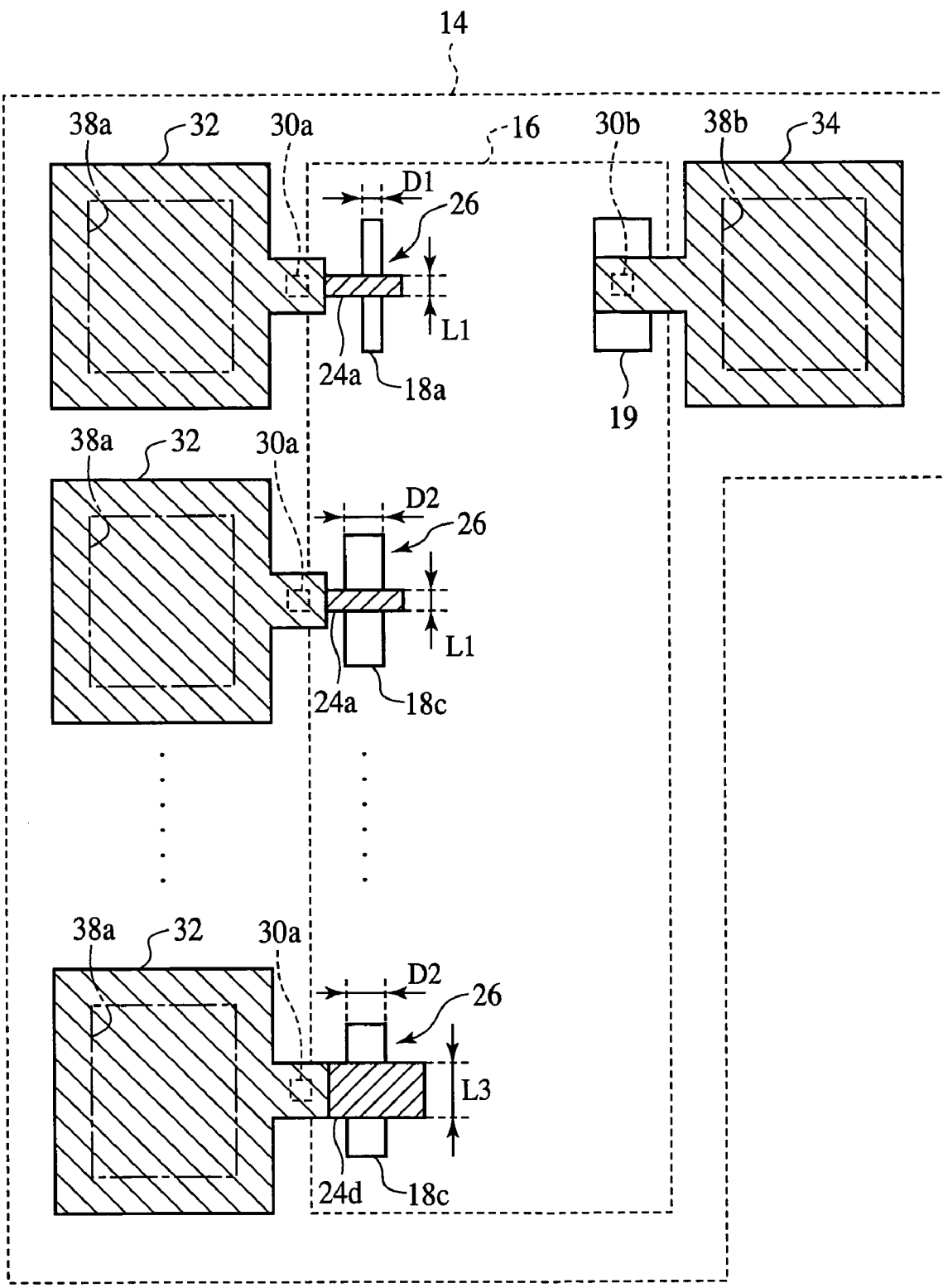
FIG. 23 is a plan view of the semiconductor substrate according to Modification 2 of the sixth embodiment of the present invention.

Next, the semiconductor substrate according to Modification 2 of the present embodiment and the semiconductor device fabrication method using the semiconductor substrate will be explained with reference to FIG. 23. FIG. 23 is a plan view of the semiconductor substrate according to the present modification.

The semiconductor substrate and the semiconductor device fabrication method according to the present modification is characterized mainly in that a plurality of MOS diodes 26 are formed in the common well 16, and the MOS diodes 26 are formed in various sets at the gate length L and the gate width D.

As illustrated in FIG. 23, a plurality of MOS diodes 26 are formed in the common well 16. The gate lengths L and the gate widths D of said plurality of MOS diodes 26 are in various combinations.

According to the present modification, a plurality of MOS diodes 26 are formed in the common well 16, and the gate length L and the gate width D of said plurality of MOS diodes 26 are set at various combinations, whereby a quantity level of the static electricity generated upon the release of the surface protection film 39 can be correctly judged.

A Seventh Embodiment

Figure 24:
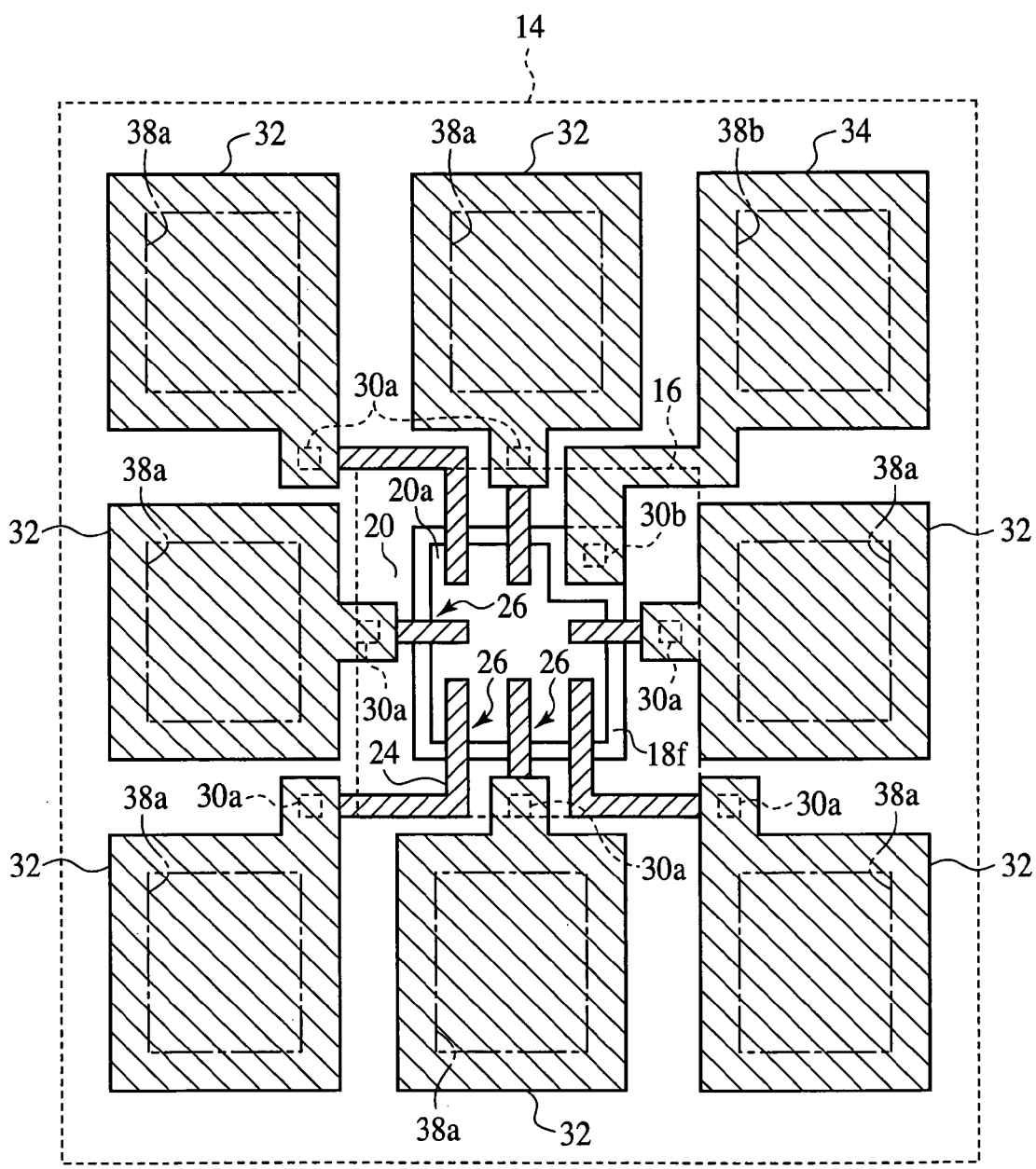
FIG. 24 is a plan view of the semiconductor substrate according to a seventh embodiment of the present invention.

The semiconductor substrate according to the seventh embodiment of the present invention and the semiconductor device fabrication method using the semiconductor substrate will be explained with reference to FIG. 24. FIG. 24 is a plan view of the semiconductor substrate according to the present embodiment. The same members of the present embodiment as those of the semiconductor substrate and the semiconductor device fabrication method according t the first to the sixth embodiments illustrated in FIGS. 1A to 23 are represented by the same reference numbers not to repeat or to simplify their explanation.

The semiconductor substrate and the semiconductor device fabrication method according to the present embodiment is characterized mainly in that a plurality gate electrodes 24 are formed, intersecting a common device region 18*f*.

As illustrated in FIG. 24, in a well 16, a device region 18*f* is formed, defined by device isolation regions 20, 20*a*. The device region 18*f* is formed in a ring.

A gate insulation film 22 is formed on the surface of the device region 18*f*.

On the gate insulation film 22 and the device isolation regions 20, 20*a*, a plurality of gate electrodes 24 are formed, intersecting the device region 18*f*. The gate electrodes 24, the gate insulation film 22 and the well 16 constitute MOS diodes 26.

Electrode pads 32 are connected to the respective gate electrodes 24. The electrode pads 32 are arranged around the well 16.

The electrode pads 34 are connected to the well 16.

The semiconductor device fabrication method according to the present embodiment is characterized mainly in that a plurality of gate electrodes 24 are formed, intersecting the device region 18*f* formed in a ring, and the electrode pads 32, 34 are arranged around the device region 18*f*.

According to the present embodiment, the gate electrodes 24 are formed, intersecting the device region 18*f*, and the electrode pads 32, 34 are arranged around the device region 18*f*, whereby even a case that a number of the MOS diodes 26 are formed in a monitor part 14, the region required to form the monitor part 14 can be made smaller.

(A Modification)

Figure 25:
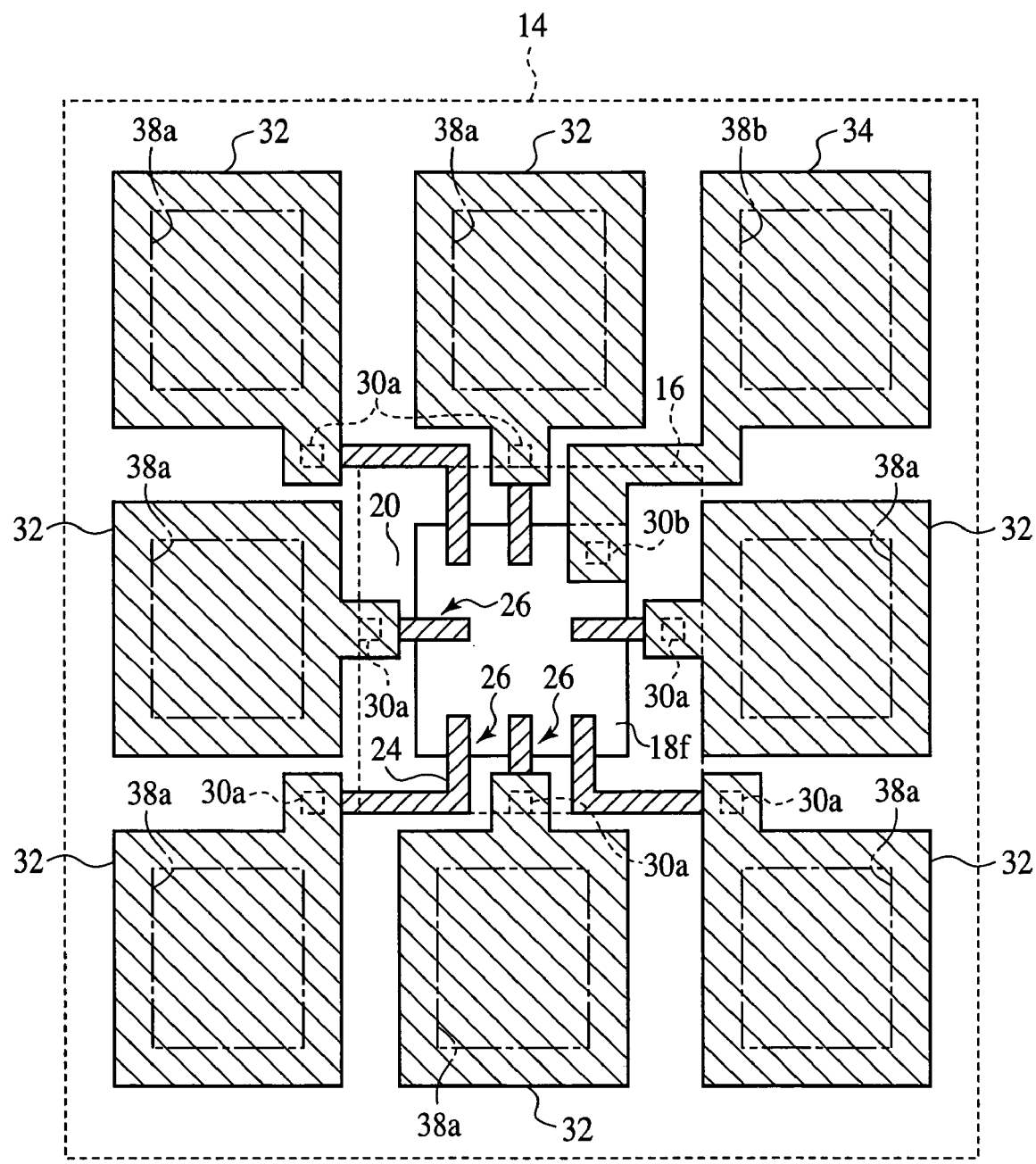
FIG. 25 is a plan view of the semiconductor substrate according to a modification of the seventh embodiment of the present invention.

Next, the semiconductor substrate according to a modification of the present embodiment and the semiconductor device fabrication method using the semiconductor substrate will be explained with reference to FIG. 25. FIG. 25 is a plan view of the semiconductor substrate according to the present modification.

The semiconductor substrate and the semiconductor device fabrication method according to the present modification is characterized mainly in that the device isolation region 20*a* is not formed.

As illustrated in FIG. 25, the device isolation region 20*a* is not formed inside the device region 18*f*. That is, in the present modification, the device region 18*f* is formed solid.

According to the present modification, the device isolation region 20*a* is not formed inside the device region 18*f*, whereby the size of the device region 18*f* can be made smaller. Thus, according to the present modification, the region required to form the monitor part 14 can be made smaller.

An Eighth Embodiment

Figure 26:
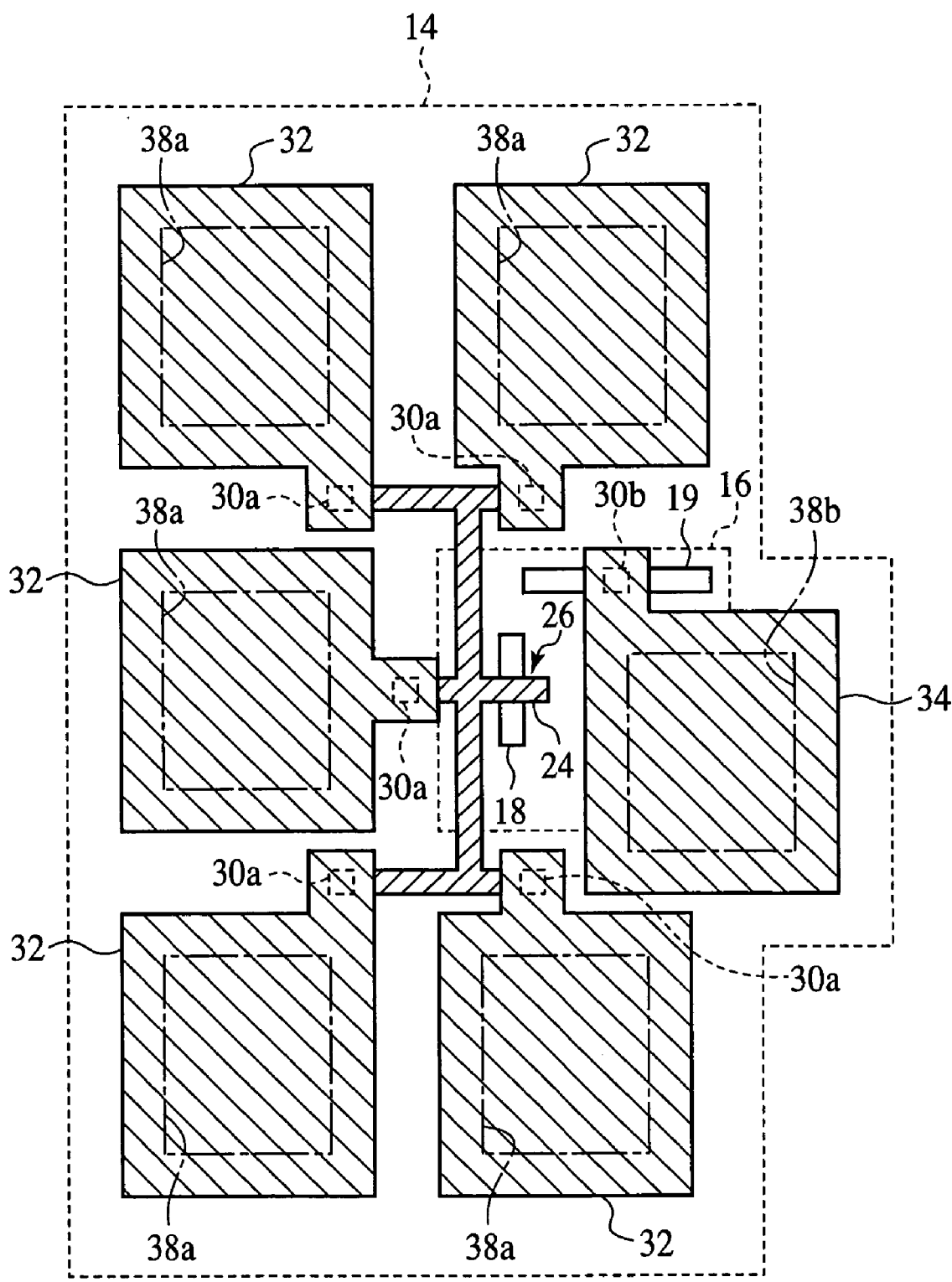
FIG. 26 is a plan view of the semiconductor substrate according to an eighth embodiment of the present invention.

The semiconductor substrate according to an eighth embodiment and the semiconductor device fabrication method using the semiconductor substrate will be explained with reference to FIG. 26. FIG. 26 is a plan view of the semiconductor substrate according to the present embodiment. The members of the present embodiment as those of the semiconductor substrate and the semiconductor device fabrication method according to the first to the seventh embodiments illustrated in FIGS. 1A to 25 are represented by the same reference numbers not to repeat or to simplify their explanation.

The semiconductor substrate and the semiconductor device fabrication method according to the present embodiment is characterized mainly in that a plurality of electrode pads 32 are electrically connected to a gate electrode 24.

As illustrated in FIG. 26, a plurality of electrode pads 32 are electrically connected to the gate electrode 24. Here, five electrode pads 32 are connected to one gate electrode 24. In the present embodiment, a plurality of electrode pads 32 are connected to the gate electrode 24 so that a ratio of a total area of the gate electrode 24 to a gate area of the MOS diode 26 is made large so as to make the gate insulation film 22 vulnerable to electric breakdown.

According to the present embodiment, a plurality of electrode pads 32 are electrically connected to the gate electrode 24, whereby the gate insulation film 22 can be made vulnerable to electric breakdown due to static electricity generated upon the release of the surface protection film 39. Thus, according to the present embodiment, it can be detected with high sensitivity whether or not static electricity has been generated upon the release of the surface protection film 39.

A Ninth Embodiment

Figure 27:
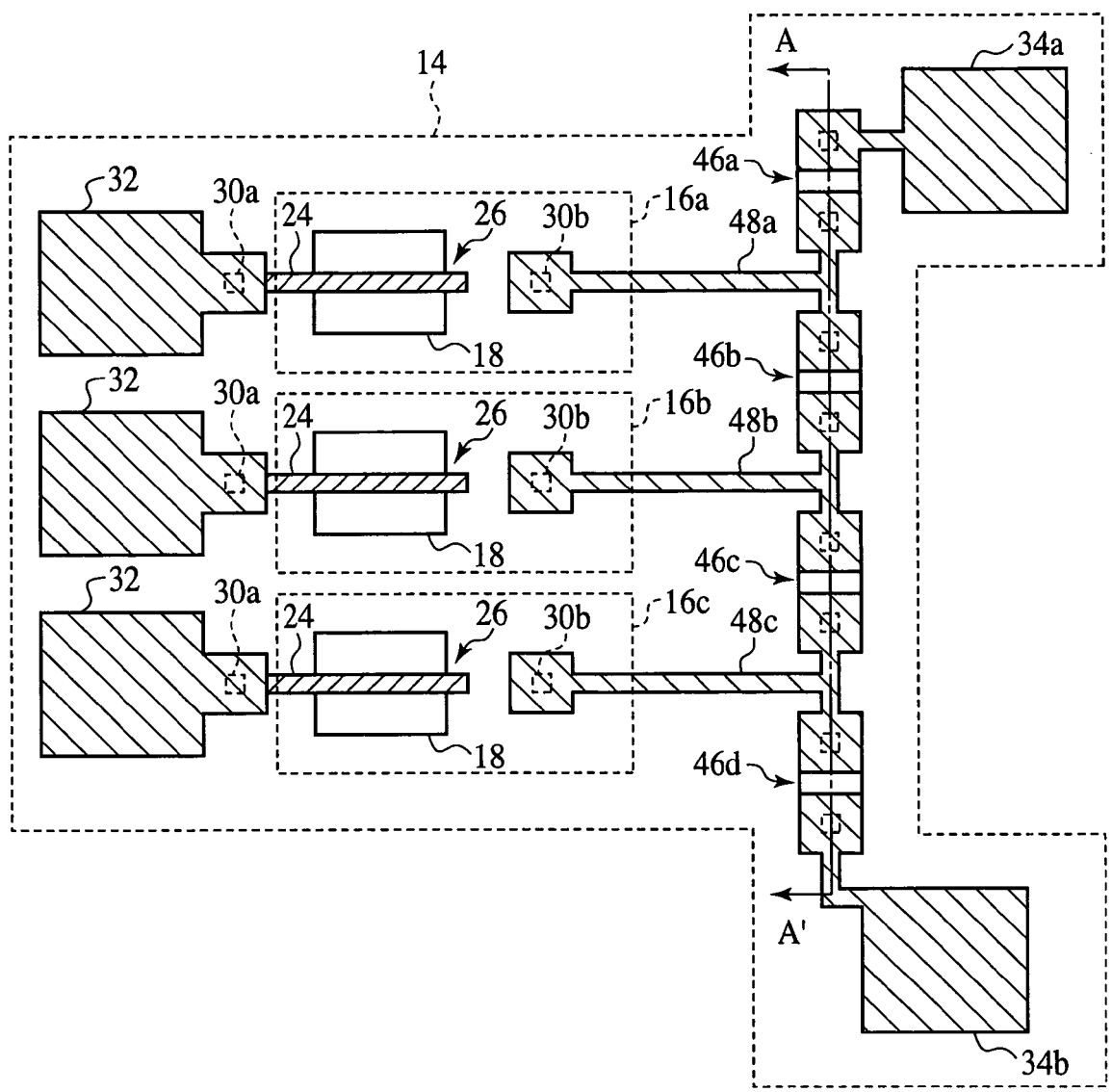
FIG. 27 is a plan view of the semiconductor substrate according to a ninth embodiment of the present invention.
Figure 28:
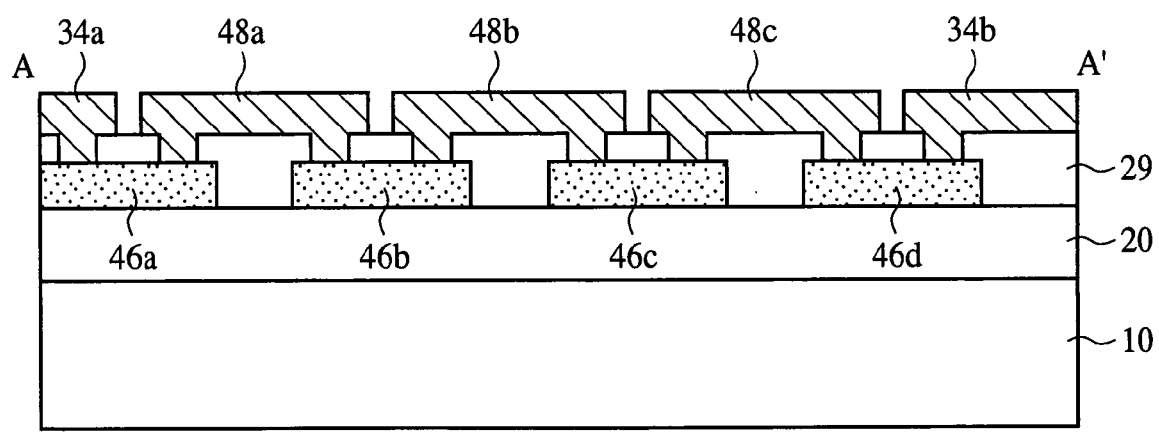
FIG. 28 is a sectional view of the semiconductor substrate according to a ninth embodiment of the present invention.

The semiconductor substrate according to a ninth embodiment of the present invention and the semiconductor device fabrication method using the semiconductor substrate will be explained with reference to FIGS. 27 and 28. FIG. 27 is a plan view of the semiconductor substrate. FIG. 28 is a sectional view of the semiconductor substrate. FIG. 28 is the sectional view along the line A-A' in FIG. 27. The same members of the present embodiment as those of the semiconductor substrate and the semiconductor device fabrication method according to the first to the eighth embodiments illustrated in FIGS. 1A to 26 are represented by the same reference numbers not to repeat or to simplify their explanation.

The semiconductor substrate and the semiconductor device fabrication method according to the present embodiment is characterized in that each monitor part 14 includes a circuit for detecting whether or not electric breakdown has taken place the MOS diode 26.

As illustrated in FIGS. 27 and 28, MOS diodes 26 are formed respectively in wells 16a-16c.

Resistors 46a-46d are serially connected between an electrode pad 34a and an electrode pad 34b.

One terminal of the resistor 46a is connected to the electrode pad 34a. The other terminal of the resistor 46a and one terminal of the resistor 46b are connected to the well 16a via an interconnection 48a. The other terminal of the resistor 46b and one terminal of the resistor 46c are connected to the well 16b via an interconnection 48b. The other terminal of the resistor 46c and one terminal of the resistor 46d are connected to the well 16c via an interconnection 48c. The other terminal of the resistor 46d is connected to the electrode pad 34b. The resistance values of the resistors 46a-46d are respectively 100 Ω.

When a measurement is made as to whether or not electric breakdown has taken place in the MOS diodes 26, a voltage is applied between the electrode pad 34a and the electrode pads 32, 34b. The potential of the electrode pads 32 and the potential of the electrode pad 34b are set equal to each other. The potential of the electrode pad 34a is, e.g., 5 V, and the potential of the electrode pads 32, 34b is, e.g., 0 V.

When electric breakdown has not taken place in any of the MOS diodes 26, a current of, e.g., 12.5 mA flows in the circuit between the electrode pad 34a and the electrode pad 34b.

When electric breakdown has taken place in one of the MOS diodes 26, a large current of, e.g., 12.5 mA flows between the electrode pad 34a and the electrode pad 34b. For example, when electric breakdown has taken place in the MOS diode 26 formed in the well 16a, a current of, e.g., 50 mA flows in the circuit between the electrode pad 34a and the electrode pads 32.

Thus, the value of currents flowing between the electrode pad 34a and the electrode pads 32, 34b are measured, whereby it is easily judged whether or not electric breakdown has taken place in the MOS diodes 26.

(Modification 1)

Figure 29:
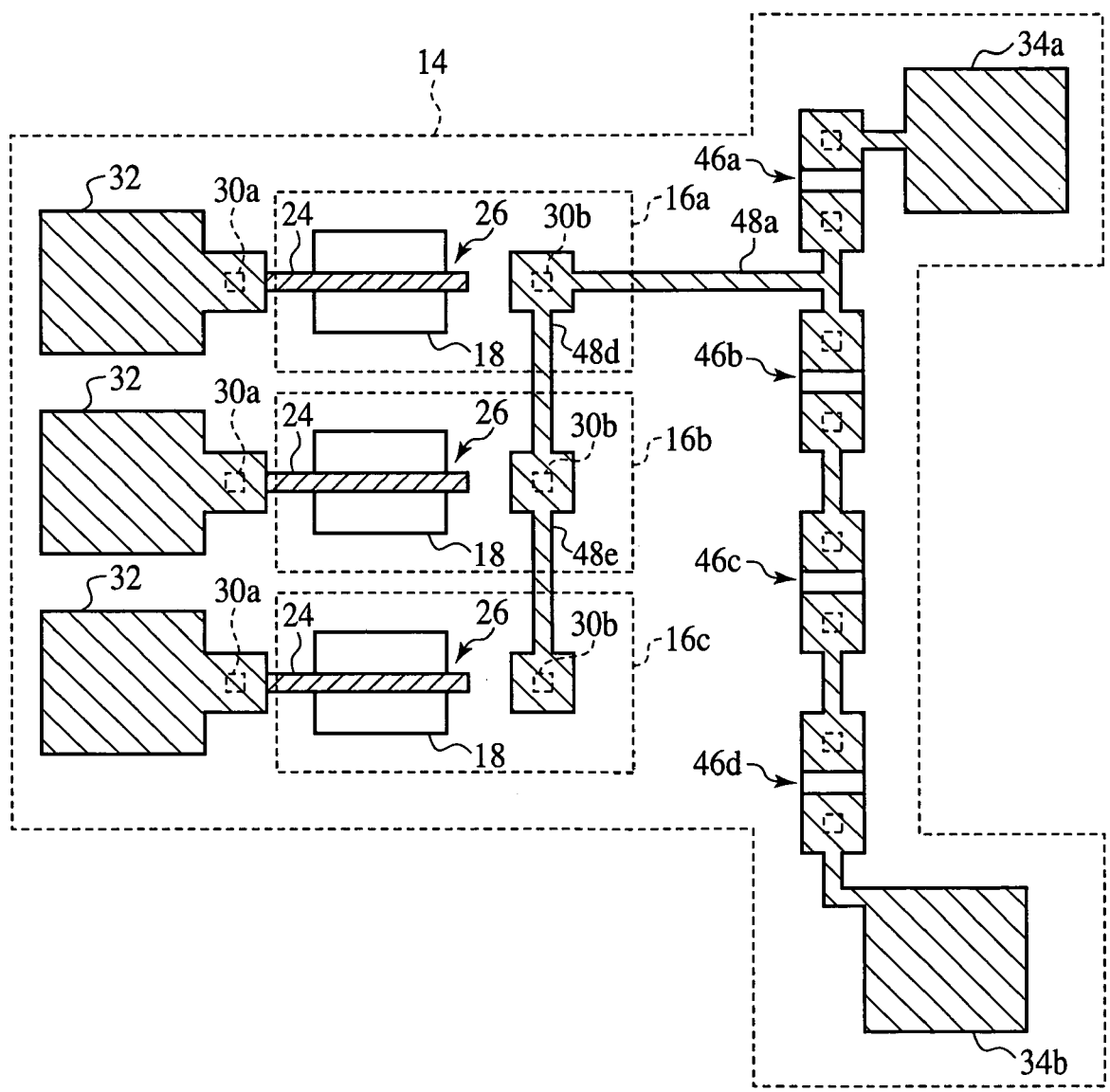
FIG. 29 is a plan view of the semiconductor substrate according to Modification 1 of the ninth embodiment of the present invention.

Next, the semiconductor substrate according to Modification 1 and the semiconductor device fabrication method using the semiconductor substrate will be explained with reference to FIG. 29. FIG. 29 is a plan view of the semiconductor substrate according to the present modification.

The semiconductor substrate and the semiconductor device fabrication method according to the present modification is characterized mainly in that a plurality of wells 16a-16c are interconnected with each other via interconnections 48d, 48e.

As illustrated in FIG. 29, the well 16a and the well 16b are electrically interconnected with each other via an interconnection 48d. The well 16b and the well 16c are electrically interconnected by an interconnection 48e. The well 16a is connected to the other terminal of the resistor 46a and one terminal of the resistor 46 via an interconnection 48a.

When a measurement is made as to whether or not electric breakdown has taken place in the MOS diodes 26, a voltage is applied between the electrode pad 34a and the electrode pads 32, 34b. The potential of the electrode pads 32 and the potential of the electrode pad 34b are set equal to each other. The potential of the electrode pad 34a is, e.g., 5 V, and the potential of the electrode pads 32, 34b is, e.g., 0 V.

When electric breakdown has not taken place I any of the MOS diodes 26, a current of, e.g., 12.5 mA flows in the circuit between the electrode pad 34a and the electrode pad 34b.

When electric breakdown has taken place in one of the MOS diodes 26, a current of, e.g., 50 mA flows in the circuit between the electrode pad 34a and the electrode pad 34b.

Thus, according to the present modification as well, the value of current flowing between the electrode pad 34a and the electrode pads 32, 34b is measured, whereby it can be easily judged whether or not electric breakdown has taken place in the MOS diodes 26.

(Modification 2)

Figure 30:
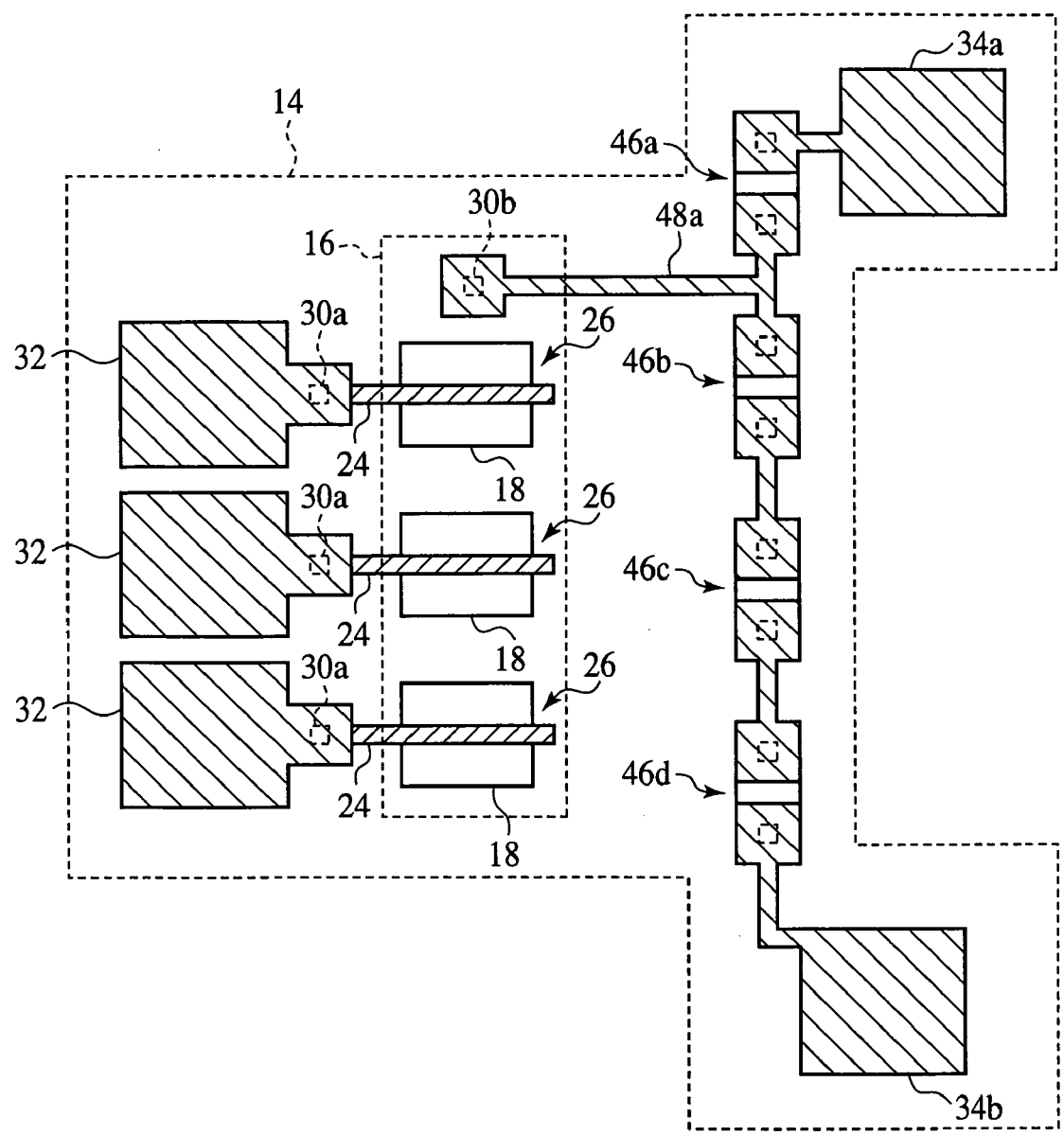
FIG. 30 is a plan view of the semiconductor substrate according to Modification 2 of the ninth embodiment of the present invention.

Then, the semiconductor substrate according to Modification 2 of the present embodiment and the semiconductor device fabrication method using the semiconductor substrate will be explained with reference to FIG. 30. FIG. 30 is a plan view of the semiconductor substrate according to the present modification.

The semiconductor substrate and the semiconductor device fabrication method according to the present modification is characterized mainly in that the MOS diodes 26 are formed in a common well 16.

As illustrated in FIG. 30, the MOS diodes 26 are formed in the common well 16.

The well 16 is connected to the electrode pad 34a via the interconnection 48a and the resistor 46a. The well 16 is connected to the electrode pad 34b via the interconnection 48a and the resistors 46b-46d.

When a measurement is made as to whether electric breakdown has taken pace in the MOS diodes 26, a voltage is applied between the electrode pad 34a and he electrode pads 32, 34b. The potential of the electrode pads 32 and the potential of the electrode pad 34b are set equal to each other. The potential of the electrode pad 34a is set at, e.g., 5 V, and the potential of the electrode pads 32, 34b is set at, e.g., 0 V.

When electric breakdown has not taken place in any of the MOS diodes 26, a current of, e.g., 12.5 mA is applied to the circuit between the electrode pad 34a and the electrode pad 34b.

When electric breakdown has taken place in one of the MOS diodes 26, a current of, e.g., 50 mA flows in the circuit between the electrode pad 34a and the electrode pad 34b.

Thus, according to the present modification as well, the value of current flowing between the electrode pad 34a and the electrode pads 32, 34b is measured, whereby it can be easily judged whether or not electric breakdown has taken place in the MOS diodes 26. According to the present modification, a plurality of MOS diodes 26 are formed in the common well 16, whereby the area required to form the monitor part 14 can be made smaller.

A Tenth Embodiment

Figure 31:
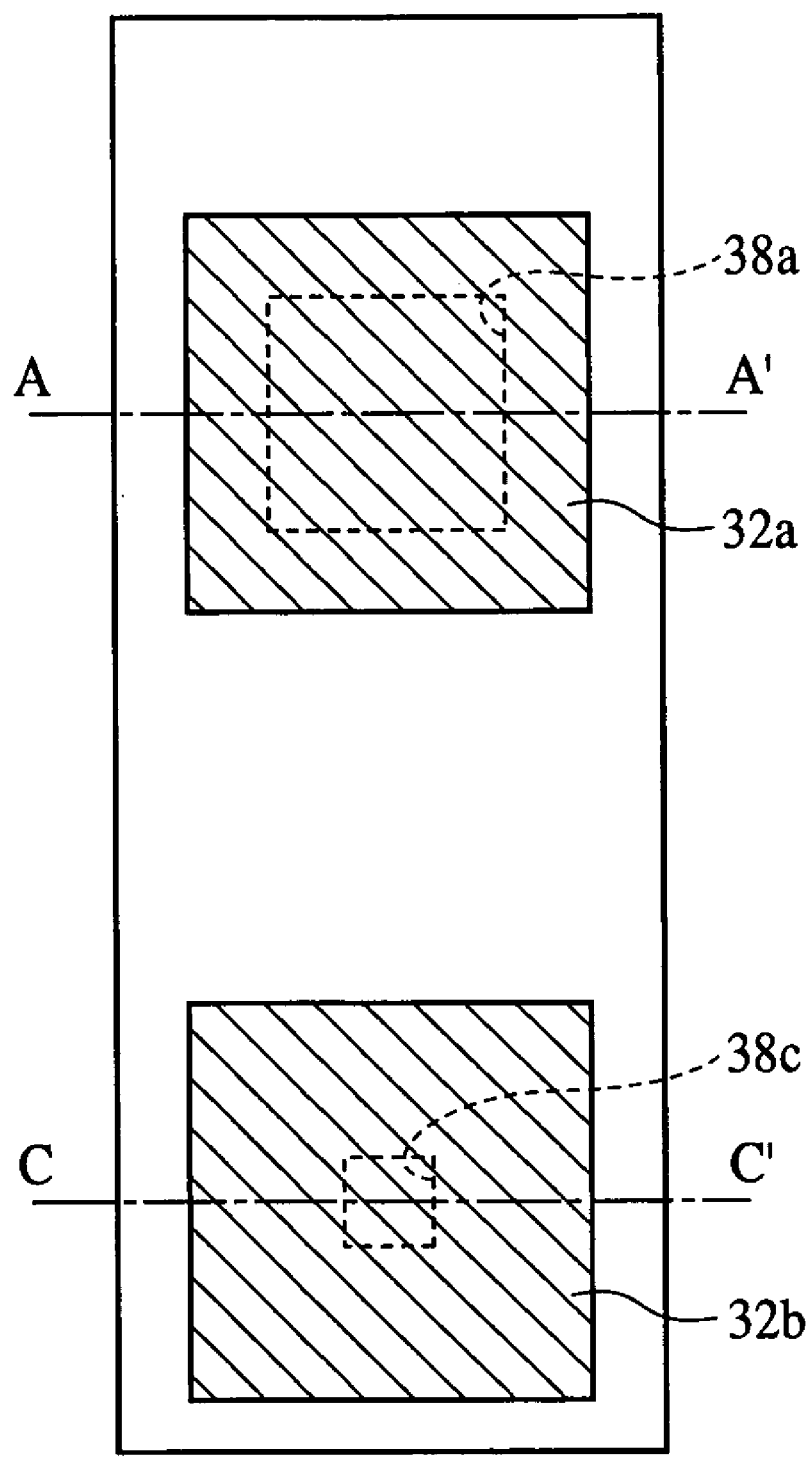
FIG. 31 is a plan view of the semiconductor substrate according to a tenth embodiment of the present invention.
Figure 32A:
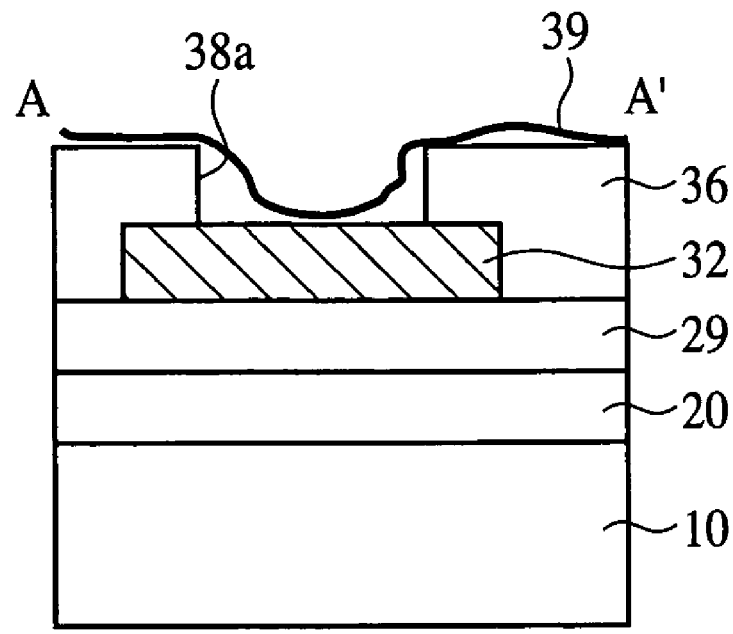
FIGS. 32A and 32B are a sectional views of the semiconductor substrate according to a tenth embodiment of the present invention.
Figure 32B:
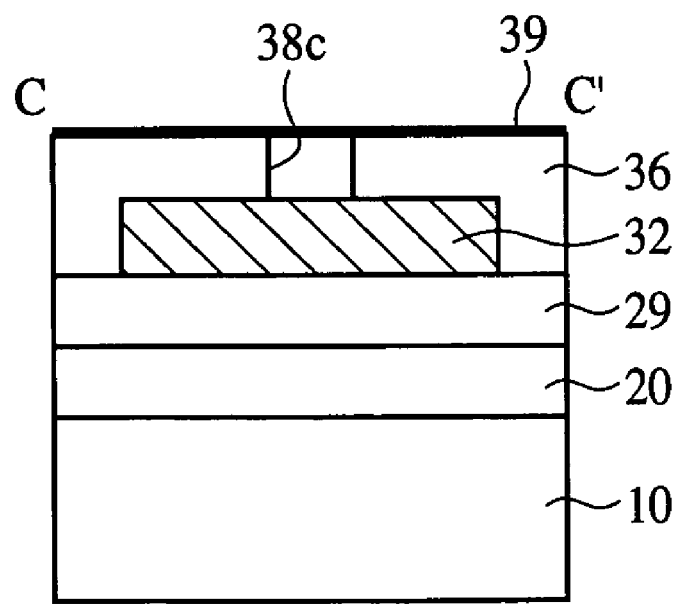

The semiconductor substrate according to a tenth embodiment and the semiconductor device fabrication method using the semiconductor substrate will be explained with reference to FIGS. 31 to 32B. FIG. 31 is a plan view of the semiconductor substrate according to the present embodiment. FIGS. 32A and 32B are sectional views of the semiconductor substrate according to the present embodiment. FIG. 32A is the sectional view along the line A-A' in FIG. 31, and FIG. 32B is the sectional view along the line C-C' in FIG. 31. The same members of the present embodiment as those of the semiconductor substrate and the semiconductor device fabrication method according to the first to the ninth embodiments illustrated in FIGS. 1A to 30 are represented by the same reference numbers not to repeat or to simplify their explanation.

The semiconductor substrate and the semiconductor device fabrication method according to the present embodiment is characterized mainly in that the openings 38a, 38c of electrode pads 32a, 32b are formed in sizes different from each other.

As illustrated in FIGS. 31 to 32B, the opening 38a is formed in a cover film 36 down to the electrode pad 32a. In the cover film 36, the opening 38c is formed down to the electrode pad 32b. The size of the opening 38a and the size of the opening 38c are different from each other. The electrode pads 32a, 32b are connected to any ones of the MOS diodes 26 described above in the first to the ninth embodiments.

As illustrated in FIG. 32A, when the opening 38a is large, the possibility that the surface protection film 39 will contact the electrode pad 32a is relatively high. For example, the size of the opening 38c is above 100 μm×100 μm, the possibility that the surface protection film 39 will contact the electrode pad 32a is very high. In the present embodiment, the size of the opening 38a is set at 100 μm×100 μm or more so that the surface protection film 39 contacts the electrode pad 32a.

On the other hand, as illustrated in FIG. 32B, when the opening 38c is small, the possibility that the surface protection film 39 will contact the electrode pad 32b is relatively low. For example, the size of the opening 38c is below 25 μm×25 μm, the possibility that the surface protection film 39 will contact the electrode pad 32b is very low. In the present embodiment, the size of the opening 38c is set at 25 μm×25 μm or less so as to keep the surface protection film 39 out of contact with the electrode pad 32.

It is considered that static electricity is charged in the electrode pads 32 upon the release of the surface protection film 39 because a part of the surface protection film 39 contacts the electrode pad 32a, as illustrated in FIG. 32A. In the case that, as illustrated in FIG. 32B, the surface protection film 39 is not in contact with the electrode pad 32b, it is considered that even when static electricity is generated upon the release of the surface protection film 39, the static electricity will not be easily charged in the electrode pad 32b.

When electric breakdown has taken place in the MOS diode 26 connected to the electrode pad 32a but has not taken place in the MOS diode 26 connected to the electrode pad 32b, it can be judged that the electric breakdown has taken place due to too large static electricity generated upon the release of the surface protection film 39.

An Eleventh Embodiment

Figure 33A:
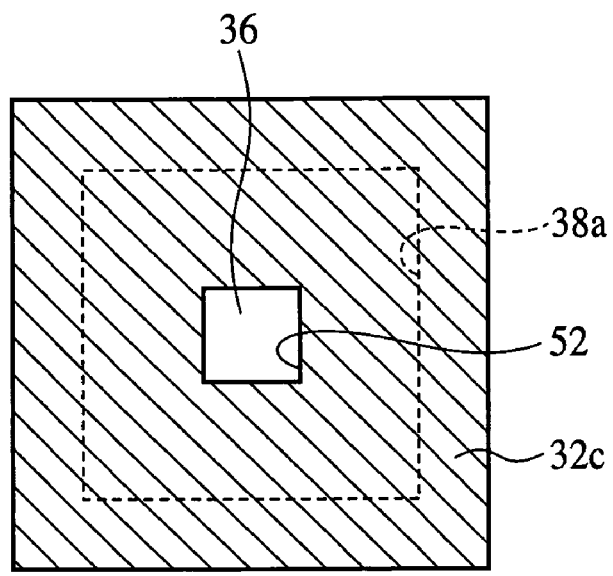
FIGS. 33A and 33B are a plan view and a sectional view of the semiconductor substrate according to an eleventh embodiment of the present invention.
Figure 33B:
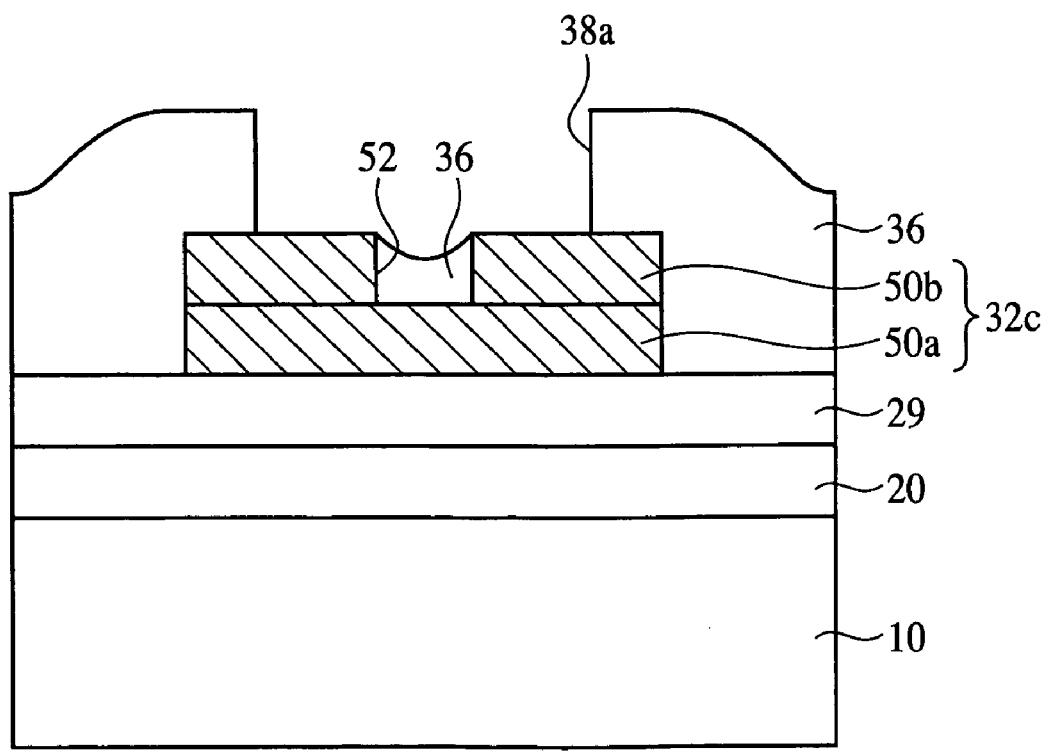

The semiconductor substrate according to an eleventh embodiment of the present invention and the semiconductor device fabrication method using the semiconductor substrate will be explained with reference to FIGS. 33A to 36B. FIGS. 33A and 33B are a plan view and a sectional view of the semiconductor substrate according to the present embodiment. The same members of the present embodiment as those of the semiconductor substrate and the semiconductor device fabrication method according to the first to the tenth embodiments illustrated in FIGS. 1A to 32B are represented by the same reference numbers not to repeat or to simplify their explanation.

The semiconductor substrate and the semiconductor device fabrication method according to the present embodiment is characterized mainly in that no conductor is present at the center of an electrode pad 32c.

As illustrated in FIGS. 33A and 33B, a conductor film 50b is formed on a conductor film 50a. The conductor film 50a is connected to the gate electrodes 24 of MOS diodes 26. An opening 52 is formed in the conductor film 50b at the center thereof. The conductor film 50a and the conductor film 50b constitute the electrode pad 32c. Because of the opening 52 in the center of the conductor film 50b, no conductor is present at the center of the electrode pad 32c. An insulator 36 is present in the opening 52.

In a monitor part 14, the MOS diode 26 connected to the electrode pad 32c and the MOS diode 26 connected to the electrode pad 32 (see FIGS. 3A and 3B) are formed.

It is considered that static electricity is charged in the electrode pad 32 upon the release of the surface protection film 39, because a part of the surface protection film 39 is in contact with the electrode pad 32. It is considered that the part where the surface protection film 39 tends to contact with the electrode pad 32 is the central part of the electrode pad 32. In the present embodiment, the conductor is absent at the center of the electrode pad 32c, whereby the electric contact of the surface protection film 39 with the electrode pad 32c can be prevented. Thus, according to the present embodiment, the charge of static electricity in the electrode pad 32c upon the release of the surface protection film 39 can be prevented.

When electric breakdown has taken place in the MOS diode 26 connected to the electrode pad 32c having the conductor at the center but has not take place in the MOS diode 26 connected to the electrode pad 32c having no conductor at the center, it can be judged that the electric breakdown has taken place due to too large static electricity generated upon the release of the surface protection film 39.

Next, the method for forming the electrode pad 32c of the present embodiment will be explained with reference to FIGS. 34A to 36B. FIGS. 34A to 36B are sectional views of the semiconductor device in the steps of the semiconductor device fabrication method according to the present embodiment, which illustrate the method.

Figure 34A:
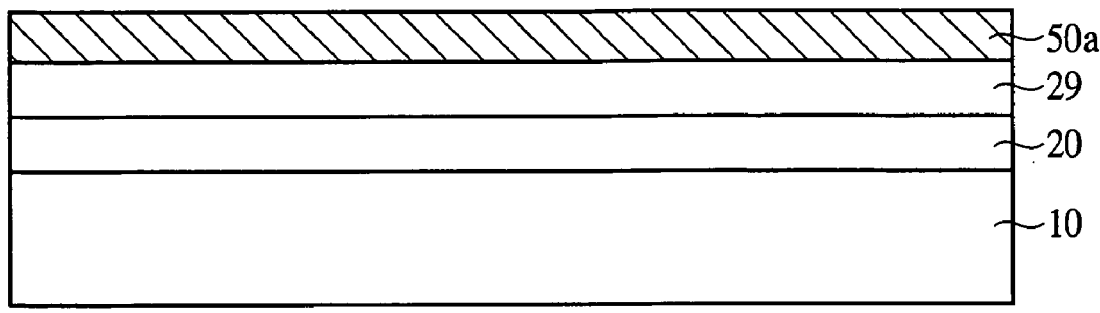
FIGS. 34A to 34C are sectional views of the semiconductor substrate according to the eleventh embodiment of the present invention in the steps of the semiconductor device fabrication method using the semiconductor substrate, which illustrate the method (Part 1).

As illustrated I FIG. 34A, a conductor film 50a of, e.g., a 500 nm-thickness is formed on an inter-layer insulation film 29. The conductor film 50a is formed of an alloy of Al, Cu and Ti.

Figure 34B:
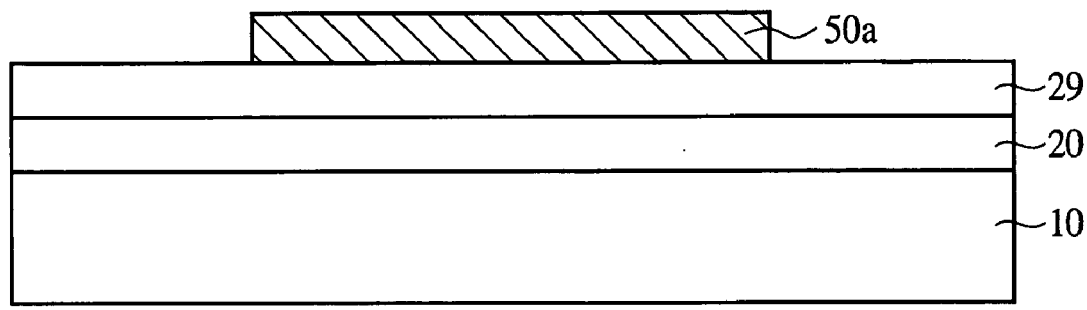
Figure 34C:
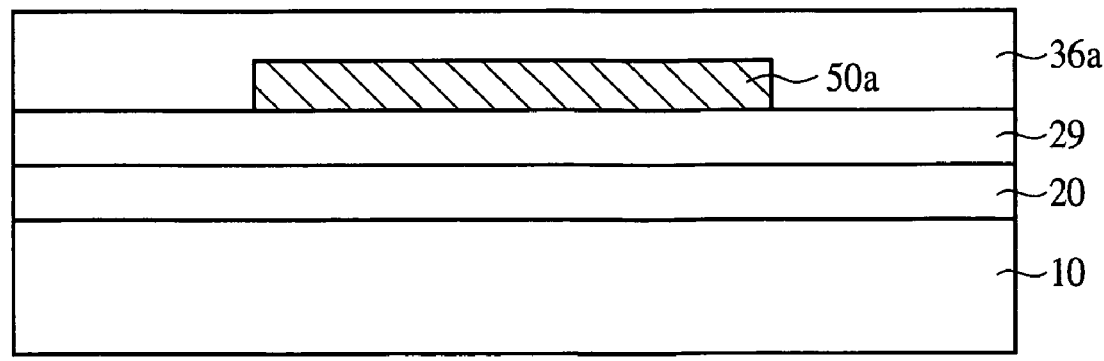

Then, as illustrated in FIG. 34B, the conductor film 50 is patterned by photolithography.

Then, a 300 nm-thickness silicon oxide film is formed on the entire surface by, e.g., CVD. Then, a 300 nm-thickness SOG film is formed on the entire surface by, e.g., spin coating. Next, the SOG film is etched back as required. Then, a 300 nm-thickness silicon oxide film is formed on the entire surface by, e.g., CVD. Thus, the insulation film 36a of the silicon oxide film and the SOG film is formed (see FIG. 34C).

Figure 35A:
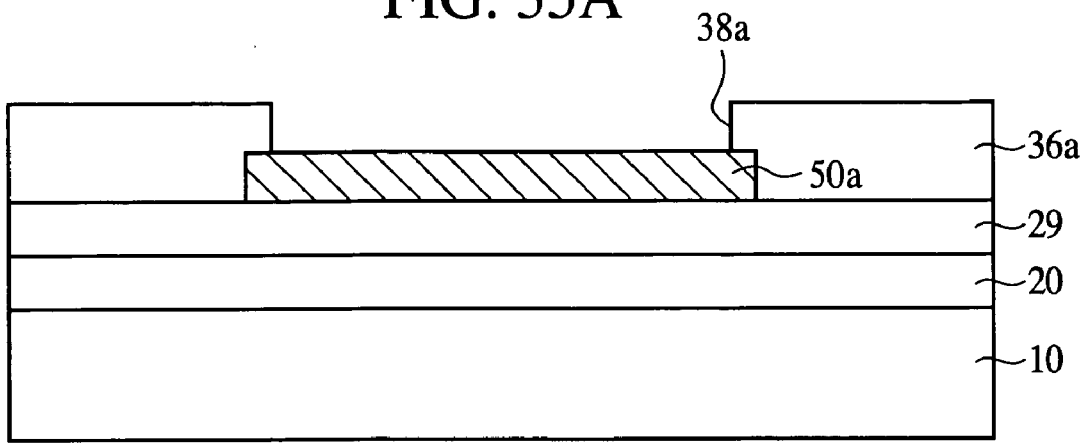
FIGS. 35A to 35C are sectional views of the semiconductor substrate according to the eleventh embodiment of the present invention in the steps of the semiconductor device fabrication method using the semiconductor substrate, which illustrate the method (Part 2).

Then, as illustrated in FIG. 35A, the opening 38a is formed down to the electrode pad 50c by photolithography. The plane shape of the opening 38a is, e.g., 100 μm×100 μm.

Figure 35B:
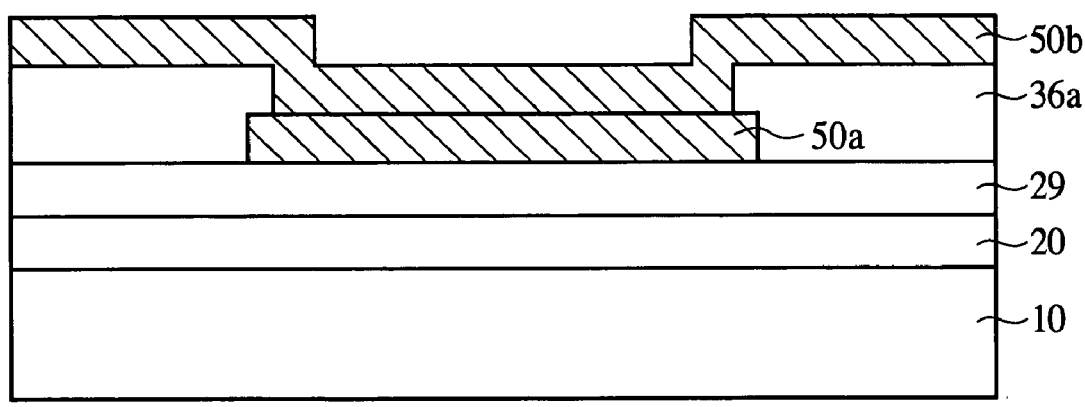

Then, as illustrated in FIG. 35B, a 1000 nm-thickness conductor film 50b is formed on the entire surface by, e.g., sputtering. The conductor film 50b is formed of, e.g., an alloy of Al, Cu and Ti.

Figure 35C:
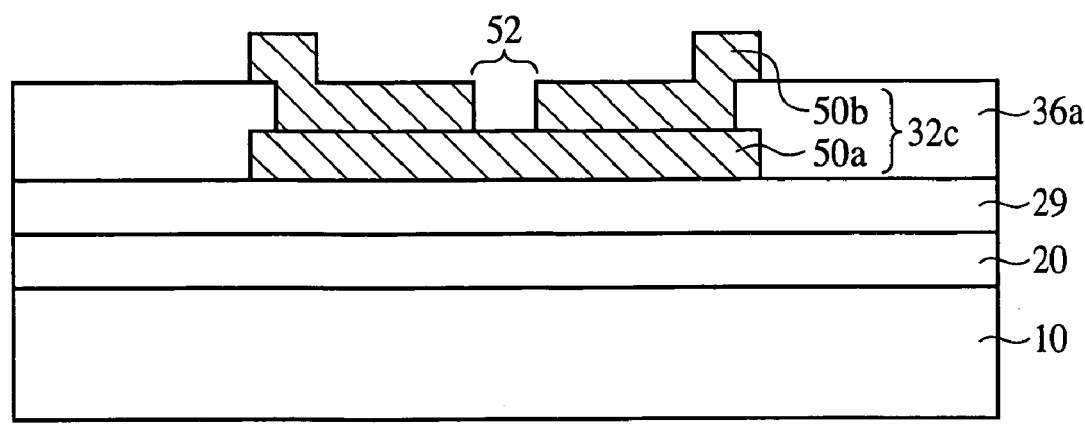
Figure 36A:
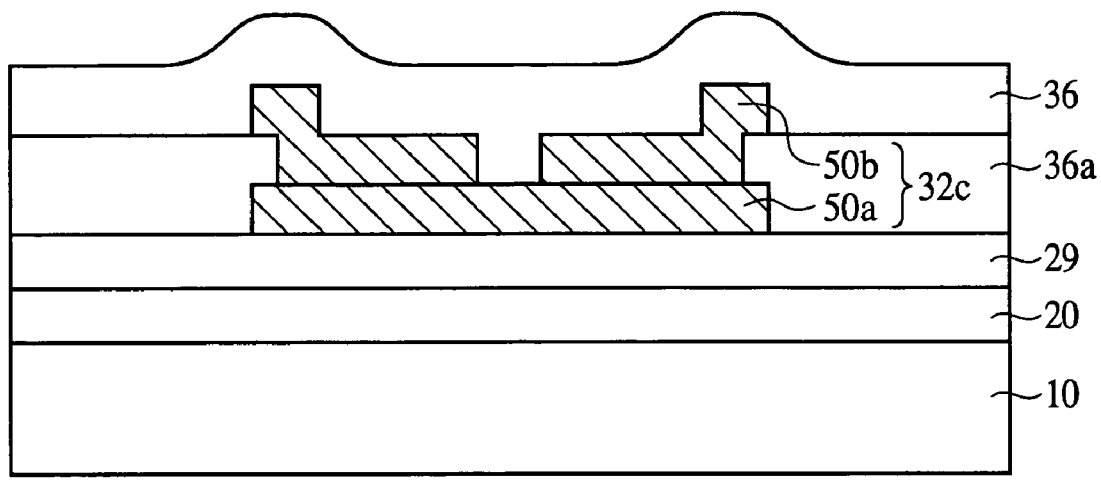
FIGS. 36A and 36B are sectional views of the semiconductor substrate according to the eleventh embodiment of the present invention in the steps of the semiconductor device fabrication method using the semiconductor substrate, which illustrate the method (Part 3).
Figure 36B:
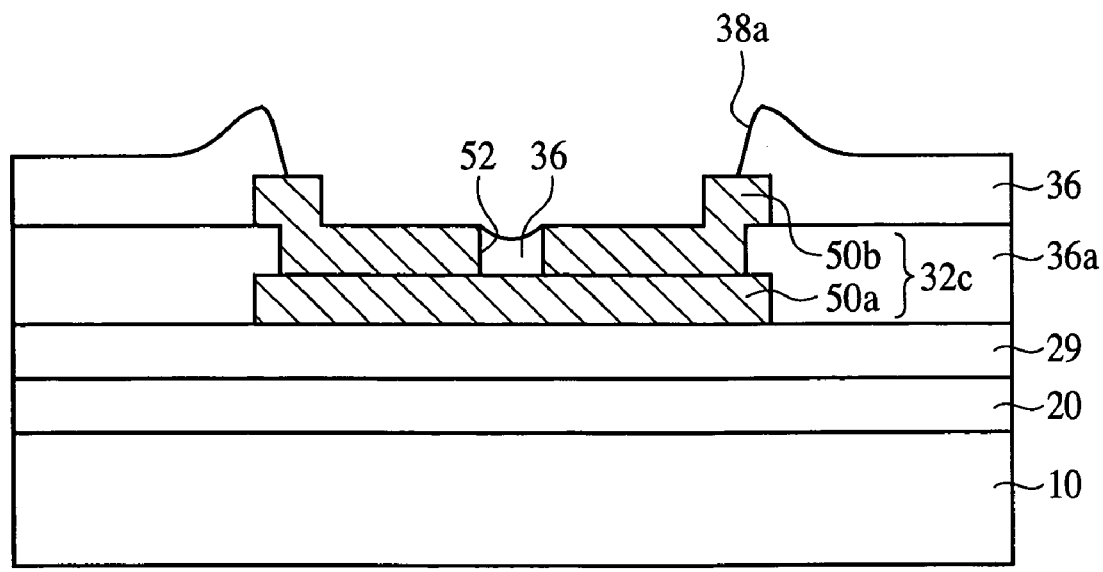

Next, as illustrated in FIG. 35C, the conductor film 50b is patterned by photolithography. At this time, the opening 52 is formed in the conductor film 50b at the center. The plane shape of the opening 52 is, e.g., 1.8 μm×1.8 μm. The conductor film 50a and the conductor film 50b constitute the electrode pad 32c.

Then, a 200 nm-thickness silicon oxide film is formed on the entire surface by, e.g., CVD. Then, a 500 nm-thickness silicon nitride film is formed on the entire surface by, e.g., CVD. Thus, the cover film (insulation film) 36 is formed of the silicon oxide film and the silicon nitride film (see FIG. 36A).

Next, the opening 38a is formed in the cover film 36 down to the electrode pad 32c by photolithography. The insulator 36 is thus buried in the opening 52 formed at the center of the electrode pad 32c.

Thus, the electrode pad 32c is formed.

A Twelfth Embodiment

Figure 37A:
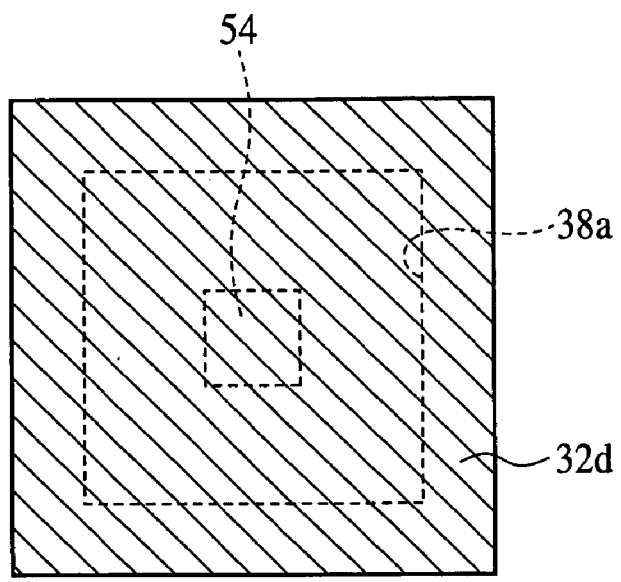
FIGS. 37A and 37B are a plan view and a sectional view of the semiconductor substrate according to a twelfth embodiment of the present invention.
Figure 37B:
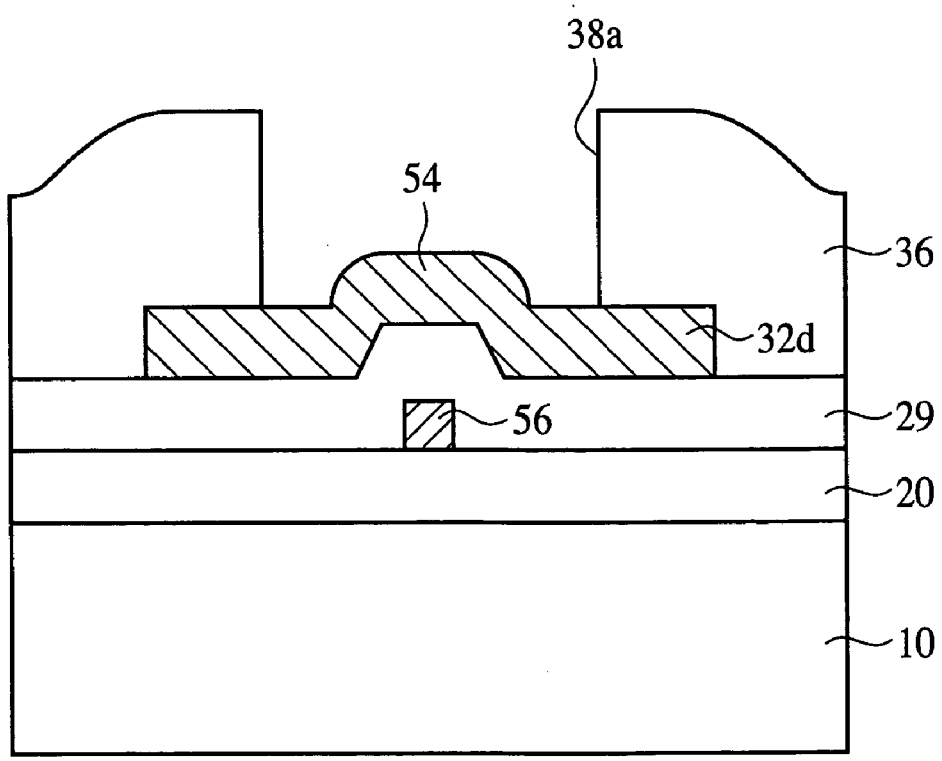

The semiconductor substrate according to a twelfth embodiment of the present invention and the semiconductor device fabrication method using the semiconductor substrate will be explained with reference to FIGS. 37A to 39C. FIGS. 37A and 37B are a plan view and a sectional view of the semiconductor substrate according to the present embodiment. The same members of the present embodiment as those of the semiconductor substrate and the semiconductor device fabrication method according to the first to the eleventh embodiments illustrated in FIGS. 1A to 36B are represented by the same reference numbers not to repeat or to simplify their explanation.

The semiconductor substrate and the semiconductor device fabrication method according to the present embodiment is characterized mainly in that a convexity 54 is formed at the center of an electrode pad 32d.

As illustrated in FIGS. 37A and 37B, a pattern 56 for forming the convexity is formed on a device isolation region 20.

An insulation film 29 is formed on the device isolation region 20 with the pattern 56 for forming the convexity. A convexity is formed on the surface of the insulation film 29 above the pattern 56 for forming the convexity 56.

The electrode pad 32d is formed on the insulation film 29. The center of the electrode pad 32d is positioned above the pattern 56 for forming the convexity. At the center of the electrode pad 32d, which is positioned above the pattern 56 for forming the convexity, the convexity 54 is formed at the center of the electrode pad 32d.

In a monitor part 14, a MOS diode 26 connected to the electrode pad 32d and a MOS diode 26 connected to the electrode pad 32 (see FIGS. 3A and 3B) are formed.

It is considered that static electricity is charged in the electrode pad 32 upon the release of the surface protection film 39 because a part of the surface protection film 39 is in contact with the electrode pad 32. In the present embodiment, because of the convexity 54 at the center of the electrode pad 32c, the surface protection film 39 tends to contact the electrode pad 32d. Thus, according to the present embodiment, static electricity tends to be charged in the electrode pad 32d upon the release of the surface protection film 39.

When electric breakdown has taken place in the MOS diode 26 connected to the electrode pad 32d with the convexity 54 at the center and has not taken place in the MOS diode 26 connected to the electrode pad 32 without the convexity 54 at the center, it can be judged that the electric breakdown has taken pace due to too large static electricity generated upon the release of the surface protection film 39.

Then, the method for forming the electrode pad 32d will be explained with reference to FIGS. 38A to 39C. FIGS. 38A to 39C are sectional views of semiconductor device in the steps of the semiconductor device fabrication method according to the present embodiment, which illustrate the method.

Figure 38A:
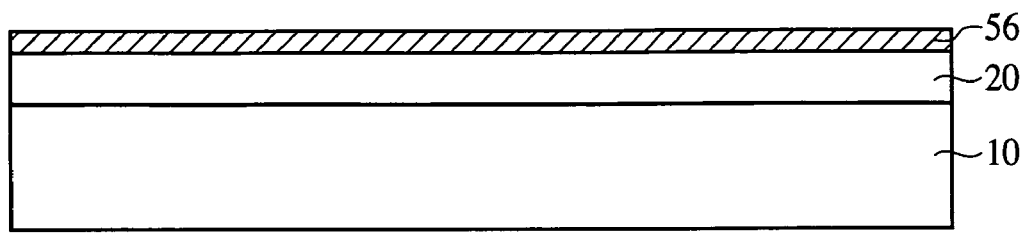
FIGS. 38A to 38D are sectional views of the semiconductor substrate according to the twelfth embodiment of the present invention in the steps of the semiconductor device fabrication method using the semiconductor substrate (Part 1).

As illustrated in FIG. 38A, a 300 nm-thickness polysilicon film 56 is formed on the entire surface.

Figure 38B:
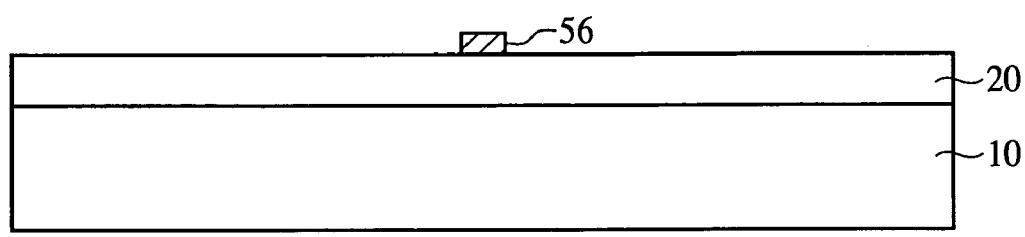
Figure 38C:
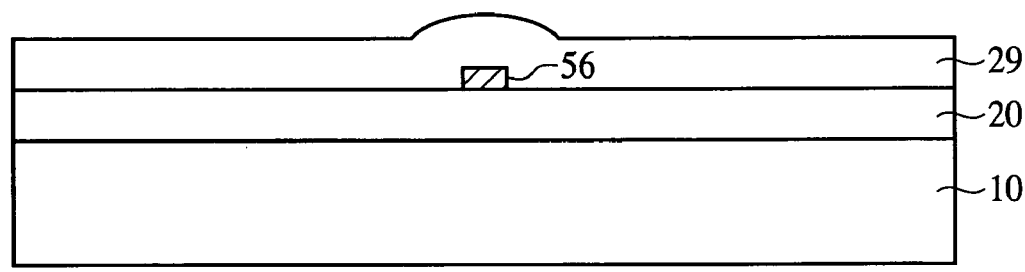

Then, as illustrated in FIG. 38B, the polysilicon film 56 is patterned by photolithography. Thus, the pattern 56 for forming the convexity is formed of the polysilicon The plane shape of the pattern 56 for forming the convexity is, e.g., 5 μm×5 μm.

Next, a 300 nm-thickness silicon oxide film is formed by, e.g., CVD. Then, a 300 nm-thickness SOG film is formed by, e.g., spin coating. Then, the SOG film is etched back as required. Next, a 300 nm-thickness silicon oxide film is formed by, e.g., CVD. Thus, the inter-layer insulation film 29 is formed of the silicon oxide film, the SOG film and the silicon oxide film (see FIG. 38C).

Figure 38D:
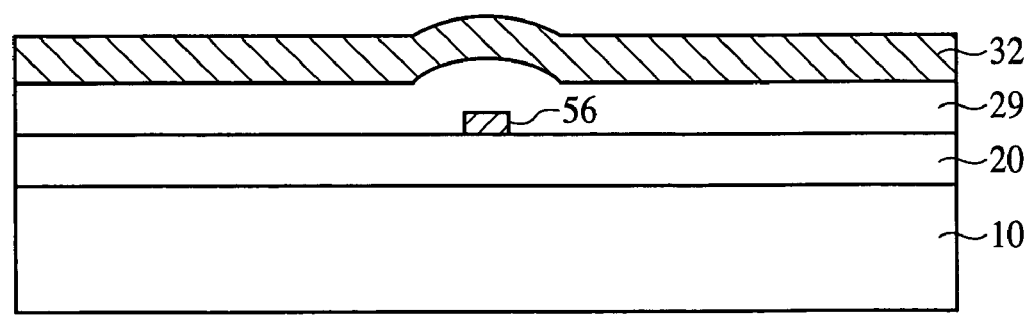

Then, as illustrated in FIG. 38D, 1000 nm-thickness conductor film 32 is formed on the entire surface by, e.g., sputtering. The conductor film 32 is formed of, e.g., an alloy of Al, Cu and Ti.

Figure 39A:
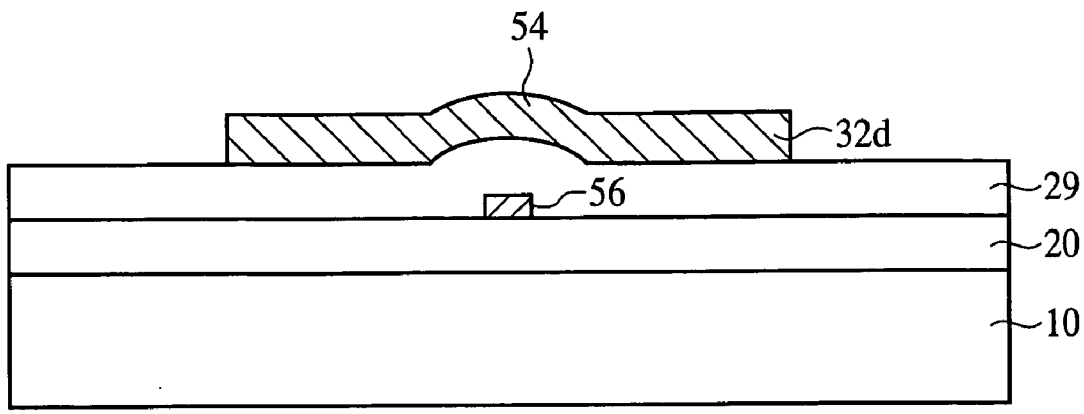
FIGS. 39A to 39C are sectional views of the semiconductor substrate according to the twelfth embodiment of the present invention in the steps of the semiconductor device fabrication method using the semiconductor substrate (Part 2).
Figure 39B:
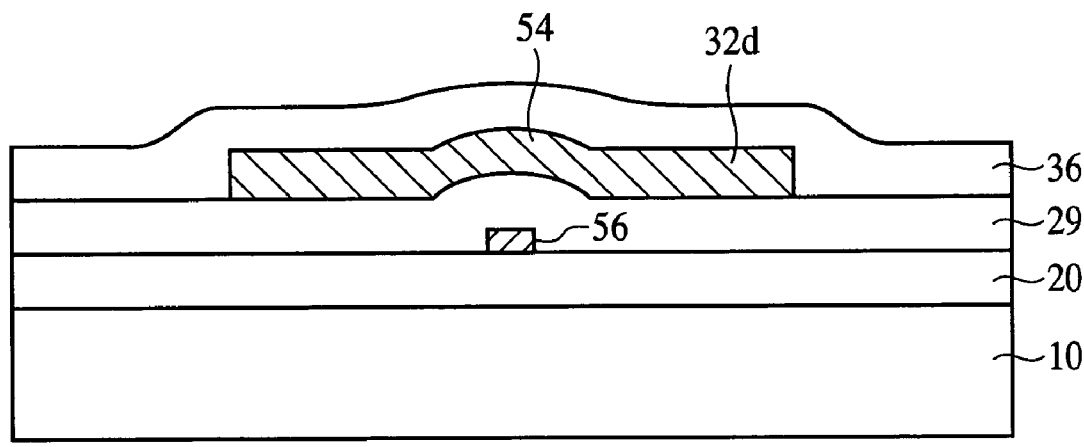

As illustrated in FIG. 39A, the conductor film 32 is patterned by photolithography. Thus, the electrode pad 32c of the conductor film 32 is formed. Since the center part of the electrode pad 32c positioned above the pattern 56 for forming the convexity, the convexity 54 is formed on the center part of the electrode pad 32c.

Figure 39C:
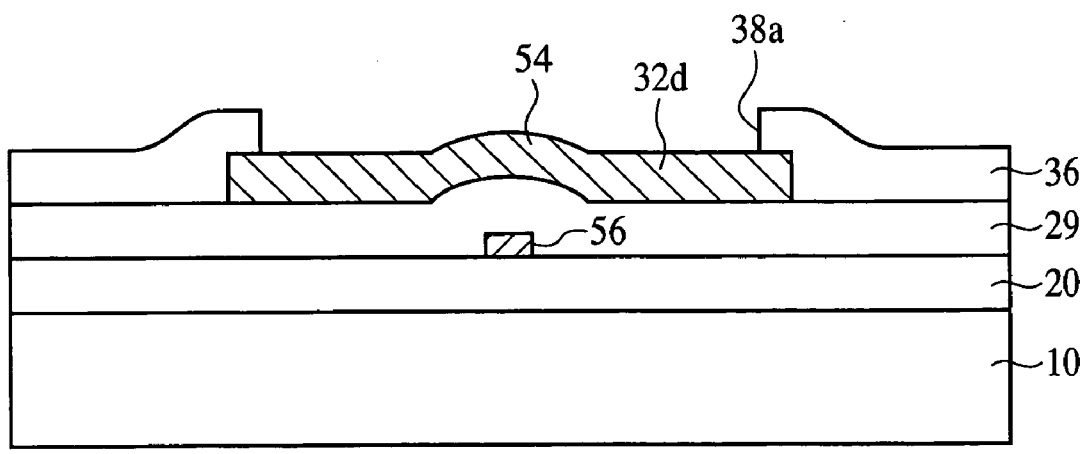

Next, as illustrated in FIG. 39C, a 200 nm-thickness silicon oxide film is formed on the entire surface by, e.g., CVD. Then, a 500 nm-thickness silicon nitride film is formed on the entire surface by, e.g., CVD. Thus, the cover film (insulation film) 36 of the silicon oxide film and the silicon nitride film is formed.

Then, the opening 38a is formed in the cover film 36 down to the electrode pad 32d by photolithography.

Thus, the electrode pad 32d is formed.

Modified Embodiments

The present invention is not limited to the above-described embodiments and can cover other various modifications.

For example, the N type wells 16 are formed in a P type semiconductor wafer 10, but P type wells may be formed in an N type semiconductor wafer.

In the above-described embodiments, MOS diodes are formed. However, the devices for making measurements as to whether electric breakdown has taken place are not limited to MOS diodes, and devices including electrodes 24 formed over the semiconductor wafer 10 with the insulation film 22 formed therebetween may be suitably used.

What is claimed is:

1. A semiconductor substrate comprising:
a first monitor part formed in a first region near a center of a semiconductor wafer, which includes a first element having a first electrode formed over the semiconductor wafer with a first insulation film formed therebetween, and a first electrode pad electrically connected to the first electrode; and
a second monitor part formed in a second region different from the first region, which includes a second element having a second electrode formed over the semiconductor wafer with a second insulation film formed therebetween, and a second electrode pad electrically connected to the second electrode.

2. A semiconductor substrate according to claim 1, wherein
the first element is formed in a first well formed in the semiconductor wafer, and
the second element is formed in the second well formed in the semiconductor wafer.

3. A semiconductor substrate according to claim 2, wherein
the first monitor part further includes a third electrode pad electrically connected to the first well, and
the second monitor part further includes a fourth electrode pad electrically connected to the second well.

4. A semiconductor substrate according to claim 1, wherein
the first monitor part includes a plurality of the first elements, and
the second monitor part includes a plurality of the second elements.

5. A semiconductor substrate according to claim 4, wherein
the plural first elements have different area of the part where the first electrode and the semiconductor wafer are opposed to each other across the first insulation film, and
the plural second elements have different areas of the part where the second electrode and the semiconductor wafer are opposed to each other across the second insulation film.

6. A semiconductor substrate according to claim 4, wherein
the plural first elements have different widths of the first electrode at the part where the first electrode and the semiconductor wafer are opposed to each other across the first insulation film, and
the plural second elements have different widths of the second electrode at the part where the second electrode and the semiconductor wafer are opposed to each other across the second insulation film.

7. A semiconductor substrate according to claim 4, wherein
the plural first elements have different lengths of the first electrode at the part where the first electrode and the semiconductor wafer are opposed to each other across the first insulation film, and
the plural second elements have different lengths of the second electrode at the part where the second electrode and the semiconductor wafer are opposed to each other across the second insulation film.

8. A semiconductor substrate according to claim 2, wherein
the first monitor part comprises a plurality of the first elements,
the second monitor part comprises a plurality of the second elements,
the plural first monitor parts are formed commonly in the first well, and
the plural second monitor parts are formed commonly in the second well.

9. A semiconductor device according to claim 4, wherein
the first insulation film is formed in a first device region defined by device isolation regions formed on the semiconductor water,
the second insulation film is formed in a second device region defined by the device isolation regions formed at the surface of the semiconductor wafer,
the plural first electrodes are formed, intersecting the first device region, and
the plural second electrodes are formed, intersecting the second device region.

10. A semiconductor substrate according to claim 1, wherein
the first element includes the first electrode and a plurality of the first electrode pads electrically connected to the first electrode, and
the second element includes the second electrode and a plurality of the second electrode pads electrically connected to the second electrode.

11. A semiconductor substrate according to claim 4, further comprising an insulation film formed on the semiconductor wafer, covering the first monitor part and the second monitor part, and
wherein in the insulation film, a plurality of first openings of sizes different from each other are formed down to the respective plural first electrode pads, and a plurality of second openings of sizes different from each other are formed down to the respective plural second electrode pads.

12. A semiconductor substrate according to claim 1, wherein
a conductor is absent at a center of the first electrode pad and a center of the second electrode pad.

13. A semiconductor substrate according to claim 1, wherein
convexities are formed respectively at a center of the first electrode pad and a center of the second electrode pad.

* * * * *